(12) United States Patent
Fujiyama et al.

(10) Patent No.: US 7,586,299 B2
(45) Date of Patent: Sep. 8, 2009

(54) POWER-SUPPLY SEMICONDUCTOR INTEGRATED CIRCUIT, POWER-SUPPLY SEMICONDUCTOR INTEGRATED CIRCUIT SYSTEM, DEVELOPMENT ASSISTING SYSTEM FOR POWER-SUPPLY CIRCUIT, AND PROGRAM AND STORAGE MEDIUM THEREFOR

(75) Inventors: Toshiya Fujiyama, Yamatokoriyama (JP); Hiroki Doi, Yamatokoriyama (JP); Shigeyoshi Kitamura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 267 days.

(21) Appl. No.: 11/502,763

(22) Filed: Aug. 11, 2006

(65) Prior Publication Data
US 2007/0035280 A1    Feb. 15, 2007

(30) Foreign Application Priority Data
Aug. 11, 2005    (JP) ............................... 2005-233693

(51) Int. Cl.
*G06F 17/50* (2006.01)
(52) U.S. Cl. ............................. 323/350; 323/351; 716/4
(58) Field of Classification Search ................. 323/350, 323/351, 225, 268, 269, 271, 272; 716/4; 363/65; 324/771
See application file for complete search history.

(56) References Cited

U.S. PATENT DOCUMENTS 5,946,210 A    8/1999  Montminy et al.

| 2003/0235058 | A1  | 12/2003 | Toyoshima et al. |
| 2005/0012396 | A1* | 1/2005 | Chidambaram et al. ....... 307/77 |
| 2007/0176580 | A1  | 8/2007 | Toyoshima et al. |

FOREIGN PATENT DOCUMENTS

| JP | 04-074456 | | 3/1992 |
| JP | 5-191261 | A | 7/1993 |
| JP | 7-334255 | A | 12/1995 |
| JP | 2001-275340 | A | 10/2001 |
| JP | 2002-46430 | A | 2/2002 |
| JP | 2003-319645 | A | 11/2003 |
| JP | 2004-021871 | A | 1/2004 |
| JP | 2006-034059 | A | 2/2006 |
| JP | 2007-502014 | | 2/2007 |
| WO | WO-2005/034175 | A2 | 4/2005 |

* cited by examiner

*Primary Examiner*—Akm E Ullah
*Assistant Examiner*—Harry Behm
(74) *Attorney, Agent, or Firm*—Edwards Angell Palmer & Dodge LLP; David G. Conlin; David A. Tucker

(57) ABSTRACT

There is provided a power-supply platform IC for realizing a parameter-deciding power-supply circuit, which, in order to decide a parameter of a power-supply circuit that supplies power to an electronic circuit IC (load), is connected to the electronic circuit IC (load) in place of the power-supply circuit. The power-supply platform IC includes: one or more transistor arrays that include a plurality of transistors operable as switching transistors; and a selecting circuit for selecting a transistor to be operated as a switching transistor from among the plurality of transistors, so as to control a size of the transistor that operates as a switching transistor, wherein the selecting circuit varies the size of the transistor as a parameter of the power-supply circuit, according to an external command.

22 Claims, 19 Drawing Sheets

POWER-SUPPLY SEMICONDUCTOR INTEGRATED CIRCUIT, POWER-SUPPLY SEMICONDUCTOR INTEGRATED CIRCUIT SYSTEM, DEVELOPMENT ASSISTING SYSTEM FOR POWER-SUPPLY CIRCUIT, AND PROGRAM AND STORAGE MEDIUM THEREFOR

This Nonprovisional application claims priority under U.S.C. § 119(a) on Patent Application No. 233693/2005 filed in Japan on Aug. 11, 2005, the entire contents of which are hereby incorporated by reference.

FIELD OF THE INVENTION

The present invention relates to a power-supply semiconductor integrated circuit that constitutes a parameter-deciding power-supply circuit, connected to a load device in place of a power-supply circuit that supplies power to the load device, for deciding a parameter of the power-supply circuit. The present invention also relates to a power-supply semiconductor integrated circuit system using the power-supply semiconductor integrated circuit, a power-supply circuit development assisting system, a program and storage medium for the power-supply circuit development assisting system.

BACKGROUND OF THE INVENTION

A power-supply device that supplies power to a load device is necessary for products that include such devices.

In many cases, the load device (e.g., LCD, CCD, LSI) is developed concurrently with the development of the product. Therefore, there are often cases where the specifications (e.g., desired voltage, load current) desired by users are not decided until the final stage of development.

Further, in the power-supply device, it is necessary to confirm a gain, a phase margin and the like, by also taking into account external components. Commonly, these parameters are confirmed by simulation. A simulation allows the power-supply circuit to be developed with parameters that have been confirmed beforehand, even before a prototype of the load device becomes available. This is advantageous in providing a sufficient development period for the power-supply circuit.

Further, Patent Document 1 (Japanese Unexamined Patent Publication No. 74456/1992 (Tokukaihei 4-74456) (published on Mar. 9, 1992)) described below teaches a fabrication method of a power-supply device, in which a plurality of power-supply circuits are provided in advance in a semiconductor, and only a necessary circuit block among these power-supply circuits is connected in accordance with user's specifications. With the method, the development is completed by simply changing metals, and therefore it is possible to shorten the time for producing the prototype.

However, in the arrangement in which simulation is employed to assess operations of the power-supply device and the load device, it is difficult to perform the simulation with enough accuracy.

Specifically, simulation requires modeling of external components for simulation, and modeling of the load device. However, since it is difficult to establish a model for a coil or other external components for simulation, and a model for transient current characteristics of the load device, a simplified model has currently been used to perform simulation for the operation assessment during development. In the case where the load device is under development, procedures such as the extraction of a load model for the device need to be made on the basis of provisional specifications. However, the specifications used in these procedures often differ from the actual specifications of the device.

Accordingly, it is difficult to perform a sufficiently accurate simulation for the operation assessment of the power-supply device and the load device. As a preventative measure for the risk of causing problems due to error, there have been attempts to provide a compensating circuit for proving a margin, or install a dummy element in the chip so as to allow for correction of error in a short time period by changing metals. However, this often increases the chip size, with the result that production costs may be increased, or the products may not be able to have a strong competitive edge.

On the other hand, in the method of Patent Document 1 that a device is developed by changing wirings, a finished product include an unnecessary circuit that is not used. In this case, the size of the chip cannot be reduced, and therefore the production costs may increase.

Meanwhile, the load devices currently require a wide range of voltages, some requiring a small voltage to comply with the finer design rule, and others still requiring the conventional voltage.

This increases the number of channels in the output lines (the number of output lines to supply power), from the point of view of the power-supply device. Accordingly, the problem of increased production cost becomes more prominent, as compared to the case where only a power-supply circuit for one channel is provided.

SUMMARY OF THE INVENTION

The present invention was made in view of the foregoing problems, and an object of the invention is to provide a power-supply semiconductor integrated circuit, a power-supply semiconductor integrated circuit system, and a development assisting system for a power supply, which can be used to assist development of a power-supply circuit of a relatively small circuit scale and with suitable parameters.

In order to achieve the foregoing object, the present invention provides a power-supply semiconductor integrated circuit for realizing a parameter-deciding power-supply circuit, which, in order to decide a parameter of a power-supply circuit that supplies power to a load device, is connected to the load device in place of the power-supply circuit, wherein the power-supply circuit and the parameter-deciding power-supply circuit are switching power-supply circuits, and the power-supply semiconductor integrated circuit further includes: one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command.

A suitable size of the switching transistors of the power-supply circuit is dependent on characteristics of the load device. The load device can therefore be developed by extracting a load model for the device, and performing a simulation based on the extracted model. However, this requires a double margin of error for the inaccuracy in the specifications and the inaccuracy in the result of simplified simulation. This makes it difficult to set an optimum value for the size of the switching transistors.

In view of this drawback, the foregoing structure specifies the size of transistors to the selecting circuit serving as a control circuit, and varies the size of the transistors to be operated as switching transistors, with the load device actually connected to the parameter-deciding power-supply circuit. This allows for assessment/evaluation of the switching transistors in regard to a suitable size for supplying power to the load device.

As a result, a suitable size can be extracted for the switching transistors, without time-consuming and skillful procedures, such as the extraction of a load model for the load device, or the simulation using the extracted load model.

The power-supply semiconductor integrated circuit of the foregoing structure is used to determine a parameter of the power-supply circuit that actually supplies power to the device. As such, the actual power-supply circuit does not need to be provided with the transistor array. This is advantageous in reducing the scale of the power-supply circuit, as compared with the structure in which a plurality of power-supply circuits are provided in the actual power-supply circuit and are independently selected for use.

The power-supply semiconductor integrated circuit can be used to assist development of a power-supply circuit in a relatively small scale and with suitable parameters.

In order to achieve the foregoing object, the present invention provides a power-supply semiconductor integrated circuit for realizing a parameter-deciding power-supply circuit, which, in order to decide a parameter of a power-supply circuit that supplies power to a load device, is connected to the load device in place of the power-supply circuit, wherein the power-supply circuit and the parameter-deciding power-supply are linear regulators, and the power-supply semiconductor integrated circuit further includes: a transistor array that includes a plurality of transistors operable as driver transistors that drive power to the load device in the parameter-deciding power-supply circuit; a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command.

A suitable size of the driver transistors of the power-supply circuits is also dependent on characteristics of the load device. The load device can therefore be developed by extracting a load model for the device, and performing a simulation based on the extracted model. However, in this case, it is difficult to find an optimum value for the size of the transistors.

In view of this drawback, the foregoing structure specifies the size of transistors to the selecting circuit serving as a control circuit, and varies the size of the transistors to be operated as driver transistors, with the load device actually connected to the parameter-deciding power-supply circuit. This allows for assessment/evaluation of the driver transistors in regard to a suitable size for supplying power to the load device.

As a result, a suitable size can be extracted for the driver transistors, without time-consuming and skillful procedures, such as the extraction of a load model for the load device, or the simulation using the extracted load model. Further, since the selecting circuit varies the phase compensating constant of the phase compensating circuit according to the size of the transistor, no technical consideration needs to be given to the compensating procedure for the phase margin that varies as a result of varying the size of the driver transistors.

The power-supply semiconductor integrated circuit of the foregoing structure is used to determine a parameter of the power-supply circuit that actually supplies power to the device. As such, the actual power-supply circuit does not need to be provided with the transistor array. This is advantageous in reducing the scale of the power-supply circuit, as compared with the structure in which a plurality of power-supply circuits are provided in the actual power-supply circuit and are independently selected for use.

In order to achieve the foregoing object, the present invention provides a power-supply semiconductor integrated circuit system in which a plurality of power-supply semiconductor integrated circuits including a switching control circuit are integrated on a single device to realize a parameter-deciding power-supply circuit of multiple channels, the power-supply semiconductor integrated circuit system including: an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command.

By the provision of the power-supply semiconductor integrated circuit, the power-supply semiconductor integrated circuit system can also be used to provide a power-supply circuit in a relatively small scale and with suitable parameters.

According to the foregoing structure, the phase difference of the ON/OFF timings of the switching transistors can be varied as a parameter of the power-supply circuit between the power-supply semiconductor integrated circuits (phase difference can be varied between channels). This allows for assessment/evaluation of the phase difference between channels in regard to a suitable value for supplying power to the load device.

This helps assist designing a power-supply circuit that, for example, does not cause large higher harmonic waves, which occur when the switching noise that is generated when driving more than one device is superimposed, or that does not cause much stress on the power supply that is connected to the input terminals of the power-supply semiconductor integrated circuits.

According to the present invention, there is provided a power-supply semiconductor integrated circuit system in which a plurality of power-supply semiconductor integrated circuits are integrated on a single device to realize a parameter-deciding power-supply circuit of multiple channels, the power-supply semiconductor integrated circuit including: a plurality of power-supply input terminals connected to power supplies that supply power to the parameter-deciding power-supply circuit; a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command.

By the provision of the power-supply semiconductor integrated circuit, the power-supply semiconductor integrated circuit system can also be used to provide a power-supply circuit in a relatively small scale and with suitable parameters.

According to the foregoing structure, the combinations of power-supply semiconductor integrated circuits to be connected to the same power-supply terminal can be varied as a parameter of the power-supply circuit. Specifically, the combinations of the power-supply semiconductor integrated circuits are varied with the load devices connected to the power-supply semiconductor integrated circuits of the respective channels, so as to assess/evaluate which channels are to share the power-supply in supplying power to the devices.

In this way, the effect of interference that might occur between the devices due to noise that is transmitted through the power supply and GND lines can be confirmed beforehand, prior to reducing the number of terminals to reduce the package size. This reduces the risk in developing the power-supply circuit.

Further, according to the present invention, there is provided a development assisting system for a power-supply. The development assisting system includes: a specifying section for specifying the parameter to a control circuit of any one of the foregoing power-supply semiconductor integrated circuits, or a control circuit of any one of the foregoing power-supply semiconductor integrated circuit systems; and a parameter deciding section for (I) receiving a result of evaluation that was performed while power is being delivered to the load device by the parameter-deciding power-supply circuit realized by the power-supply semiconductor integrated circuit of the specified parameter, and (II) setting a new parameter to the control circuit according to the inputted result of evaluation.

In the foregoing structure, the specifying section and the parameter deciding section are provided. The specifying section specifies the parameter of the power-supply circuit to the control circuit. This helps assist designing a power-supply circuit in a relatively small scale and with suitable parameters, as with the foregoing power-supply semiconductor integrated circuit and power-supply semiconductor integrated circuit system.

The development assisting system for a power supply may be realized by hardware, or by causing a computer to run a program. Specifically, according to the present invention, there is provided a program for causing a computer to operate as respective members of the development assisting system of a power-supply circuit. Further, according to the present invention, there is provided a storage medium in which the program of the invention of recorded.

When the program is run by a computer, the computer operates as the development assisting system of a power-supply circuit. Thus, the program can also help assist designing a power-supply circuit in a relatively small scale and with suitable parameters.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

Figure 1:
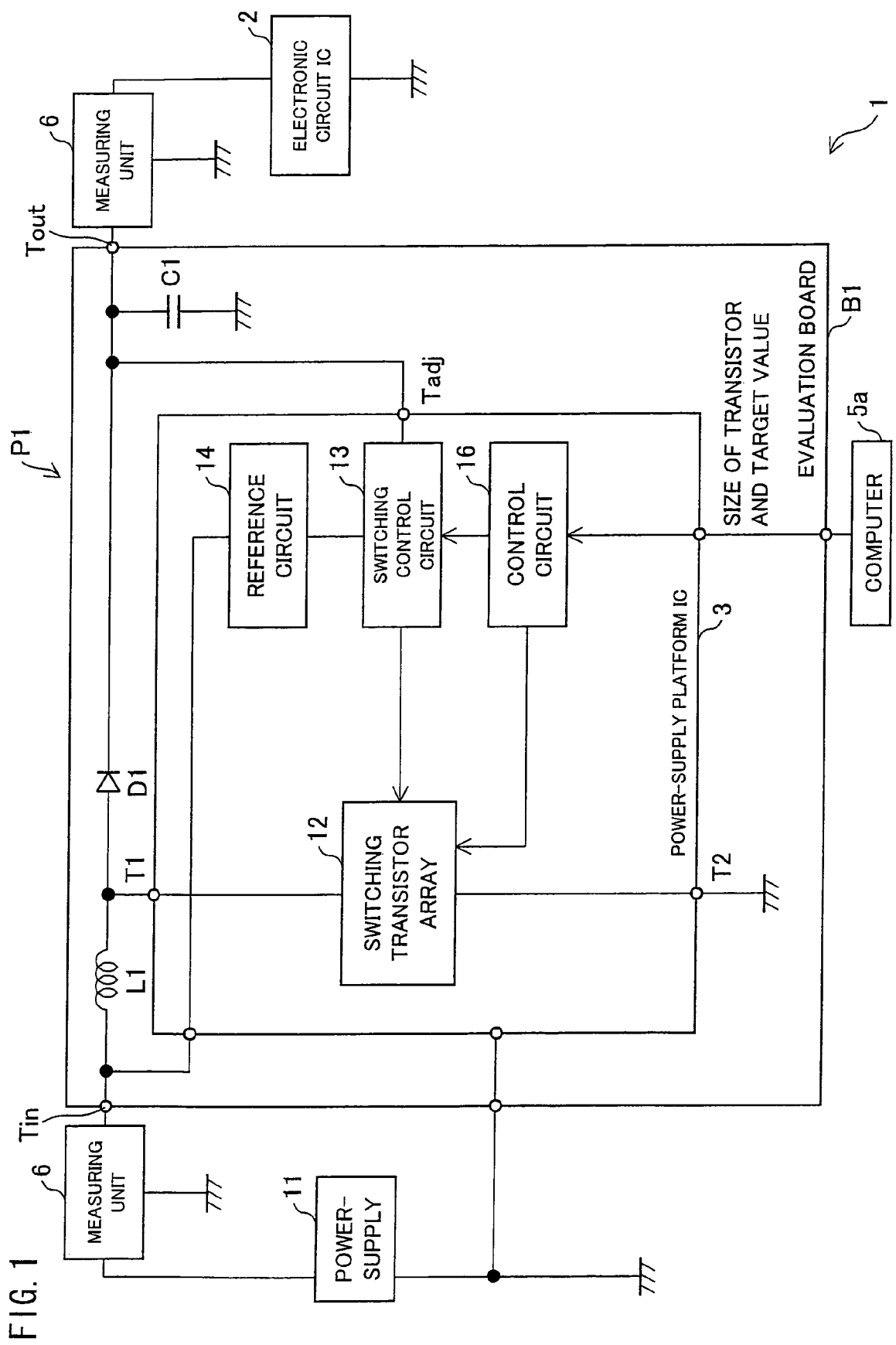
FIG. 1 is a block diagram illustrating a main structure of a development assisting system including (i) a power-supply circuit formed for the evaluation/assessment of a parameter and (ii) an electronic circuit IC that receives power from the power-supply circuit, according to one embodiment of the present invention.
Figure 2:
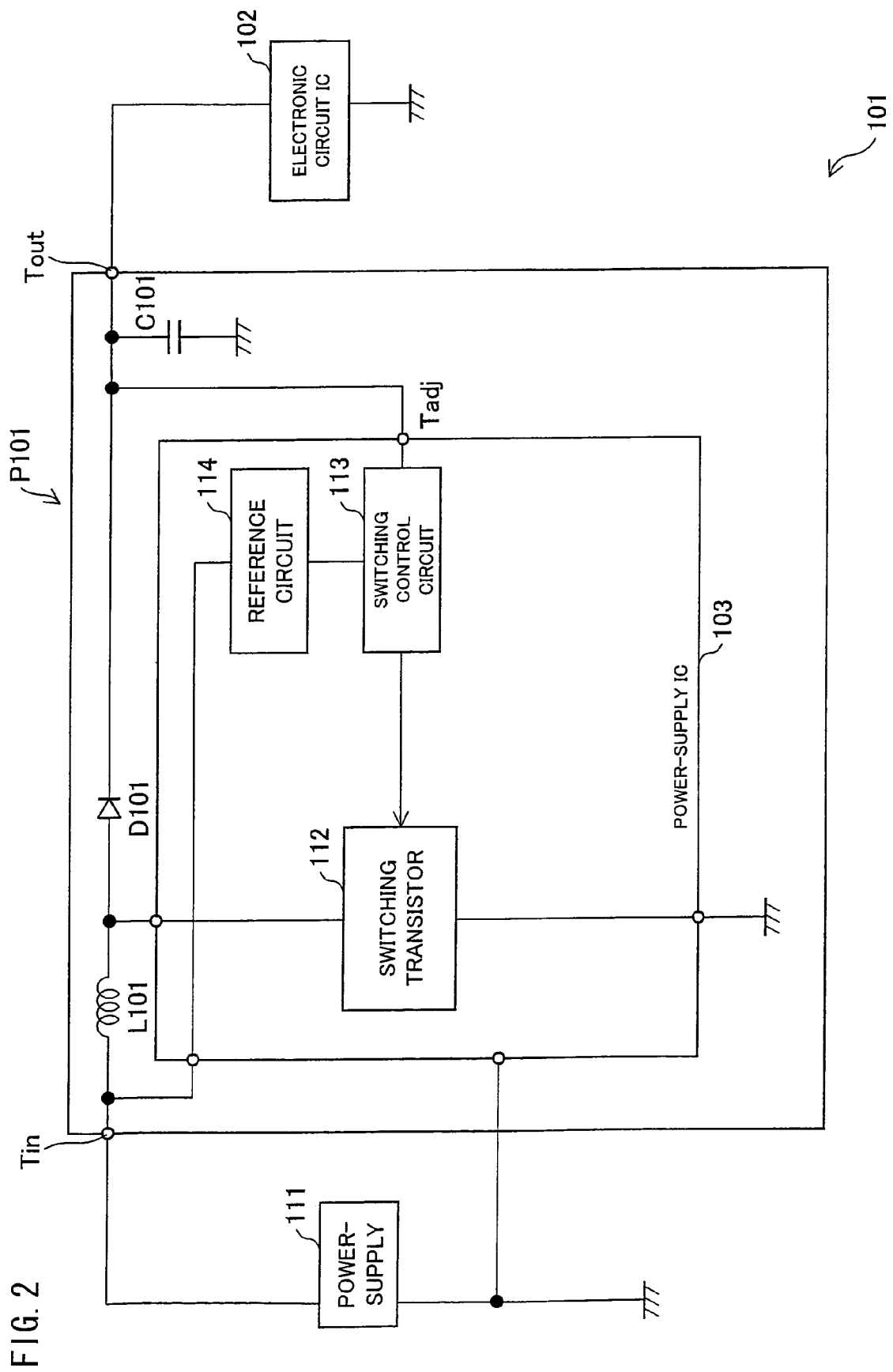
FIG. 2 is a block diagram illustrating a main structure of (i) a power-supply circuit that is developed with the parameter and (ii) an electronic circuit IC that receives power from the power-supply circuit.

The following will describe one embodiment of the present invention with reference to FIGS. 1 through 7. A development assisting system 1 of the present embodiment is a system that is suitably used for the development of a circuit 101 that includes: an electronic circuit IC 102 under development; a power-supply IC 103 for supplying power to the electronic circuit IC 102; and external elements 104 that are connected to the power-supply IC 103 to form a power-supply circuit P101, as shown in FIG. 2. For example, as shown in FIG. 1, the development assisting system 1 includes: an electronic circuit IC 2 being developed; a power-supply platform IC 3, connectable to the electronic circuit IC 2, capable of changing predetermined design values (parameters) of a power-supply circuit P1 according to an external command; external elements 4, connected to the power-supply platform IC 3 to form the power-supply circuit P1; and a computer 5 for selecting parameters to be set in the power-supply platform IC 3.

In the present embodiment, the power-supply platform IC 3 is installed on an evaluation board B1. On a surface of the evaluation board B1 is provided a wiring for connecting and mounting the external elements 4. The evaluation board B1 also has terminals for providing interconnections to the electronic circuit IC 2 and the computer 5.

The following describes an exemplary structure in which the power-supply circuits P101 and P1 are realized by switching power-supply circuits, and in which the power-supply platform IC 3 varies the size of switching transistors and the target value of output voltage, as the parameters of the power-supply circuit P1.

Specifically, as shown in FIG. 2, the power-supply circuit P101 of the circuit 101 according to the present embodiment includes, for example: a switching transistor 112 for intermittently supplying power, supplied from a power-supply 111 such as a battery, to the electronic circuit IC 102; a switching control circuit 113 for adjusting the duty ratio of the switching transistor 112 according to an output voltage Vout supplied to the electronic circuit IC 102, so as to set a predetermined constant voltage Vc for the output voltage Vout; and a reference circuit 114 for supplying a reference voltage to the switching control circuit 113. In the present embodiment, the switching transistor 112, the switching control circuit 113, and the reference circuit 114 are all integrated in the power-supply IC 103.

The power-supply circuits P101 and P1 can be realized by various types of switching power-supply circuits of, for example, a step-down chopper type, a step-up chopper type, or an inversion chopper type. The following detailed description is based on the case where the power-supply circuits P101 and P1 are realized by switching power-supply circuits of a step-up chopper type.

Specifically, in the power-supply circuits P101 and P1 of the present embodiment, the switching transistor 112 is interposed between a terminal T1 and a terminal T2 via a coil L101 (external element 104). The terminal T1 is connected to the power supply 111. The terminal T2 is grounded. Further, the terminal T1 is connected to an output terminal Tout of the power-supply circuit P101 via a diode D101, and the output terminal Tout is grounded via a capacitor C101. The output terminal Tout is also connected to the electronic circuit IC 102. The output voltage Vout of the output terminal Tout is applied to the switching control circuit 113 via a terminal Tadj.

In this structure, a power-supply voltage Vi of the power-supply 111 is applied across the coil L101 while the switching transistor 112 is ON. As a result, energy is stored in the coil L101. When the switching transistor 112 is turned OFF, the stored energy in the coil L101 is supplied to the capacitor C101 via the diode D101, and the capacitor C101 produces output voltage Vout by smoothing it. The potential at the terminal T1 is Vi+V1, where V1 is the voltage across the coil L101. This enables the power-supply circuit P101 to raise the input voltage V1 from the power-supply 111 and apply it to the electronic circuit IC 102.

Here, the smoothed output voltage Vout varies as a result of a change in the input voltage Vi, the duty ratio of the switching transistor 112, or the load of the electronic circuit IC 102. As a countermeasure, the switching control circuit 113 monitors the output voltage Vout by the applied voltage to the terminal Tadj, and reduces the duty ratio of the switching transistor 112 in a controlled manner when, for example, fluctuations in the input voltage Vi of the power-supply 111 or fluctuations in the load of the electronic circuit IC 102 cause a slight change in the output voltage Vout and the output voltage Vout is expected to exceed the preset voltage Vc. On the other hand, if the output voltage Vout is expected to fall below the preset voltage Vc due to fluctuations, the switching control circuit 113 increases the duty ratio of the switching transistor 112. In this way, the power-supply circuit P101 is able to supply a constant voltage Vc to the electronic circuit IC 102, regardless of fluctuations in the load of the electronic circuit IC 102 or the input voltage Vi.

The size of the switching transistor 112 affects the following parameters: (a) the ability to supply necessary power to the electronic circuit IC 102; (b) efficiency; and (c) the amount of noise superimposed on the waveform of the output voltage supplied from the output terminal Tout. Generally, these parameters (a) through (c) vary depending upon the input-output characteristics of the electronic circuit IC 102 serving as the load. It is therefore necessary to grasp the input-output characteristics of the electronic circuit IC 102 in order to accurately determine a suitable size for the switching transistor 112.

In the development of the electronic circuit IC 102, the input-output characteristics of the electronic circuit IC 102 (load) are usually determined by extracting a load model therefor and by performing a simulation using the extracted load model.

However, the extraction of a load model or simulating the power-supply circuit with a load model is relatively time consuming and requires skill. This necessitates one to perform these procedures based on provisional specifications of a prototype of the electronic circuit IC 102 (IC 2), if it is being developed. Further, the specifications used for these procedures are not always the same as the actual specifications of the electronic circuit IC 102 (IC 2). Even if the extracted load model were accurate, the power-supply circuit is not always simulated based on such accurate models due to time consideration. Rather, the simulation is often performed based on a simplified model so that the simulation is finished in a more practical and shorter time period. For these reasons, the simulation inevitably yields inaccurate results for the input-output characteristics of the electronic circuit IC 102.

The drawback of the method whereby the simulation is used to determine the size of the switching transistor then is that the method requires a double margin of error for the inaccuracy in the specifications and the inaccuracy in the result of simplified simulation. This makes it difficult to set an optimum value for the size of the switching transistor, and sufficiently reducing the power consumption of the system including the power-supply circuit and the electronic circuit IC.

Meanwhile, consider the structure in which a plurality of power-supply circuits is provided in the IC and only required power-supply circuits are connected to the device. Since the IC includes unnecessary power-supply circuits in this structure, the circuit scale and chip size tend to increase, which may lead to increased manufacturing cost.

In contrast, in the development assisting system 1 according to the present embodiment, the electronic circuit IC 2 that was made during the development of the electronic circuit IC 102 is connected to the power-supply platform IC 3 for the assessment or evaluation of the size of the switching transistor 112, and as a result the size of the switching transistor 112 is set to an appropriate value for the power-supply circuit P101 of the product circuit (circuit 101).

In this way, the parameters of the power-supply circuit P101 can have more appropriate values as compared with the method employing simulation, and as a result the power consumption can be reduced in the power-supply circuit P101, and the circuit 101 including the electronic circuit IC 102. Further, the circuit scale and chip size and therefore the manufacturing cost can be reduced as compared with the structure provided with a plurality of power-supply circuits in groups.

The following describes a structure of the development assisting system 1 in detail, and a method that uses the development assisting system 1 to determine the size of the switching transistor 112. The power-supply platform IC 3 of the development assisting system 1 according to the present embodiment is used to form the power-supply circuit P1 of a step-up chopper type, similar to the power-supply circuit P101 used in the circuit 101. By being connected to the external elements 4, the power-supply platform IC 3 switches the power supplied from the power supply 11, equivalent to the power-supply 111, and supplies it to the electronic circuit IC 2 after smoothing.

Specifically, the power-supply platform IC 3 according to the present embodiment includes a switching transistor array 12, provided instead of the switching transistor 112 shown in FIG. 2, and a switching control circuit 13 and a reference circuit 14, which are substantially the same as the switching control circuit 113 and the reference circuit 114, respectively.

The switching transistor array 12 is a circuit which, according to an external command, varies the size of the transistors serving as the switching transistors of the power-supply circuit P1. For example, as shown in FIG. 3, the switching transistor array 12 includes switching transistors 21, disposed parallel to one another, and a selector circuit 22 for individually controlling the switching transistors 21 according to externally supplied select signals, whether to operate the switching transistors 21 as switching transistors.

Figure 3:
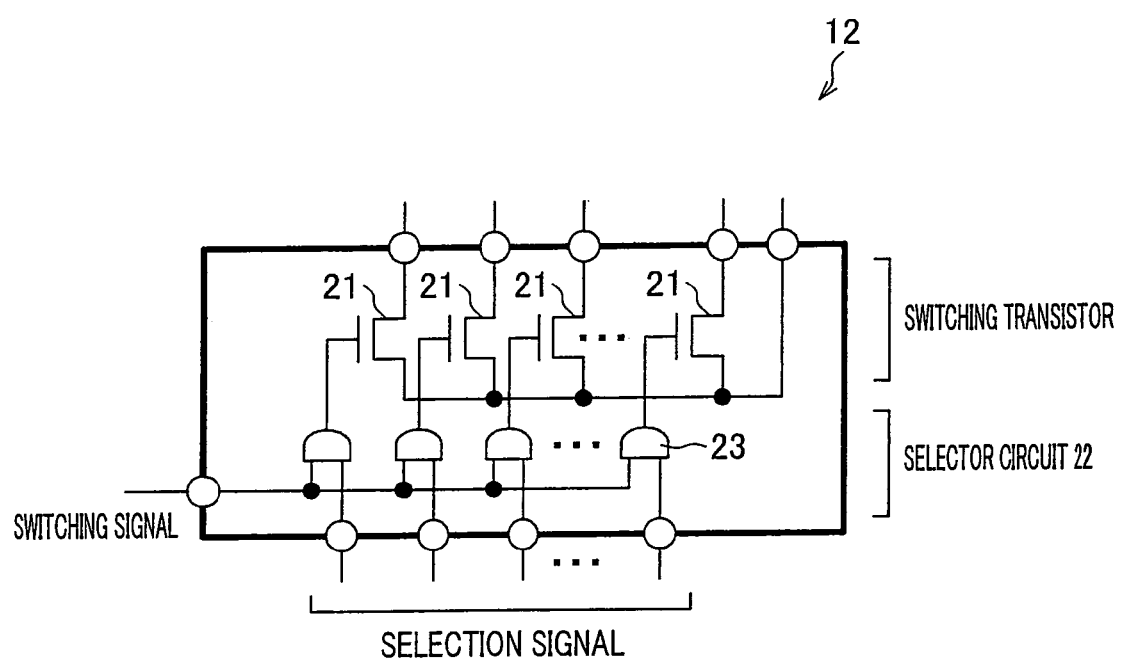
FIG. 3 is a circuit diagram illustrating a main structure of a switching transistor array provided in a power-supply platform IC of the power-supply circuit.

More specifically, in the structure shown in FIG. 3, the selector circuit 22 includes gate circuits (AND gates in the example of FIG. 3) respectively corresponding to the switching transistors 21. The gate circuits 23 allow switching signals from the switching control circuit 13 to be supplied to the respective switching transistors 21 when the select signals for the corresponding switching transistors 21 are active. When the select signals are inactive, the gate circuits 23 turn off the corresponding switching transistors 21, irrespective of the switching signals.

The power-supply platform IC 3 also includes a control circuit 16. The control circuit 16 outputs the select signals, indicative of whether to operate the switching transistors 21 as switching transistors, to the switching transistor array 12 according to instructions from the computer 5. The select signals can turn on a plurality of switching transistors 21 at once, or only one switching transistor 21.

The switching control circuit 13 and the reference circuit 14 according to the present embodiment are substantially the same as the switching control circuit 113 and the reference circuit 114, respectively, shown in FIG. 2. For example, the reference circuit 14 supplies a reference voltage to be compared by the switching control circuit 13 with a voltage applied to the terminal Tadj. The switching control circuit 13 varies a target value Vc of output voltage according to an external command, for example, by raising or lowering the reference voltage. Accompanied by these operations, the control circuit 16 specifies a target value Vc of output voltage to at least one of the switching control circuit 13 and the reference circuit 14 according to instructions from the computer 5.

In the present embodiment, the external element 4 is connected in the same manner as the external element 104. Specifically, each terminal T1 of the power-supply platform IC 3 is connected to a coil L1 and a diode D1, as with the coil L101 and the diode D101 of the power-supply circuit P101. The terminal Tout between the diode D1 and the electronic circuit IC 2 is connected to a capacitor C1, as with the capacitor C101 of the power-supply circuit P101. Further, as in the power-supply circuit P101, the voltage Vout at the terminal Tout is applied to the terminal Tadj of the power-supply platform IC 3. The terminal T2 is grounded.

Further, in the present embodiment, the power-supply circuit P1 is evaluated based on the result of measurement on the electric characteristics of the power-supply circuit P1, as will be described later in more detail. During evaluation, a measuring unit 6 is connected to the power-supply circuit P1, as shown in FIG. 1. The measuring unit 6 according to the present embodiment measures the input voltage, input current, output voltage, and output current as the electric characteristics of the power-supply circuit P1.

The measuring unit 6 according to the present embodiment is able to measure a mean voltage or mean current. Further, in measuring input current Iin, the measuring unit 6 according to the present embodiment measures not only a mean current but also a peak current. When measuring the output voltage Vout, the measuring unit 6 according to the present embodiment measures a mean voltage. Here, the measuring unit 6 is also able to measure a peak voltage, since it also measures the amount of noise superimposed on the output voltage Vout. The measuring unit 6 may present the results of measurements and request a user to enter the results into the computer 5. In the present embodiment, however, the measuring unit 6 outputs the results of measurement to the computer 5.

Figure 4:
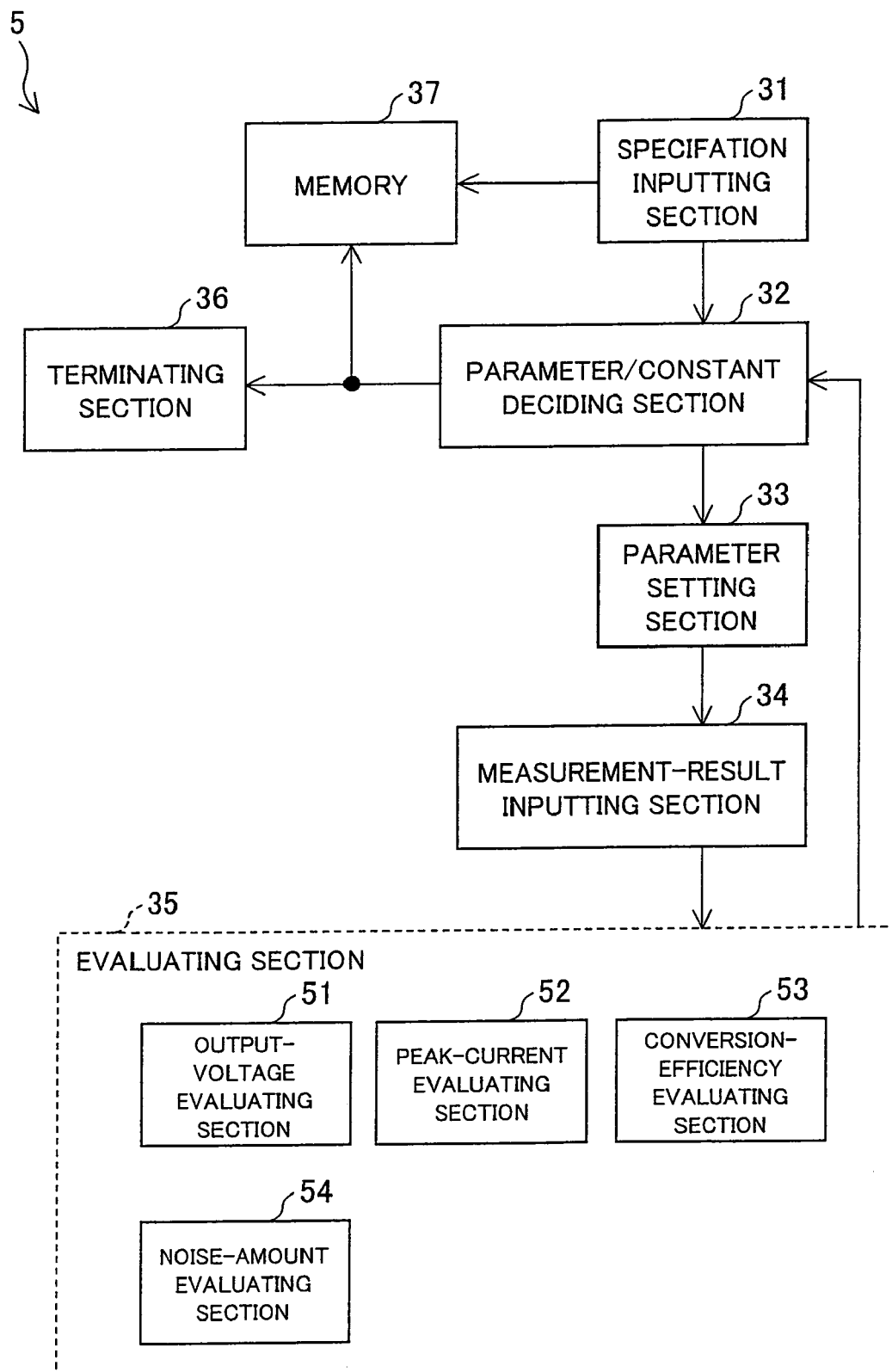
FIG. 4 is a block diagram illustrating a main structure of a computer for specifying a parameter to be set in the power-supply platform IC.

As shown in FIG. 4, the computer 5 according to the present embodiment includes, for example: a specification input section 31 for entering input specifications (rated input voltage, input current, voltage regulations, maximum peak current, etc.), output specifications, (rated output voltage (target value Vc), rated output current, current regulations, and maximum value of acceptable noise amount, etc.), and target efficiency; a parameter/constant deciding section 32 for deciding, according to the input specifications, a predetermined parameter (size of the switching transistors in this embodiment) for the power-supply circuit P1, and constants for the external elements 4; a parameter setting section 33 for specifying the parameter so decided to the control circuit 16 of the power-supply platform IC 3, for example, by sending a signal via signal lines (I2 bus, etc.); a measurement result inputting section 34 for receiving results of measurement that was performed by the measuring unit 6 with the electronic circuit IC 2 connected to the power-supply circuit P1 which has been set to the foregoing parameter; and an evaluating section 35 for evaluating the measurement results received by the measurement result input section 34 and instructing the parameter/constant deciding section 32 to decide parameters and constants again.

In the present embodiment, the measurement result inputting section 34 receives the measurement results outputted from the measuring unit 6; however, the measurement result inputting section 34 may alternatively receive measurement results from a user. The computer 5 and evaluation board B1 may have a configuration in which the evaluation board B1 is provided with a plurality of external elements 4 of different constants, and a switch for selecting, according to an external command, an external element 4 to be connected to the power-supply platform IC 3, and in which the computer 5 instructs the evaluation board B1 to automatically set a constant for the external element 4. However, in the present embodiment, the computer 5 is adapted so that the parameter/constant deciding section 32 presents the decided constant to a user and requests the user to connect the external element 4 of the decided constant to the power-supply platform IC 3.

The computer 5 further includes a terminating section 36. The parameter/constant deciding section 32 determines, based on the results of evaluation performed by the evaluating section 35, whether an optimum parameter and constant have been found. If found, the parameter/constant deciding section 32 stops setting parameters and constants and performing measurement on these values, and causes the terminating section 35 to perform a predetermined process a process performed when a search for optimum values is finished. In the final process, the terminating section 36 according to the present embodiment can store the optimum parameter and constant in a memory 37 provided in the computer 5.

Note that, the foregoing members 31 through 55, and 61 through 64 (some of which will be described later) are functional blocks that are realized as the CPU of the computer 5 or 9 (described later) executes a program stored in a memory unit and thereby controls peripheral circuits such as an input-output circuit.

More specifically, the evaluating section 35 includes: an output-voltage evaluating section 51 for comparing the result of measurement, i.e., output voltage (mean value), with the target value Vc of the output voltage supplied to the specification input section 31; a peak current evaluating section 52 for comparing the measured input current (peak value), with the maximum peak current supplied to the specification input section 31; a conversion-efficiency evaluating section 53 for calculating a conversion efficiency from the measured input-output voltage and input-output current (both are mean values), and comparing the actual conversion efficiency with the conversion efficiency supplied to the specification input section 31; and a noise-amount evaluating section 54 for calculating the amount of noise superimposed on the output voltage Vout and comparing the result with the maximum noise amount that has been inputted as a specification. Note that, the amount of noise calculated by the noise-amount evaluating section 54 is, for example, the difference between the measured output voltage (peak value) and the target value Vc.

The parameter/constant deciding section 32 can decide constants of the respective external elements 4 and the initial value of the size of the switching transistors according to the specifications inputted to the specification input section 31, using, for example, a predetermined table or functions.

Further, the parameter/constant deciding section 32 can increase the inductance of the coil L1, one of the external elements 4, when the peak current evaluating section 52 finds that the maximum peak current has been reached. This prevents the coil L1 from saturating and failing to store energy, thereby preventing an undesirably large current from flowing into the coil L1 and the electronic circuit IC 2.

Further, the parameter/constant deciding section 32 can increase the size of the switching transistors, when the conversion-efficiency evaluating section 53 finds that the conversion efficiency is deficient. Increasing the size of the switching transistors reduces the ON resistance of the switching transistors, and thereby reduces the power loss induced by the switching transistors themselves. Thus, by increasing the size of the switching transistors when there is deficiency in conversion efficiency, the power loss in the switching transistors can be reduced, and the conversion efficiency of the power-supply circuit P1 can be improved.

Note that, the parameter/constant deciding section 32 may increase or decrease the parameter (here, size of the switching transistors) by a predetermined increment or decrement, or by following a predetermined procedure according to the measurement result and/or the measured value. Alternatively, the parameter/constant deciding section 32 may change the parameter according to user instructions.

On the contrary, in the case where the conversion-efficiency evaluating section 53 finds that the conversion efficiency has exceeded the conversion efficiency entered as a specification, the parameter/constant deciding section 32 can reduce the size of the switching transistors.

Increasing the size of the switching transistors increases the static capacitance of the parasitic capacitor. This may increase the power loss in the power-supply circuit P1. With the increased static capacitance, the parasitic capacitor may resonate with the external element 4 to generate higher harmonic waves. Further, when the size of the switching transistors is increased and the ON resistance of reduced, the switching noise that is generated when switching the switching transistors is increased. Such higher harmonic waves or switching noise may enter the GND line and the power-supply line that supplies power from the power-supply platform IC 3 (power-supply IC 103) to the electronic circuit IC 2 (electronic circuit IC 102). In this case, the logic voltage for the logic circuit of the electronic circuit IC 2 is adversely affected, which may cause malfunction in the logic circuit or other circuits directly or indirectly connected thereto. Further, the higher harmonic waves and switching noise may reflect back to the power-supply platform IC 3 (power-supply IC 103) and cause an undesirably large current to flow into the power-supply platform IC 3 (power-supply IC 103) or the electronic circuit (electronic circuit IC 102), or an undesirably large voltage to be applied to these circuits. In the worst case, these devices are destroyed.

Thus, if the conversion efficiency were found to exceed the conversion efficiency entered as a specification, the size of the switching transistor is reduced to prevent the switching transistor from being set to an undesirably large size. This suppresses various problems caused by an excessively large size the switching transistors.

Further, the parameter/constant deciding section 32 can increase the size of the switching transistors when the output-voltage evaluating section 51 determines that the measured output voltage Vout has not reached the target value Vc, regardless of whether the conversion efficiency is found by the conversion-efficiency evaluating section 53 to exceed or fall below the conversion efficiency entered as a specification. By increasing the size of the switching transistors, the voltage drop due to the ON resistance of the switching transistors is reduced. This increases the energy stored in the coil L1, and thereby increases the output voltage Vout. Thus, by causing the parameter/constant deciding section 32 to increase the size of the switching transistors under the foregoing conditions, shortage of the output voltage Vout can be suppressed.

Further, the parameter/constant deciding section 32 can reduce the size of the switching transistors when the conversion-efficiency evaluating section 53 finds that the conversion efficiency does not exceed or fall below the conversion efficiency entered as a specification, and when the output-voltage evaluating section 51 determines that the measured voltage Vout has reached the target voltage Vc. As in the foregoing case where the conversion efficiency exceeds the specification value, this prevents the switching transistors from being set to an undesirably large size, thereby preventing various problems caused by an excessively large size of the switching transistors.

Further, the parameter/constant deciding section 32 can reduce the size of the switching transistors when the noise-amount evaluating section 54 finds that the measured noise amount exceeds the acceptable value of the specification (maximum value of acceptable noise amount).

When the size of the switching transistor is increased and the static capacitance of the parasitic capacitor becomes large, the control signal (for example, gate signal) that is applied to the switching transistors to turn ON/OFF the switching transistors may be transmitted via the parasitic capacitance to signal lines that are turned ON/OFF by the switching transistors, with the result that a relatively large amount of noise is superimposed on the output voltage Vout.

Thus, the parameter/constant deciding section 32 is caused to reduce the size of the switching transistor when the measured noise amount is found to exceed the acceptable value of the specification. In this way, the amount of noise that enters the output voltage Vout via the parasitic capacitor can be suppressed.

For example, there are cases where different evaluations yield contradictory results, as in the case where the result of evaluation on conversion efficiency suggests increasing the size of the transistors whereas the result of evaluation on noise amount suggests reducing the size of the transistors. In this case, the parameter/constant deciding section 32 can set the size of the transistors based on the result that has given a priority. Specifically, the parameter/constant deciding section 32 can receive a command as to which of the conversion efficiency and the noise amount should be prioritized in deciding the size of the switching transistors. The size of the switching transistors is set based on the result of evaluation on conversion efficiency if conversion efficiency has the priority. On the other hand, the size of the switching transistors is decided based on noise amount, if the noise amount has the priority over the conversion efficiency.

Figure 5:
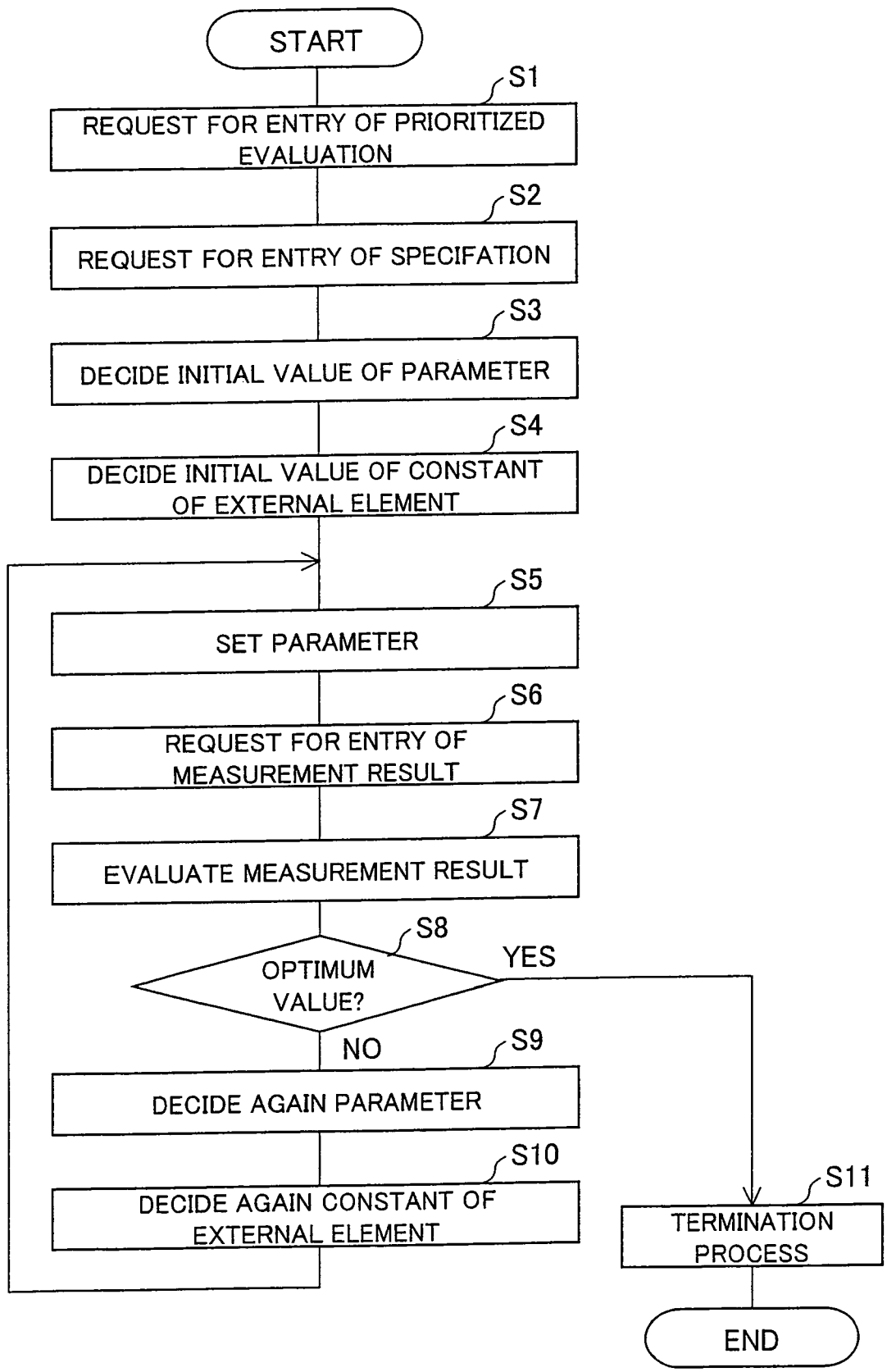
FIG. 5 is a flowchart showing operations of the development assisting system.
Figure 6:
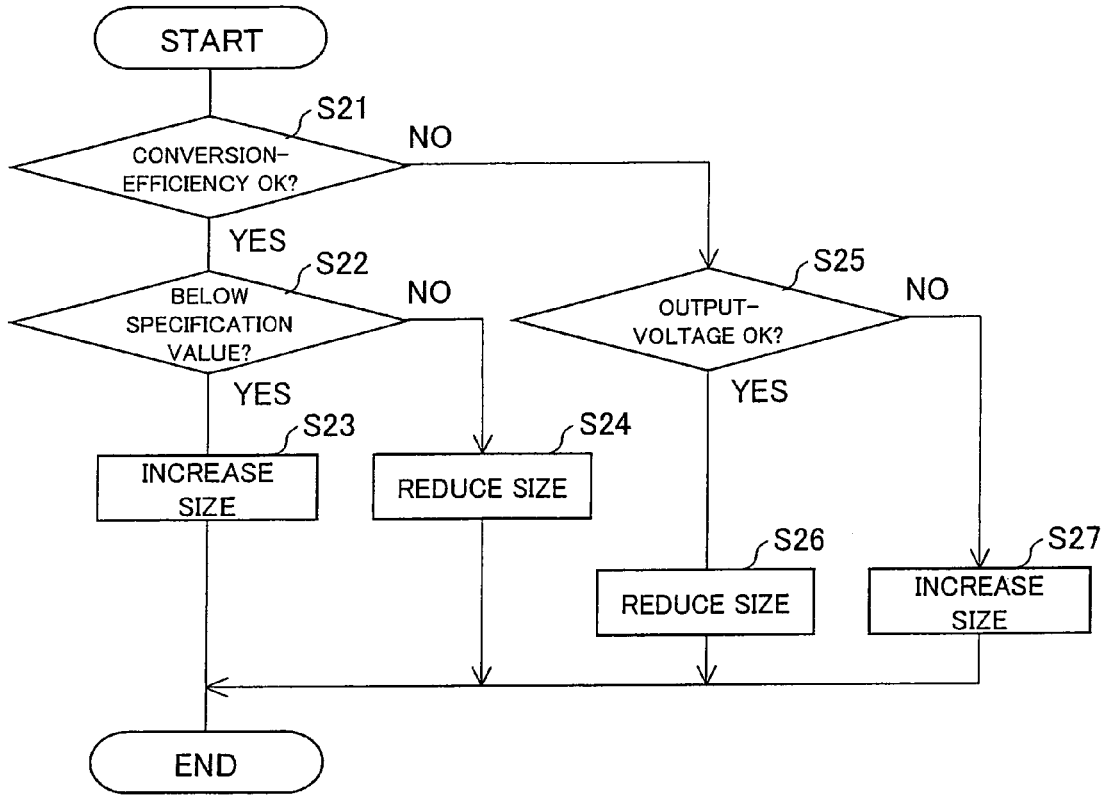
FIG. 6 is a flowchart showing operations of the development assisting system in a step of redetermining the parameter in the above flowchart, when the parameter is to be redetermined by prioritizing conversion efficiency.
Figure 7:
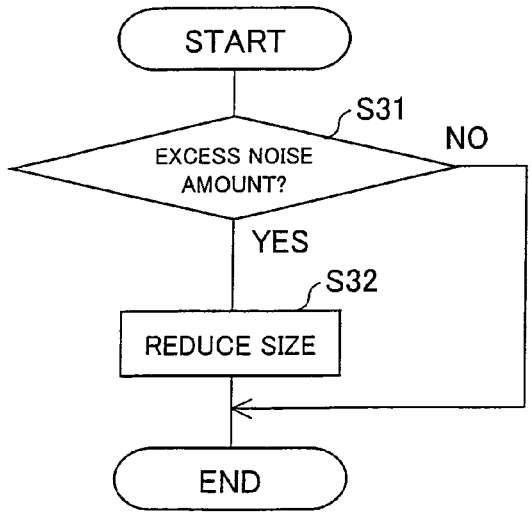
FIG. 7 is a flow chart showing operations of the development assisting system in a step of redetermining the parameter in the above flow chart, when the parameter is to be redetermined by prioritizing noise amount.

With reference to FIG. 5 through FIG. 7, description is made below as to how the development assisting system 1 according to the foregoing configuration decides the size of the switching transistors as one parameter of the power-supply circuit P1.

First, in Step 1 shown in FIG. 5 (hereinafter, Step will be abbreviated to "S"), the parameter/constant deciding section 32 of the computer 5 according to the present embodiment requests a user to enter a command as to whether a priority should be given to which of conversion efficiency and noise amount. This is made by displaying buttons to choose from, for example.

In S2, the specification input section 31 of the computer 5 receives specifications needed for the evaluation selected in S1.

For example, if the evaluation on conversion efficiency is prioritized in S1, the specification input section 31, in order to decide a specification for conversion efficiency, requests the user to enter rated input voltage, input current, rated output voltage (target value Vc), and rated output current, for example, by displaying a message. Based on this information, the specification input section 31 calculates a specification for conversion efficiency. On the other hand, if the evaluation on noise amount is prioritized in S1, the specification input section 31 requests for entry of the maximum value of acceptable noise amount.

In S2, the specification input section 31 requests for entry of a specification necessary for deciding constants for the external elements 4, and the target value Vc of output voltage. Further, the specification input section 31 according to the present embodiment requests for entry of the maximum value of peak current, as a specification that does not contradict with the user's selection of priority. Note that, for example, the target value Vc of output voltage used for the calculation of conversion efficiency is also used for other purposes. For the specifications that are used for different purposes, for example, such as the target value Vc of output voltage also used for the calculation of conversion efficiency, the specification input section 31 uses the same input value for different purposes, so as to prevent the same value from being entered again.

Upon entry of the specifications in S2, the parameter/constant deciding section 32 in S3 decides an initial value for the size of the switching transistors, and in S4 decides constants for the external elements 4 based on (i) the size of the switching transistors, and (ii) the specifications entered in S2.

As described above, with the constants decided, a user of the development assisting system 1 according to the present embodiment mounts the external elements 4 of the decided constants on the evaluation board B1, so as to constitute the power-supply circuit P1. Prior to the parameter setting in S5 and the measurement in S6, the evaluation board B1 is connected to the power supply 11, the electronic circuit IC 2, the computer 5, and the measuring unit 6.

With these members connected to the evaluation board B1 and the external element 4 mounted thereon, the parameter setting section 33 of the computer 5 in S5 feeds the power-supply platform IC 3 with the target value Vc of output voltage entered in S2, and the size of the switching transistors.

With the target value Vc and the switching transistor size set in S5, the power-supply circuit P1 starts operating and supplies power to the electronic circuit IC 2. As a result, the electronic circuit IC 2 starts operating.

When the operations of the power-supply circuit P1 and the electronic circuit IC 2 are started, the measurement result input section 34 of the computer 5, for example, requests the measuring unit 6 to enter its measurement result (S6).

When the measurement result is entered in S6, the evaluating section 35 of the computer 5 evaluates the measurement result, and the parameter/constant deciding section in S8 determines whether conditions for termination have been met and thereby decides whether an optimum parameter has been determined.

If an optimum parameter has not been determined (No in S8), the parameter/constant deciding section 32 in S9 determines the parameter (size of the switching transistor in the present embodiment) again based on the measurement result evaluated in S7, and in S10 determines constants for the external elements 4 based on (i) the new parameter and (ii) the specifications entered in S2. When the procedures of S9 and S10 are finished, the computer 5 repeats the procedures of S5 and the subsequent steps.

The procedures of S5 to S10 are repeated until an optimum parameter is determined (while No in S8). If an optimum parameter is determined (Yes in S8), the terminating section 36 in S11 stores the parameter in the memory 37, and performs a predetermined final process, for example, by presenting the parameter to the user.

As to the procedure of S8 for determining whether an optimum parameter has been determined, or conditions for termination have been met, the parameter/constant deciding section 32 can make a decision based on previously inputted conditional expressions, and actual measurement values (for example, measured values from the measuring unit 6) referred to in the conditional expressions. However, in the present embodiment, the parameter/constant deciding section 32 requests the user to enter information concerning whether an optimum parameter has been determined, and based on the user input, determines whether conditions for termination have been met.

As to the decision making on the conditions for termination, the parameter/constant deciding section 32 or the user can make a decision, for example, based on the following criteria: (1) whether power has been properly supplied to the electronic circuit IC (whether output voltage stability, ripples, and load regulations, etc., meet predetermined conditions); (2) efficiency (for example, whether target efficiency has been achieved); and (3) noise (for example, whether noise peak values on the input side and output side of the power-supply platform IC 3 (power-supply ic 103) fall within an acceptable range).

Further, the parameter/constant deciding section 32 may make a decision based on (4) the output quality of the electronic circuit IC 2 (for example, the quality of output image when the electronic circuit IC 2 is adapted to perform an imaging process), by actually operating the electronic circuit IC 2. Further, since these criteria are generally interrelated, conditions for termination may be determined based on combinations of these criteria, for example, by evaluating the combinations with predetermined evaluation functions.

The following describes such interrelations of the foregoing criteria in detail. For example, when the electronic circuit IC 2 (102) serving as a load has strong voltage dependency, there accordingly will be a need to supply stable voltage and make sure that the foregoing criterion (1) is met. However, if this were to be pursued to improve the stability of output voltage, it would be required to increase the switching frequency, the size of the capacitor (external element 4(104)), or the current driving capability of the switching transistors. This may increase the loss or increase the size of the switching transistors. Thus, when voltage dependency of the electronic circuit IC 2 (102) serving as a load is weak, no particular measure needs to be taken for improving the stability of output voltage.

As to conversion efficiency, while it is desirable to improve conversion efficiency, improving conversion efficiency of a certain power-supply circuit does not have much effect on the circuit as a whole. Rather, it is often more desirable to meet the requirements of other conditions, such as noise, and the stability of output voltage. For example, consider a power-supply circuit that produces an output voltage of 3 V from the input voltage of 5 V, and another regulator producing a 1.8 V output voltage from the 3 V output voltage of the power-supply circuit. In this case, improving the efficiency of conversion from 5 V to 3 V does not always have effect on the circuit as a whole, due to poor regulator efficiency of the down-conversion to 1.8 V. Under such circumstances, it is more desirable that the user concentrates on other categories, such as noise, output stability, and area efficiency for external elements, rather than pursuing improvement of conversion efficiency. Indeed, in the actual circuit, it is often more desirable to satisfy other criteria, provided that a certain level of conversion efficiency is satisfied.

Similarly, while it is desirable that the noise be reduced as much as possible, it is often more desirable to concentrate more on other criteria. Here, if only the reduction of noise amount were pursued, it might be required to increase the number of power supplies and GND terminals required for the power-supply ic 103, with the result that the package size is increased. Further, it may be required to increase the ON resistance of the switching transistors, which lowers conversion efficiency. Therefore, it is not always necessary to reduce the amount of noise. For example, it is desirable that the noise be reduced to the extent where the noise peak values at the input side and output side of the power-supply platform IC 3 (power-supply ic 103) do not exceed the acceptable value for the electronic circuit IC 2 (102), and where the noise does not affect other devices even when it is reflected on the power supply side. Instead of reducing the noise amount any further, it would be more desirable to satisfy other criteria.

As described above, the foregoing criteria are interrelated to one another, and different emphases are made depending upon the intended use of the electronic circuit IC 2 (102). By taking this into consideration, the user decides which criteria are to be emphasized, and instructs the parameter/constant deciding section 32 to perform procedures (conditional expression, evaluation functions, etc.) for determining conditions for termination, or enters the results of determination on termination conditions. Note that, during the procedure of repeating the evaluation/assessment of the parameters with the electronic circuit IC 2 actually connected to the power-supply platform 3, the user may decide which criteria should be emphasized, based on the result of evaluation/assessment or the output quality of the electronic circuit IC 2, and instruct the parameter/constant deciding section 32 as such.

In the following, description is made as to how the size of the switching transistors is redetermined in S9. Specifically, when the evaluation on conversion efficiency is prioritized in S1 of FIG. 5, the parameter/constant deciding section 32 performs the procedures of S21 through S27.

More specifically, based on the evaluation result from the conversion-efficiency evaluating section 53, the parameter/constant deciding section 32 in S21 determines whether the actual value of conversion efficiency matches the specification value. If there is no match (No in S21), the parameter/constant deciding section 32 in S22 determines whether the actual value of conversion efficiency is below the specification value, based on the evaluation result from the conversion-efficiency evaluating section 53. In YES, the parameter/constant deciding section 32 in S22 increases the size of the switching transistors and finishes the size redetermining process that is based on conversion efficiency. On the other hand, if NO in S23, the parameter/constant deciding section 32 in S24 decreases the size of the switching transistors and finishes the size redetermining process that is based on conversion efficiency.

If there is a match (YES) in S21, the parameter/constant deciding section 32 in S25 determines whether the actual value (mean value) of the output voltage Vout has reached the target value Vc, based on the evaluation result from the output-voltage evaluating section 51. If YES, the parameter/constant deciding section 32 in S26 decreases the size of the switching transistors and finishes the size redetermining process that is based on output voltage. On the other hand, if NO in S25, the parameter/constant deciding section 32 in S27 increases the size of the switching, transistors and finishes the size redetermining process that is, based on output voltage.

When the evaluation on noise amount is prioritized in S1 of FIG. 5, the procedures of S31 and S32 shown in FIG. 7 are performed. Specifically, the parameter/constant deciding section 32 in S31 determines whether the amount of noise superimposed on the output voltage Vout exceeds the acceptable value of the specification, based on the evaluation result from the noise-amount evaluating section 54. If YES, the parameter/constant deciding section 32 in S32 decreases the size of the switching transistors and finishes the size redetermining process that is based on noise amount.

In either case, the parameter/constant deciding section 32 in S9 of FIG. 5 determines whether the peak value of input current exceeds the maximum peak current, based on the evaluation result from the peak current evaluating section 52. If YES, the parameter/constant deciding section 32 increases the reactance of the coil L1.

The foregoing described the case where the power-supply circuit (P1, P101) is of a step-up chopper type. However, provided that the switching control circuit (13, 113) is structured to compare the output voltage of the power-supply circuit with the target value, and control the duty ratio of the switching transistor and reduce the difference between the measured output voltage and the target value, the present invention is widely applicable to various types of power-supply circuits of, for example, a step-down chopper type and an inversion chopper type, for the purpose of deciding parameters of these switching power-supply circuits. Specifically, if the output voltage and target value are given by absolute values, the power-supply platform IC 3 can be shared by different types of switching power-supply circuits, because, in this case, these switching power-supply circuits all operate to reduce the duty ratio of the switching transistors when the output voltage (absolute value) increases above the target value (absolute value), and to increase the duty ratio of the switching transistor when the output voltage (absolute value) decreases below the target value (absolute value).

As described above, in the development assisting system 1 according to the present embodiment, the power-supply platform IC 3 supplies power to the electronic circuit IC 2 under development, by varying the value of a predetermined parameter (size of the switching transistor in the present embodiment) of the power-supply circuit P1 according to instructions from the computer 5. This enables evaluation/assessment of a suitable value for the size of the switching transistors, with the electronic circuit IC 2 actually connected to the power-supply platform IC 3.

In this way, suitable values can be decided for the parameters of the power-supply circuit P1 (P101), such as the size of the switching transistors, without requiring time-consuming and skillful procedures such as the extraction of a load model for the electronic circuit IC 2 (electronic circuit IC 102) being developed, or the simulation using the extracted load model.

As a result, the power consumption of the entire system including the power-supply circuit and the electronic circuit IC can be reduced, as compared with the structure in which, in order to save time for extracting a load model and performing a simulation, the simulation is performed based on the provisional specifications of the prototype of electronic circuit IC 2 (IC 102) and therefore yields inaccurate results, and in which the power-supply circuit is designed with a relatively large margin of error so that the power-supply circuit P1 (P101) operates properly even if it does not comply with the simulation results. Further, the circuit scale of the system can be reduced as a whole, as compared with the structure in which a plurality of power-supply circuits are provided in the IC and only appropriate power-supply circuits are connected to the electronic circuit IC. As a result, the manufacturing cost of the system can be reduced greatly.

The power-supply platform IC 3 is provided with the switching transistor array 12. The power-supply circuit P101 of the product circuit (circuit 101) includes only switching transistors 112 of a suitable size, from among different sizes accommodated by the switching transistor array 12. The power-supply circuit P101 differs from the power-supply platform IC 3 in that it does not include a circuit (control circuit 16) for controlling the size of the switching transistor or other parameters. This greatly reduces the circuit scale of the system as a whole, as compared with the structure in which a plurality of power-supply circuits are provided in the IC and only appropriate power-supply circuits are connected to the device.

One of the parameters that is difficult to simulate is the effect of higher harmonic waves on environment. The development assisting system 1 according to the present embodiment can avoid such a problem by enabling evaluation/assessment of the parameters of the power-supply circuit P1 with the electronic circuit IC 2 actually connected to the power-supply platform IC 3.

More specifically, when turning ON/OFF the switching transistors that are installed to supply power, switching noise is generated by the parasitic capacitance and the external element. If feedthrough current is generated when turning ON/OFF the switching transistors, feedthrough current noise is generated.

When noise is generated in the product circuit (circuit 101), the higher harmonic component of the noise becomes a higher harmonic wave noise, which may affect other devices by being transmitted through the power supply or GND line and cause malfunction in these devices. Further, when power is large, the higher harmonic waves may produce electromagnetic waves that have adverse effects on the human body.

However, whether or not the higher harmonic wave noise is generated, or the level of generated higher harmonic waves is largely dependent on the external element, and as such it is extremely difficult to assess and evaluate these variables in advance by simulation.

The problem of higher harmonic waves on environment may thus occur if assessment/evaluation were made by simulation.

With the development assisting system 1 according to the present embodiment, such environmental problem can be avoided since it enables the parameters (size of the switching transistor in the present embodiment) of the power-supply circuit P1 to be evaluated or assessed with the electronic circuit IC 2 actually connected to the power-supply platform IC 3.

As described above, the development assisting system 1 according to the present embodiment enables extraction of an optimum size for the switching transistors, using a designated integrated circuit that includes: a plurality of switching transistors that drives the necessary power for the device serving as a load in the power-supply semiconductor integrated circuit; and the control circuit 16 provided as a logic circuit for selectively controlling the switching transistors. This can be performed without time-consuming and skillful procedures, such as the extraction of a load model for the load device, or the simulation using the extracted load model.

More specifically, the power-supply platform IC 3 selectively varies the size of the switching transistors, and thereby enables evaluation and optimization of the most efficient and least noise-susceptible conditions, using the actual device.

For example, in the structure shown in FIG. 3, the selector circuit 22 decides how many switching transistors are to be operated simultaneously, and only the switching transistors 21 selected by the switching signal sent from the switching control circuit 13 are operated to supply power to the electronic circuit IC 2 (load device).

The optimum size of the switching transistors is decided by repeating this procedure several times, and the value set for the select signal is used as the optimum target value for the design of the load device.

Since evaluation is made on the actual device and actual external elements, the power-supply ic 103 excels in conversion efficiency and produces less noise.

Further, the development assisting system 1 according to the present embodiment allows a user to extract the optimum size of the switching transistors, and provides an environment in which the user can vary and evaluate the applied voltage to the load device and obtain optimum operating conditions for the load device. This is performed with the use of a designated integrated circuit that includes: a plurality of selectable switching transistors for driving the necessary power for the load device serving as a load in the power-supply semiconductor integrated circuit; a reference circuit, which, in addition to the logic circuits, produces a reference voltage used for the selection; the switching control circuit 13, provided as a logic circuit, for detecting an error in the output voltage to the load device using the reference voltage, and sending a switching control signal to the switching transistor so as to bring the output voltage to the target voltage; and the control circuit 16, provided as a logic circuit, equipped with means for selecting an arbitrary target voltage from an external source. This can be performed without time-consuming and skillful procedures, such as the extraction of a load model for the load device, or the simulation using the extracted load model.

Second Embodiment

The foregoing First Embodiment described the case where all of the switching transistors in the power-supply circuit P1 are equivalent to one another (no switching transistors in the power-supply circuit P1 are turned ON/OFF simultaneously), as in the case where the power-supply circuit P1 is of a chopper type.

The present embodiment describes a development assisting system 1a that is used for a structure in which the switching transistors in the power-supply circuit are turned ON/OFF at different timings, for example, as in the case where the power-supply circuit is a switching power supply of a synchronous rectification type or a charge-pump type.

Figure 8:
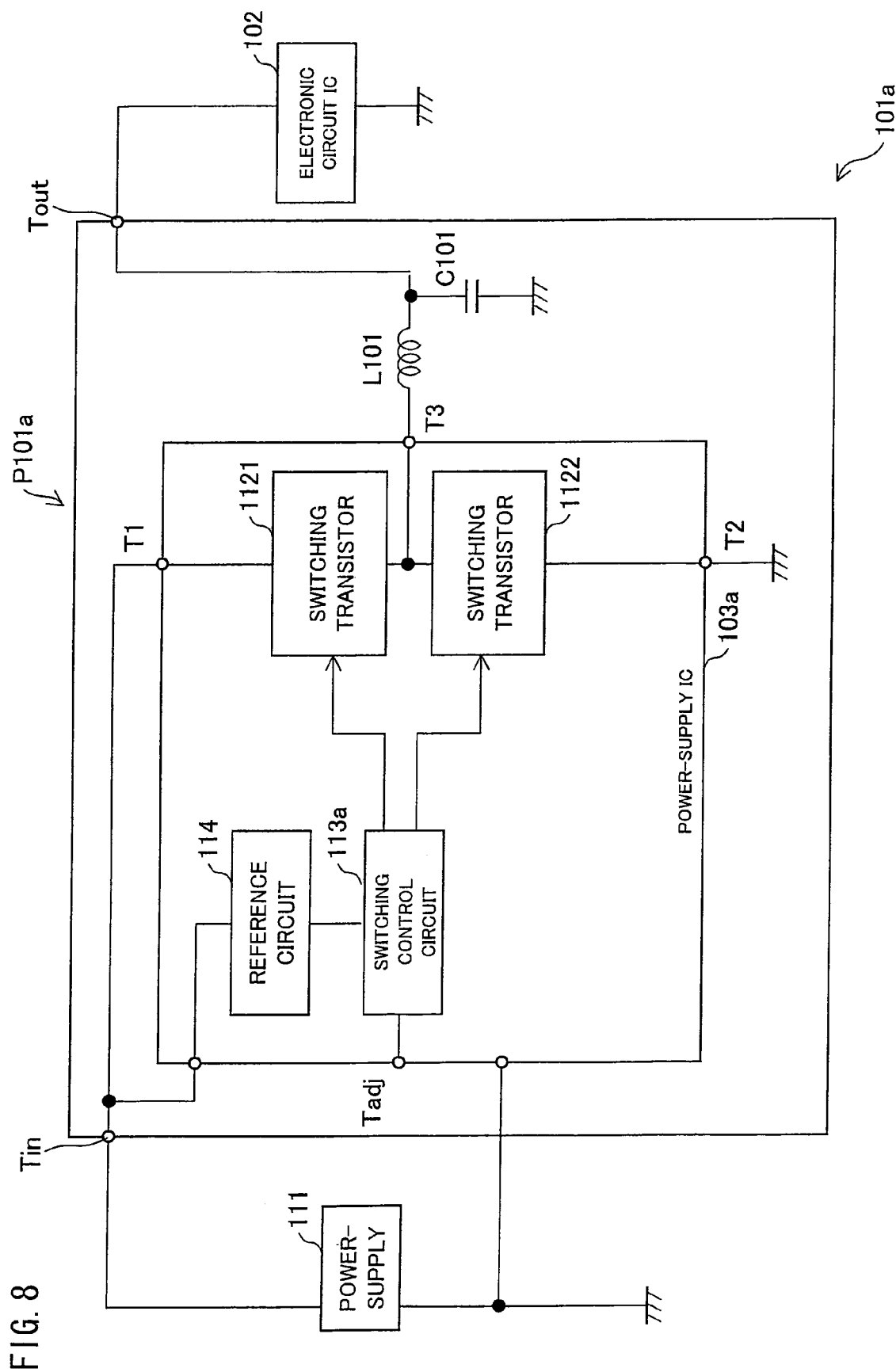
FIG. 8 is a block diagram illustrating a main structure of (i) a power-supply circuit provided as a switching power-supply of a synchronous rectification type, and (ii) an electronic circuit IC that receives power from the power-supply circuit, according to another embodiment of the present invention.

In the following, description will be given through the case where the power-supply circuit is a switching power supply of a synchronous rectification type. In the present embodiment, as shown in FIG. 8, a circuit 101a (product) includes a power-supply circuit P101a, which is realized by a switching power supply of a synchronous rectification type.

The power-supply circuit P101a includes a power-supply ic 103a provided with two switching transistors 1121 and 1122 that are serially connected to each other between a terminal T1, which is connected to a power supply 111, and a terminal T2, which is grounded.

The junction of the switching transistors 1121 and 1122 is connected to a terminal T3, which is connected to an output terminal Tout of the power-supply circuit P101a via a coil L101. The output terminal Tout is grounded via a capacitor C101. An electronic circuit IC 102, provided as a load, is connected between the output terminal Tout and ground level. In the present embodiment, the coil L101 and the capacitor C101 serve as external elements 104a.

The output voltage Vout of the output terminal Tout is applied, via a terminal Tadj, to a switching control circuit 113a provided in the power-supply ic 103a. The switching control circuit 113a operates based on the reference voltage supplied from a reference circuit 114 provided in the power supply 103a, and individually controls ON/OFF of the switching transistors 1121 and 1122.

More specifically, the switching control circuit 113a repeatedly turns ON/OFF the switching transistor 1121, connected to the power supply 111, so as to store energy in the coil L101 while the switching transistor 1121 is ON (charge operation). When a predetermined delay time has elapsed after the switching transistor 1121 has been turned OFF, the switching control circuit 113a turns ON the switching transistor 1122. As a result, current flows into the coil L101 via grounded terminal T2 and the switching transistor 1122, enabling power to be supplied to the electronic circuit IC 102, despite that the output terminal Tout of the power-supply circuit P101a is disconnected from the power supply 111 (discharge operation).

When the ON period of the switching transistor 1122 has elapsed, the switching control circuit 113a turns OFF the switching transistor 1122, and after a predetermined delay time, turns ON the switching transistor 1121. Here, the switching control circuit 113a controls the duty ratio of the switching transistor 1121 according to the output voltage Vout applied via the terminal Tadj. This is performed by controlling at least one of the ON periods of the switching transistors 1121 and 1122, for example. Note that, for convenience of explanation, FIG. 8 does not show application of the output voltage Vout to the terminal Tadj.

More specifically, when the output voltage Vout is expected to exceed the target value Vc, the switching control circuit 113a decreases the duty ratio, and increases it when the output voltage Vout is expected to fall below the target value Vc. This enables the power-supply circuit P101a to supply a constant voltage Vc to the electronic circuit IC 102, irrespective of load fluctuations in the electronic circuit IC 102, or fluctuations of input voltage V1.

In a common switching power supply, the GND terminal and coil are connected to each other with a diode D1, instead of the switching transistor 1122, so as to form the loop for the discharge operation. However, in this case, a large forward voltage is generated in the diode as the current flows through it, with the result that a large power loss is incurred.

In contrast, in the switching power supply of a synchronous rectification type, the switching transistor 1122 is turned ON during the discharge operation to form the loop. The voltage drop is therefore smaller (less than about ¼) and the power loss is small.

It should be noted, however, that in the switching power supply of a synchronous rectification type, the switching transistor 1211 and the switching transistor 1122 are serially connected to each other between the input terminal and GND terminal. As such, the input terminal and GND terminal will be shorted if these switching transistors were turned ON simultaneously, with the result that a large power loss is incurred. It is therefore required to set a delay time, i.e., simultaneous OFF periods of the switching transistors 1121 and 1122, taking into account the rise time and fall time of these two switching transistors.

Here, the size of the switching transistors 1121 and 1122, and the delay time, from turning OFF of one of the switching transistors to turning ON of the other switching transistor, have been set to suitable values by the assessment/evaluation that are performed with the power-supply platform IC 3a of the present embodiment connected to the electronic circuit IC 2.

Figure 9:
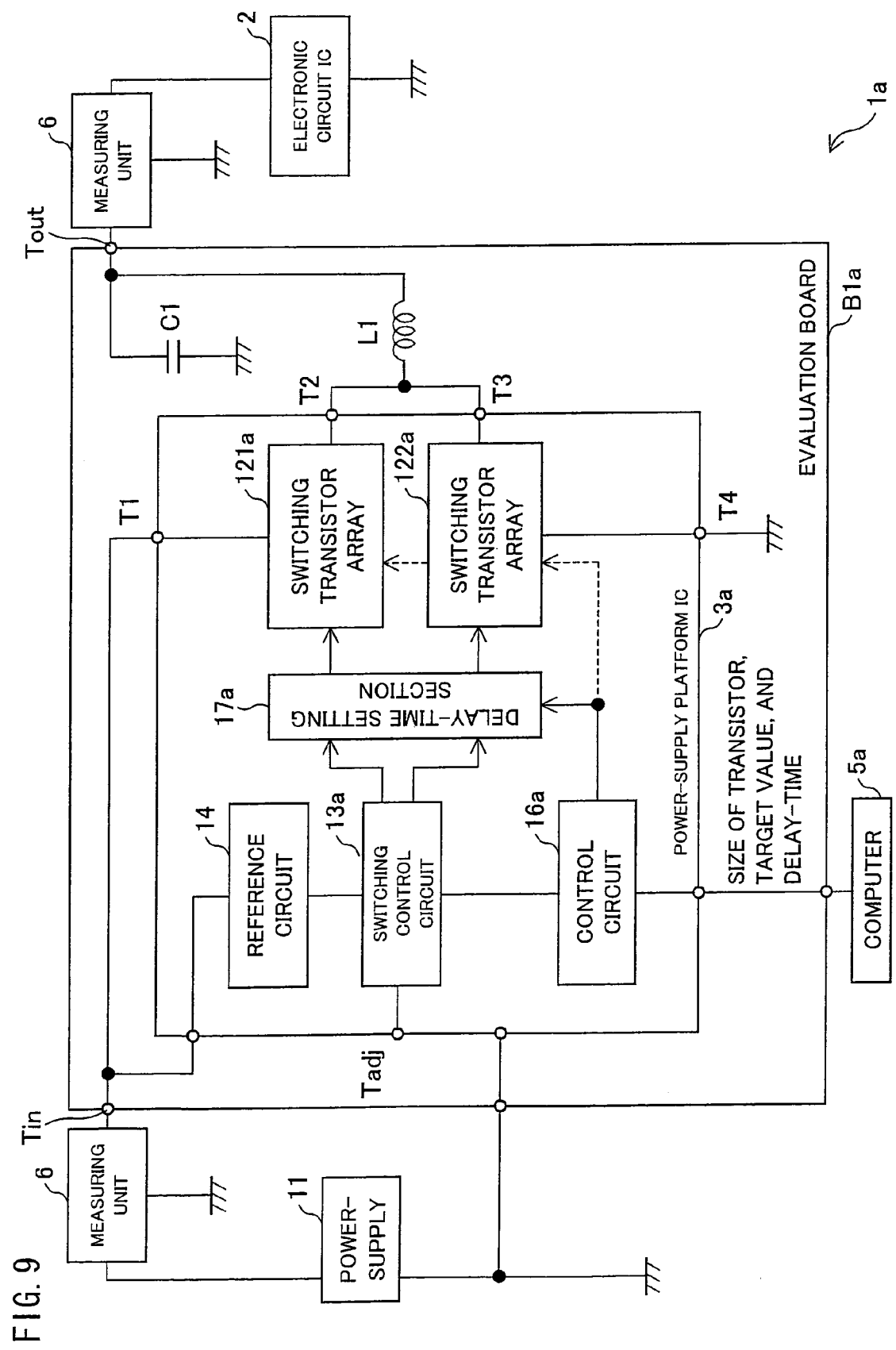
FIG. 9 is a block diagram illustrating a main structure of a development assisting system that is used to decide a parameter of the power-supply circuit.

The development assisting system 1a of the present embodiment have substantially the same structure as the development assisting system 1 shown in FIG. 1. In the development assisting system 1a, the power-supply platform IC 3a is provided instead of the power-supply platform IC 3, as shown in FIG. 9.

According to an external command, the power-supply platform IC 3a can set not only the size of each switching transistor but also the delay time for the ON/OFF control of the switching transistors. Further, as in the power-supply platform IC 3 shown in FIG. 1, the power-supply platform IC 3a according to the present embodiment can also set the target value Vc of output voltage according to an external command.

Specifically, the power-supply platform IC 3a according to the present embodiment includes a switching transistor array 121a that has a greater number of switching transistors than the power-supply circuit P101a. In the example shown in FIG. 9, the power-supply platform IC 3a includes two switching transistor arrays 121a and 122a, as in the power-supply circuit P101α. The switching transistor arrays 121a and 122a have the same structure as the switching transistor array 12 shown in FIG. 1.

The terminals of the switching transistor array 121a are connected to the terminal T1 and terminal T2 of the power-supply platform IC 3a, respectively. The terminals of the switching transistor array 122a are connected to the terminal T3 and terminal T4 of the power-supply platform IC 3a, respectively.

Further, the power-supply platform IC 3a includes a control circuit 16a, substantially the same as the control circuit 16 shown in FIG. 1. The control circuit 16a differs from the control circuit 16 in that it does not specify the size of the switching transistors to one switching transistor array but can specify the size of the switching transistors to the switching transistor arrays 121a and 122a. In FIG. 9, the flow of information from the control circuit 16a to the switching transistor arrays 121a and 122a is indicated by broken line.

The power-supply platform IC 3a further includes a switching control circuit 13a and a reference circuit 14, substantially the same as the switching control circuit 113a and the reference circuit 114, respectively, shown in FIG. 8.

As with the switching control circuit 13 and the reference circuit 14 shown in FIG. 1, the switching control circuit 13a and the reference circuit 14 can vary the target value Vc of output voltage according to the instructions from the computer 5a. Further, in the present embodiment, a delay time setting section 17a is provided between the switching control circuit 13a and the switching transistor arrays 121a and 122a. This enables the delay time, from the point where the switching transistors in one of the switching transistor arrays 121a and 122a being turned OFF and to the point where the switching transistors in the other switching transistor array 121a or 122a being turned ON, to be varied according to an external command. The control circuit 16a is then able to output a delay time setting signal, indicative of the delay time as specified by the computer 5a, to the delay time setting section 17a.

In an evaluation board B1a according to the present embodiment, the terminals T2 and T3 of the power-supply platform IC 3a are shorted, and the junction of the terminals T2 and T3 is connected to the output terminal Tout via the coil L1. The output terminal Tout is grounded via the capacitor C1, and the electronic circuit IC 2 serving as a load. Further, as in the power-supply circuit P101a shown in FIG. 8, the voltage Vout of the output terminal Tout is applied to the switching control circuit 13a via the terminal Tadj of the power-supply platform IC 3a. The terminal T1 of the power-supply platform IC 3a is connected to the power supply 11. The terminal T4 is grounded.

Figure 10:
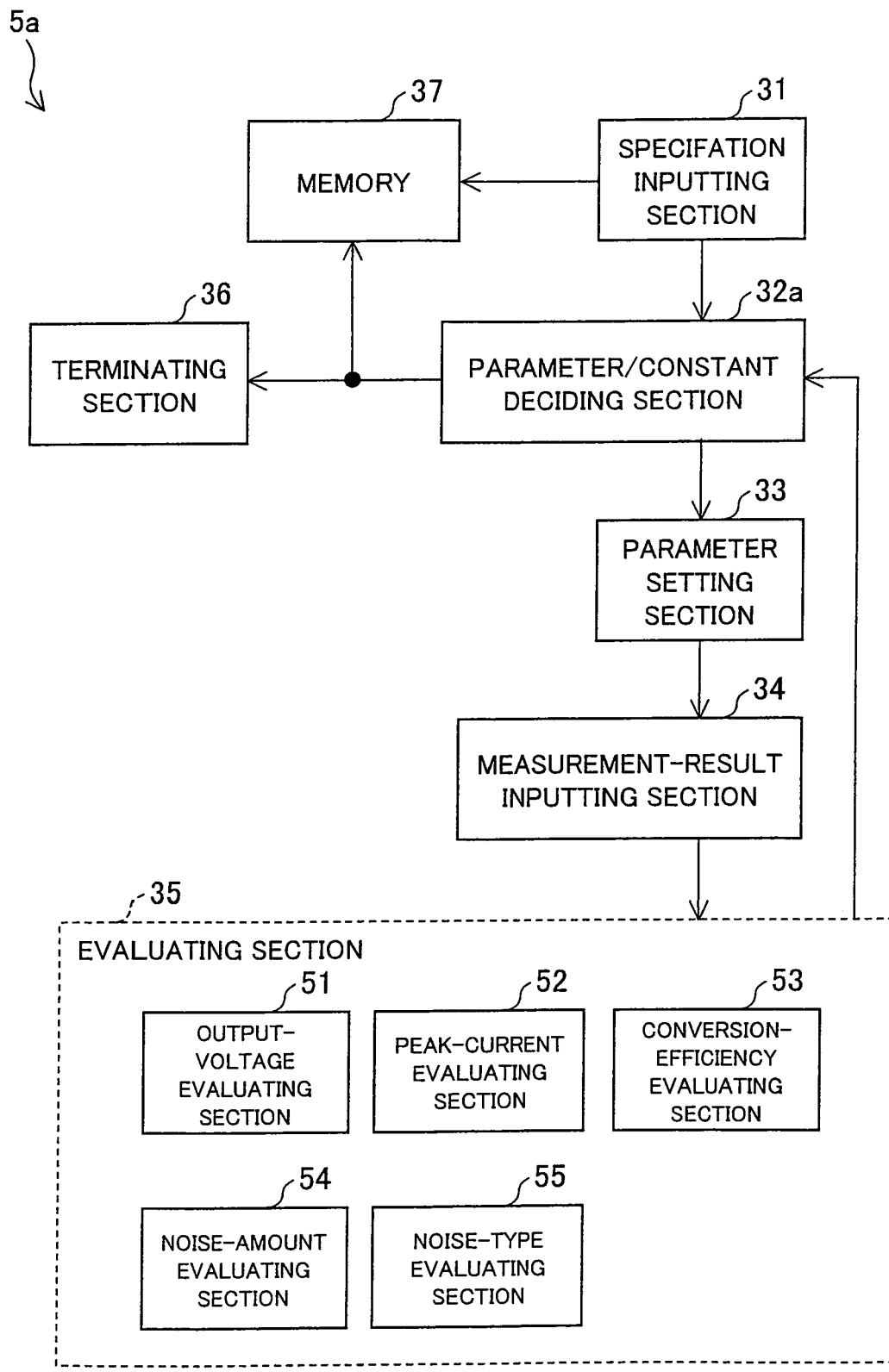
FIG. 10 is a block diagram illustrating a main structure of a computer used for the development assisting system.

The computer 5a according to the present embodiment have substantially the same structure as the computer 5 shown in FIG. 4. However, as shown in FIG. 10, the evaluating section 35 additionally includes a noise type evaluating section 55 for determining a type of noise superimposed on the output voltage Vout. A parameter/constant deciding section 32a according to the present embodiment can decide parameters, including the delay time, by also referring to the result of evaluation in the noise type evaluating section 55. The parameter setting section 33 according to the present embodiment is then able to inform the delay time, via the control circuit 16a, to the delay time setting section 17a of the power-supply platform IC 3a.

More specifically, the noise type evaluating section 55 according to the present embodiment can determine whether the noise superimposed on the output voltage Vout is due to (1) the control signal to the switching transistors, (2) turning ON of the primary switching transistors (switching transistors making up the switching transistor array 121a disposed between the power supply 11 and the coil L1), or (3) turning OFF of the primary transistors. Here, the noise type evaluating section 55 may automatically determine a noise type based on the waveform of the output voltage Vout, as will be described later. However, in the present embodiment, the measurement result input section 34 requests for entry of a noise type, for example, by displaying a message to the user, and the noise type evaluating section 55 determines a noise type upon entry.

As with the parameter/constant deciding section 32 shown in FIG. 4, the parameter/constant deciding section 32a operates to decide parameters, including the size of the switching transistors. However, the parameter/constant deciding section 32a differs from the parameter/constant deciding section 32 in that it can set delay time, and can also decide the size of the switching transistors according to the evaluation performed by the noise type evaluating section 55.

Specifically, when it is decided by the noise type evaluating section 55 that the noise is due to the control signal for the switching transistors, and by the noise-amount evaluating section 54 that the noise amount exceeds the acceptable value of the specification, the parameter/constant deciding section 32a varies the size of the switching transistors making up the switching transistor array 121a, and the size of the switching transistors making up the switching transistor array 122a, as with the parameter setting section 33 of the First Embodiment.

Further, the parameter/constant deciding section 32a extends the delay time when it is decided by the noise type evaluating section 55 that the noise is due to turning ON of the primary transistors, and that the noise amount exceeds the acceptable value of the specification.

Further, the parameter/constant deciding section 32a shortens the delay time when it is decided by the noise type evaluating section 55 that the noise is due to turning OFF of the primary switching transistors, and that the noise amount exceeds the acceptable value of the specification.

Figure 11:
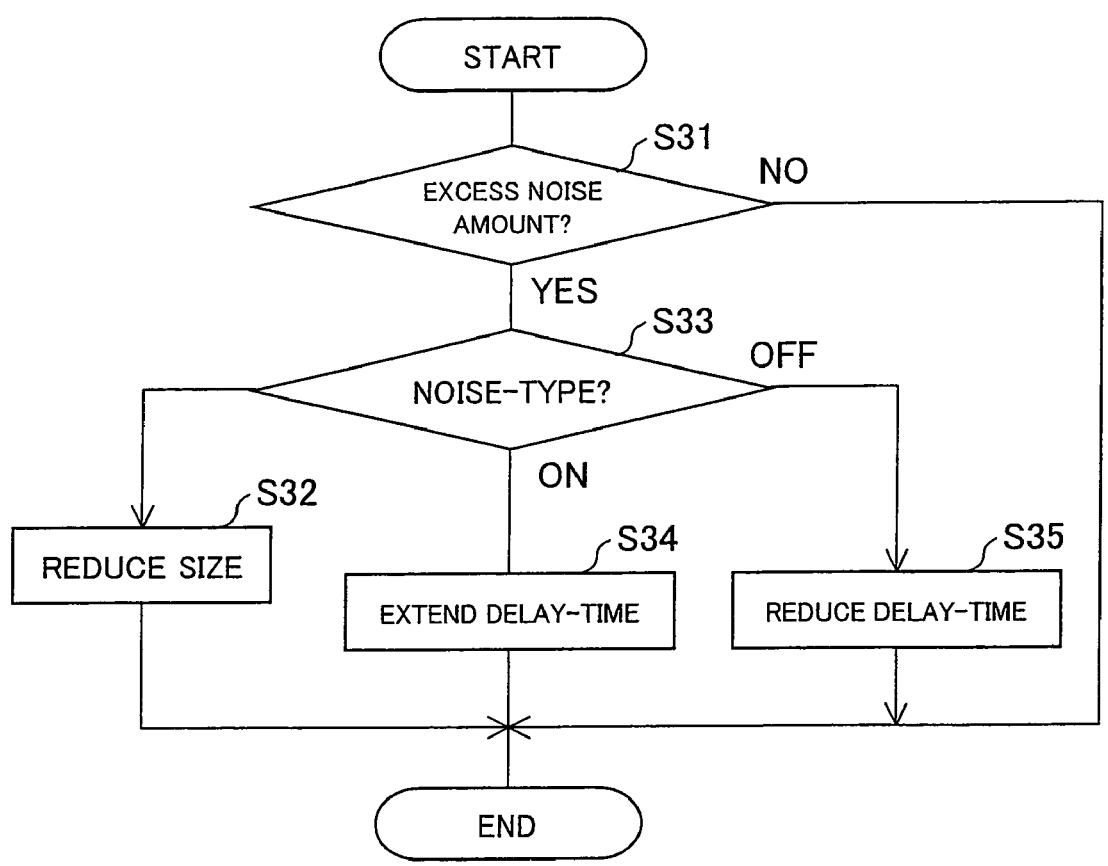
FIG. 11 is a flow chart showing operations of the development assisting system, when the parameter is redetermined by prioritizing the noise-amount.

According to the foregoing configuration, procedures of S33 and S34 shown in FIG. 11 are performed in addition to S31 and S32 shown in FIG. 7. If it is decided in S31 that the amount of noise is large, the parameter/constant deciding section 32a determines the type of noise in S33. If the noise is due to the control signal ("control signal" in S33), the parameter/constant deciding section 32a in S32 reduces the size of the switching transistors in the both switching transistor arrays, and finishes the resetting process for the noise-related parameter.

On the other hand, if it is decided in S33 that the noise is due to turning ON of the primary switching transistors ("ON" in S33), the parameter/constant deciding section 32a in S34 extends the delay time, and finishes the resetting process for the noise-related parameter. If it is decided in S33 that the noise is due to turning OFF of the primary switching transistors ("OFF" in S33), the parameter/constant deciding section 32a in S35 shortens the delay time, and finishes the resetting process for the noise-related parameter.

Here, if the delay time is too short, some of the switching transistors in the both switching transistor arrays will be turned ON simultaneously, with the result that feedthrough current is flown. The feedthrough current not only causes the noise to be superimposed on the output voltage Vout but also significantly reduces the power consumption of the power-supply circuit P1a (P101a).

On the other hand, if the delay time is too long, the simultaneous OFF periods of the both switching transistor arrays are increased. These OFF periods define an inactive period in which power is not supplied to the electronic circuit IC 2 serving as a load. A long inactive period increases the noise due to turning OFF of the primary switching transistors. In the worst case, the load current may not be sufficiently supplied to the electronic circuit IC 2 (load) when the switching frequency of the power-supply circuit P1a is increased.

The rise time and fall time of each switching transistor are decided not only by the capacitance (gate capacitance) of the control signal terminal of the switching transistor, or the driving capability of the preceding-stage switching transistor, but also by the AC-like load current characteristics of the electronic circuit IC 2 (load), or the influence of the external elements 4. As such, it is extremely difficult to decide optimum values for the rise time and fall time of the switching transistors. Therefore, if the delay time were to be decided by simulation, a double margin of error would be required for the inaccuracy in the specifications and the inaccuracy in the result of the simplified model simulation, as described above. This makes it difficult to set an optimum value for the delay time.

As a countermeasure, in the development assisting system 1a according to the present embodiment, the parameter/constant deciding section 32a extends the delay time when there is a large amount of noise due to turning ON of the primary switching transistors. This suppresses the chance of two switching transistors from being turned ON simultaneously. As a result, the amount of noise due to turning ON of the primary switching transistors can be reduced. The power consumption of the power-supply circuit P1a (P101a) can be reduced as well.

Further, the parameter/constant deciding section 32a shortens the delay time when there is a large amount of noise due to turning OFF of the primary switching transistors. This suppresses the problem associated with a long delay time.

As described above, the development assisting system 1a according to the present embodiment allows for assessment/evaluation of a suitable delay time for the electronic circuit IC 2, by actually connecting the electronic circuit IC 2 to the power-supply platform IC 3a. In this way, a suitable delay time can be decided for the electronic circuit IC 2, without providing a large margin of error.

The foregoing described the structure in which the noise type evaluating section 55 determines a noise type according to the user input. However, the present invention is not just limited to this example. For example, in the case where the measurement result input section 34 is adapted to receive a waveform of output voltage Vout from the measuring unit 6, the noise type determining section 55 may determine a noise type according to the waveform of output voltage Vout. For example, based on the waveform of output voltage Vout, the noise type evaluating section 55 (1) extracts ON timing and OFF timing of the switching transistors of the switching transistor array 121a, and (2) extracts the waveform of the noise by comparing the waveform of output voltage Vout with a pre-stored ideal waveform. Further, the noise type determining section 55 compares the peak timing of the noise with the ON timing and OFF timing of the switching transistors, and if the difference from the ON timing of the switching transistors is within a predetermined time period, determines that the noise is due to turning ON of the switching transistors. If the difference from the OFF timing is within a predetermined time period, the noise type evaluating section 55 determines that the noise is due to turning OFF of the switching transistors. If neither, the noise is determined to be due to the control signal for the switching transistors.

As described above, the development assisting system 1a according to the present embodiment can be used to extract a suitable size of the switching transistors, and a suitable delay time for preventing the switching transistors from being turned ON simultaneously. This is performed with a designated integrated circuit including: a control circuit 16a, provided as a logic circuit, for selectively controlling, in units of groups, a plurality of switching transistors that drives the necessary power to the devices serving as loads in the power-supply semiconductor integrated circuit; a delay time setting section 17a, provided as a delay circuit, for causing a delay in the switching transistors in units of groups; and a control circuit 16a, provided as a logic circuit, for selectively controlling the delay time. Further, this can be performed without time-consuming and skillful procedures, such as the extraction of a load model for the load device, the extraction of a driver delay-time model based on the parasitic effect of the external element, or the simulation using the extracted model.

That is, a power supply device is provided that can freely vary and assess not only the switching transistor size, which is one parameter that determines the delay time, but also the delay time itself, with the load device actually connected to the power supply device. The power supply device can therefore accommodate large power and can perform very efficiently.

Further, the development assisting system 1a according to the present embodiment can be used to extract a suitable size of the switching transistors, and provide an environment in which a user can vary and evaluate the applied voltage to the load device and therefore obtain optimum operating conditions of the load device. This is performed with a designated integrated circuit including: a logic circuit for selectively controlling, in units of groups, a plurality of switching transistors that drives the necessary power to the devices serving as loads in the power-supply semiconductor integrated circuit; a delay circuit for causing a delay in the switching transistors in units of groups; a logic circuit for selectively controlling the delay time; a reference circuit for generating a reference voltage; a switching control circuit 13a, provided as a control circuit, for detecting an error in the output voltage applied to the load device, using the reference voltage, and sending a switching control signal to the switching transistor so as to bring the output voltage to the target voltage; and a control circuit 16a, provided as a logic circuit, equipped with means for selecting an arbitrary target voltage from an external source. This can be performed without time-consuming and skillful procedures, such as the extraction of a load model for the load device, or the simulation using the extracted load model.

Third Embodiment

The foregoing First and Second Embodiments described the case where the power-supply circuit is realized by a switching power-supply. The present embodiment will describe the case where the power-supply circuit is realized by a linear-regulator.

Figure 12:
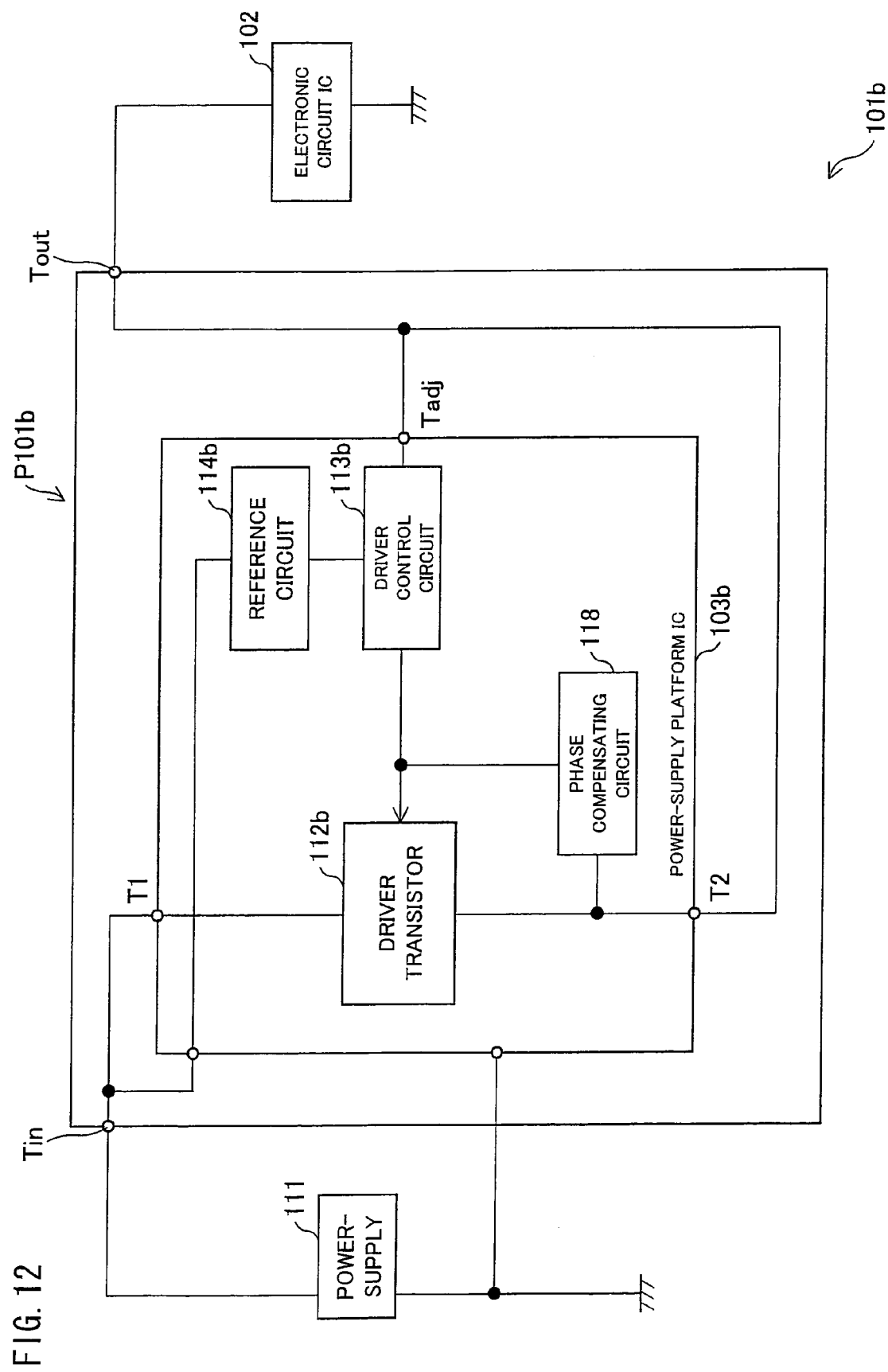
FIG. 12 is a block diagram illustrating a main structure of (i) a power-supply circuit provided as a linear regulator, and (ii) an electronic circuit IC that receives power from the power-supply circuit, according to yet another embodiment of the present invention.

In the present embodiment, as illustrated in FIG. 12, a circuit 101b (finished product) includes a power-supply circuit P101b as a linear-regulator. Specifically, in the power-supply IC 103b of the present embodiment, a driver transistor 112b is provided between (i) a terminal T1 to which an input voltage Vin is applied from a power-supply 111 and (ii) a terminal T2 that is connected, via an output terminal Tout of the power-supply circuit P101b, to an electronic circuit IC 102. The power-supply IC 103b includes (i) a driver control circuit 113b provides a control terminal (e.g., gate terminal) of the driver transistor 112b with a control signal of a level corresponding to an output voltage Vout applied via a terminal Tadj of the power-supply IC 103b, and (ii) a reference circuit 114b that supplies a reference voltage to the driver control circuit 113b. Further, a phase compensation circuit 118 is provided between (i) an output terminal (terminal connected to the terminal T2) of the driver transistor 112b and (ii) a control terminal. The phase compensation circuit 118 compensates a phase lag in an output of the power-supply circuit P101b, so that the gain and phase margin of the control system, from the instant when the output voltage Vout is varied to the instant when the driver transistor 112b is controlled in accordance with the change, can be set to appropriate values.

In this way, the power-supply circuit P101b reduces the voltage Vin, which is supplied by the power-supply 111, to a voltage as required by the electric IC 102, thereby supplying the voltage Vout of a reduced level to the electronic circuit IC 102. Here, the voltage to be reduced is controlled by the drive control circuit 113b in accordance with the output voltage Vout applied to the terminal Tadj. If the output voltage Vout is exceeding the target voltage Vc, then the driver control circuit 113b controls the driver transistor 112b in such a way as to reduce the voltage by a large amount. On the other hand, if the output voltage Vout is below the desired value Vc, then the driver control circuit 113b controls the driver transistor 112b in such a way as to reduce the voltage only by a small amount. In this way, the power-supply circuit 101b can stably supply the voltage Vout to the electronic circuit IC 102 without any problem, even if fluctuation occurs in the input voltage Vin supplied from the power-supply 111 and/or in the load of the electronic circuit IC 102.

Further, the driver control circuit 113b has a soft-start function. With the soft-start function, the impedance of the driver transistor 112b can be controlled to remain at a lower level than in a steady state during a predetermined soft-start period, which is started at the turn ON of the power-supply circuit P101b. In this way, no undesirably large current flows into the electronic circuit IC 102 from the power-supply 11 via the power-supply circuit P101b, when the power-supply is turned on.

The soft-start function refers to a function whereby, at the time of activation of the regulator, the feedthrough current that flows into the load device and/or the smoothing capacitor that are connected to the output terminal is reduced to reduce a burden on the power-supply side connected to the input terminal.

This is commonly performed by increasing the ON resistance of a driver, and restricting the current at the time of activation. However, if the restriction is too tight, the activation time of the regulator is increased.

An optimum value of restricted current is decided in accordance with (i) an impedance of the power-supply on the input side, (ii) an over-current protection constant, and (iii) load characteristics of the load device at the time of rising. These conditions are necessary for accurate determination of the optimum soft-start.

Note that, (i) the size of driver transistor 112b and (ii) the length of the soft-start period are set at suitable values that have been assessed/evaluated by connecting the power-supply platform IC 3b of the present embodiment to the electronic circuit IC 2.

In order to optimize the soft-start, the power-supply platform IC 3b of the present embodiment reduces the impedance of the driver stepwise, by using the select signal. The time required to vary the impedance for the optimization, and the optimized driver size can be extracted.

Figure 13:
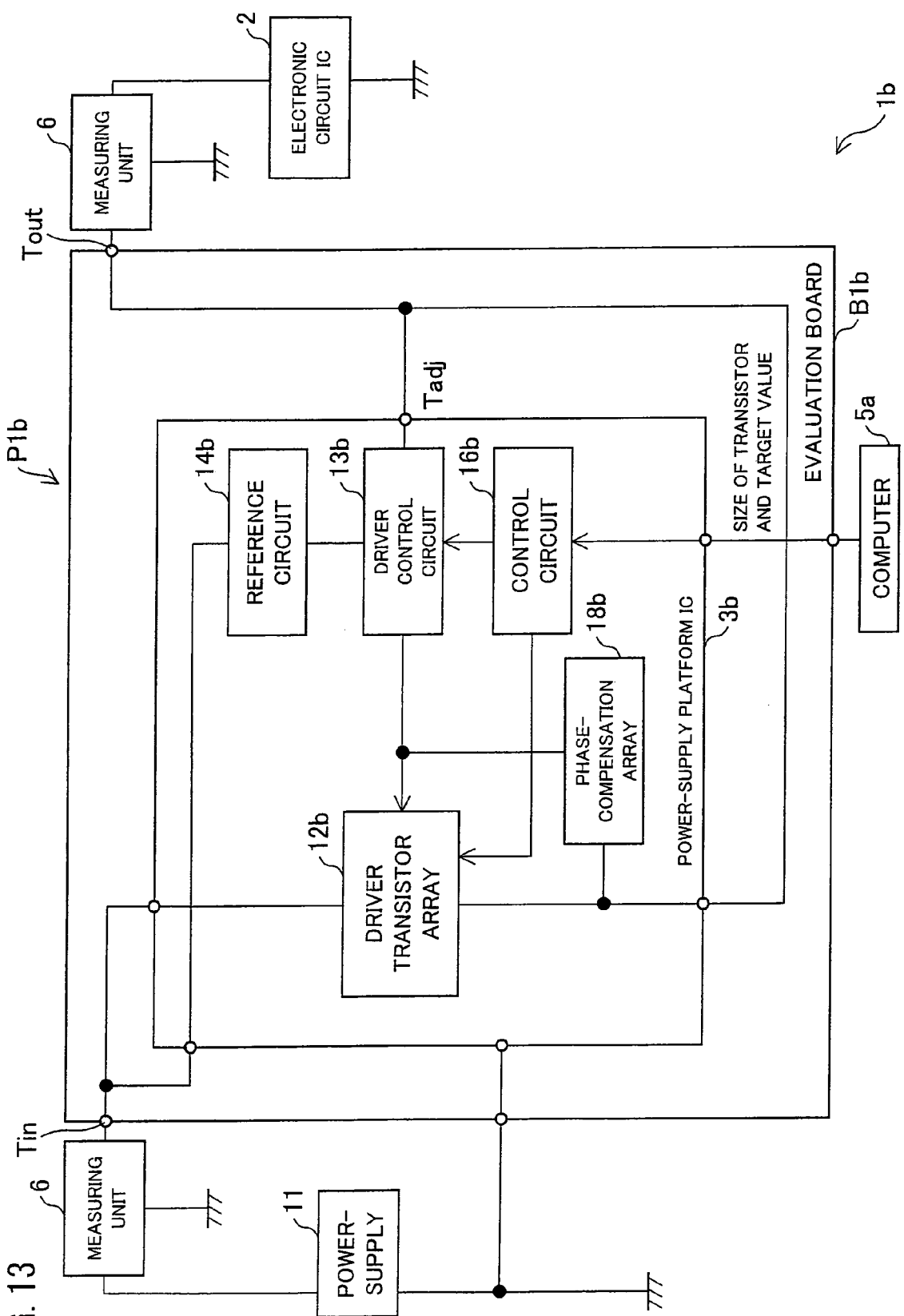
FIG. 13 is a block diagram schematically illustrating a main structure of the development assisting system that is used to decide a parameter of the power-supply circuit.

More specifically, the development assisting system 1b of the present embodiment is arranged in the substantially same manner as the development assisting system 1 illustrated in FIG. 1, except that a power-supply platform IC 3b is provided in place of the power-supply platform IC 3, as illustrated in FIG. 13. With the power-supply platform IC 3b, a power-supply circuit P1b is formed that is similar to the linear regulator shown in FIG. 12.

The power-supply platform IC 3b can set (i) the size of the driver transistor and (ii) the length of the soft-start period, in accordance with external instructions. The power-supply platform IC 3b includes a driver control circuit 13b and a reference circuit 14b, which are the same as the driver control circuit 113b and the reference circuit 114b, respectively, illustrated in FIG. 13. As in the above embodiments, the power-supply platform IC 3b of the present embodiment can change the desired value Vc of the output voltage in accordance with external instructions. Furthermore, as with the switching control circuit and the reference circuit of the above embodiments, the driver control circuit 13b and the reference circuit 14b are arranged such that the output voltage Vc is changed in accordance with external instructions.

Further, the platform IC 3b of the present embodiment includes a driver transistor array 12b between the terminals T1 and T2, in place of the driver transistor 112b illustrated in FIG. 12. The platform IC 3b also includes a phase-compensation array 18b, which is provided in relation to the driver transistor array 12b.

Figure 14:
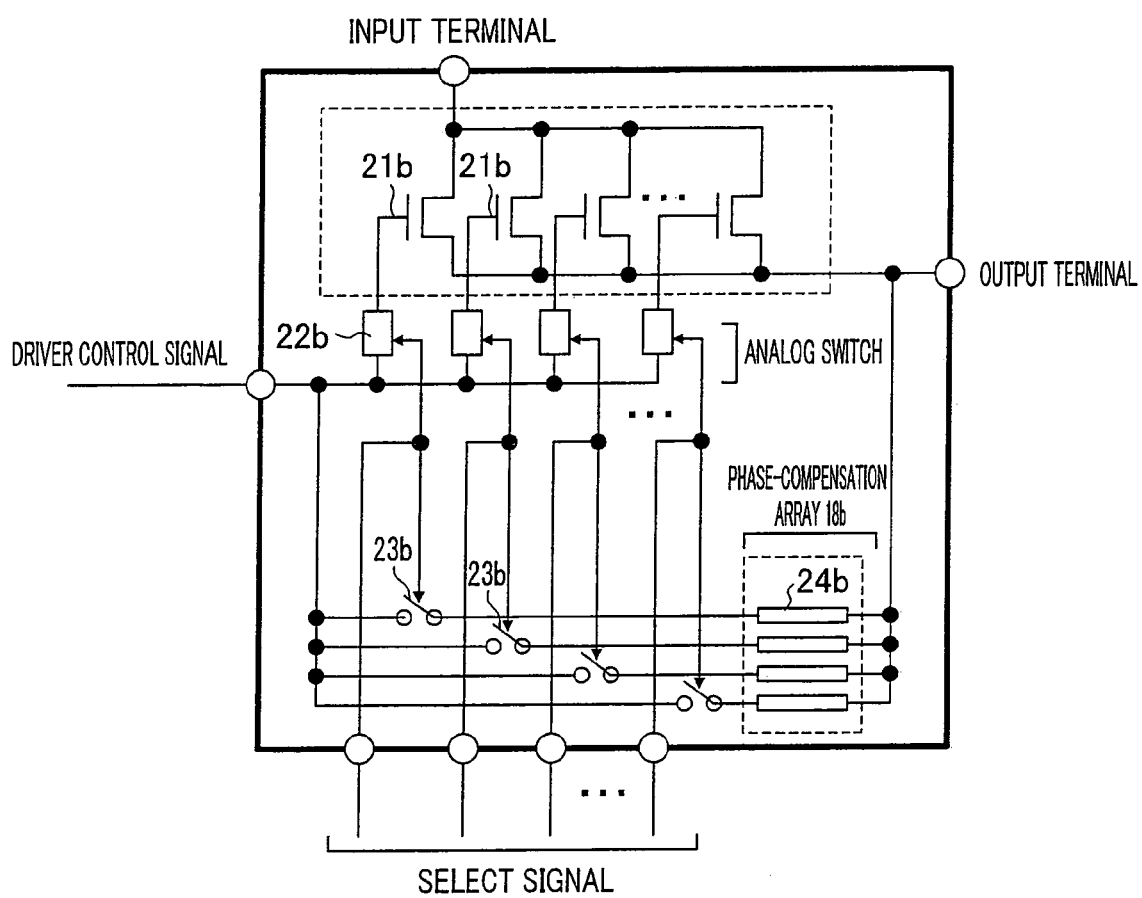
FIG. 14 is a circuit diagram illustrating (i) a driver array and (ii) a phase-compensation array, provided in the power-supply platform IC of the development assisting system.

The driver transistor array 12b includes, as illustrated in FIG. 14, (i) a plurality of driver transistors 21b, which are connected parallel to one another, and (ii) a plurality of analog switches 22b, which select whether or not to transmit a driver control signal, supplied from the driver control circuit 13b, to the control terminals (gate terminals in the figure) of the driver transistors 21b. The analog switches 22b control, in accordance with select signals corresponding thereto, whether or not to transmit the driver control signal to the corresponding control terminals of the driver transistors 21b.

On the other hand, the phase-compensation array 18b includes switches 23b phase-compensation circuits 24b, corresponding to the select signals. The switches 23b and the phase-compensation circuits 24b are connected to each other with mutually corresponding select signals. One end of a series circuit made up of the switch 23b and the phase-compensation circuit 24b is connected to an output terminal (terminal connected to the terminal T2) of the driver transistor array 12b. The other end of the series circuit is connected to the control terminal of the corresponding driver transistor 21b when the corresponding analog switch 22b is ON. Note that, in the example illustrated in the figure, this end of the series circuit is connected to the driver transistor array 12b terminal to which the driver control signal is applied. The phase-compensation constants of the phase-compensation circuits 24b are set such that they can compensate for a phase lag in the output of the power-supply circuit P1b originating from the corresponding driver transistors 21b.

In the above arrangement, when the driver transistor 21b becomes effective by the select signal, then, in response, the corresponding phase-compensation circuit 24b is connected between the output terminal and the control terminal of the driver transistor 21b. Therefore, even if the size of the driver transistor is varied to change the appropriate phase-compensation characteristic, the phase-compensation constant can be changed to accommodate the new characteristic. In this way, the phase lag in the output of the power-supply circuit P1b is compensated, without any problem, regardless of which driver transistor 21b, or which combination of driver transistors 21b, is made effective.

Further, the power-supply platform IC 3b includes a control circuit 16b, which is substantially the same as the control circuit 16 illustrated in FIG. 1. Note that, in the present embodiment, the size of the driver transistor is controlled instead of the size of the switching transistor.

Accordingly, the control circuit 16b can feed the driver transistor array 12b with a select signal that is indicative of whether or not to make the driver transistors 21b effective in accordance with the size specified by the computer 5, instead of outputting the select signal to the switching transistor array 12.

The control circuit 16b of the present embodiment may cause certain numbers of driver transistors 21b to become effective in a steady state. However, the control circuit 16b may also cause the number of the driver transistors 21b that are set effective to increase step by step, until a predetermined soft-start period is elapsed. For example, the control circuit 16b may cause the driver transistors 21b to be effective, one after another, at predetermined time intervals. In this case, the number of driver transistors 21b that are to be effective may be specified by the computer 5 to the control circuit 16b every time the driver transistors 21b are at respective timings when the number is to be increased step by step. In the present embodiment, the computer 5 specifies information of the length of the soft-start period to the control circuit 16b, and the control circuit 16b decides, on the basis of (i) a timing when the power-supply is turned on and (ii) the information, the timings for increasing, step by step, the number of driver transistors 21b that are set effective.

With the above arrangement, the power-supply platform IC 3b can maintain an impedance of the driver transistor array 12b lower during the soft-start period than during the steady state. Furthermore, the power-supply platform IC 3b can change the length of the soft-start period in accordance with an instruction supplied externally.

Further, a computer 5b of the present embodiment has substantially the same structure as the computer 5 illustrated in FIG. 4. However, a parameter/constant deciding section 32b, which is provided in place of the parameter/constant deciding section 32, decides the size of the driver transistor instead of the size of the switching transistor. Further, the parameter/constant deciding section 32b can increase the length of a soft-start period when a peak-current evaluating section 52 evaluates that the input current exceeds a maximum peak current.

In the case where the power-supply circuit (P1b, P101b) is a linear-regulator, a current is supplied to the electronic circuit IC (2, 102) via the driver transistor of the power-supply circuit. Therefore, when the load current increases, it is generally desirable to increase the size of the driver transistor and reduce the resistance of the driver transistor, in proportion to the increase in the load current.

On the other hand, in the electronic circuit IC serving as a load, the current does not always show DC-like behavior, but sometimes varies like an AC. Therefore, the power-supply circuit needs to capable of sufficiently following such change. Note that, when the size of the driver transistor increases, the parasitic capacity of the driver transistor also increases. The parasitic capacity affects the frequency characteristics of the power-supply circuit and degrades the followability of the power-supply circuit.

Accordingly, the input-output characteristics of the electronic circuit IC need to be grasped in order to appropriately set the size of the driver transistor. However, it is difficult, as described above, to accurately calculate the input-output characteristics of the electronic circuit IC by extracting a load model of the electronic circuit IC and conducting a simulation. Therefore, as in the case of the switching power-supply, if the size of the driver transistor were to be decided by a simulation, a double margin of error would be required for the inaccuracy in the specifications and the inaccuracy in the result of the simplified model simulation, as described above. This makes it difficult to set an optimum value for the size of the driver transistor.

In view of this drawback, the parameter/constant deciding section 32b of the present embodiment (i) reduces the size of the driver transistor if it is evaluated that the actual conversion efficiency exceeds the conversion efficiency inputted as the specification and (ii) increases the size of the driver transistor if it is evaluated that the actual conversion efficiency is below the conversion efficiency inputted as the specification. Furthermore, the parameter/constant deciding section 32b reduces the size of the driver transistor (i) if it is evaluated that the actual conversion efficiency neither exceeds nor falls below the conversion efficiency inputted as the specification and (ii) if the output-voltage evaluating section 51 determines that the measured output voltage Vout has reached a desired value Vc. Further, the parameter/constant deciding section 32b increases the size of the driver transistor (i) if the actual conversion efficiency is evaluated to neither exceeds nor falls below the conversion efficiency inputted as the specification and (ii) if the output-voltage evaluating section 51 determines that the measured output voltage Vout has not reached a desired value Vc.

Moreover, the parameter/constant deciding section 32b of the present embodiment varies the length of the soft-start period in accordance with the peak current.

As described above, with the development assisting system 1b of the present embodiment, it is possible to access/evaluate the size of the driver transistor and the length of the soft-start period that are suitable for the product, with the electronic circuit IC 2 is actually connected to the power-supply platform IC 3b. This enables these parameters to be decided without providing a large margin of error.

As described above, the development assisting system 1b of the present embodiment can extract an optimum size of the transistor with the use of a designated integrated circuit that includes: a plurality of driver transistors for an amplifier that drives power needed by the load device in the power-supply semiconductor integrated circuit; a logic circuit for selectively controlling the driver transistors; and a phase-compensation constant selecting circuit for changing a constant in accordance with information of selected driver transistor(s). This can be performed without performing time-consuming and skillful procedures, such as the extraction of a load model for the load device, or the simulation using the extracted load model, or without giving any technical consideration to the compensating procedure for the phase margin that varies as a result of varying the size of the driver transistors.

Furthermore, the development assisting system 1b of the present embodiment includes a designated integrated circuit that includes: a delay circuit having a plurality of time parameters for changing, step by step, the select signal over the course of a certain period of time when the driver transistors are selectively controlled and (ii) a logic circuit that can change time-component parameters of the delay circuit. With the development assisting system 1b, it becomes possible to (i) reduce an inrush current to the load device, which inrush current is generated when the power-supply semiconductor integrated circuit is activated, and therefore (ii) reduce a stress on the power-supply connected to the input terminal.

Note that, the data (parameter) extracted by the above operations is digital information. This provides an engineer (vendor) of the power-supply device with a precise feedback, and therefore enables a user to develop a power-supply device at low risk as he/she desires. Details thereof will be described below.

Fourth Embodiment

The foregoing described the case where the power-supply circuit (P1-P1b, P101-P101b) of one line (one channel) is provided. On the other hand, in the present embodiment, a development assisting system will be described that (i) includes a plurality of switching power-supply circuits and (ii) can assess the timing at which a switching transistor is turned off, with the switching power-supply circuits connected to an actual electronic circuit IC. Note that the development assisting system 1c according to the present embodiment is applicable to both the First and Second Embodiments, as long as the power-supply circuit is a switching power-supply. The following basically describes the case where the development assisting system 1c is applied to the First Embodiment.

Figure 15:
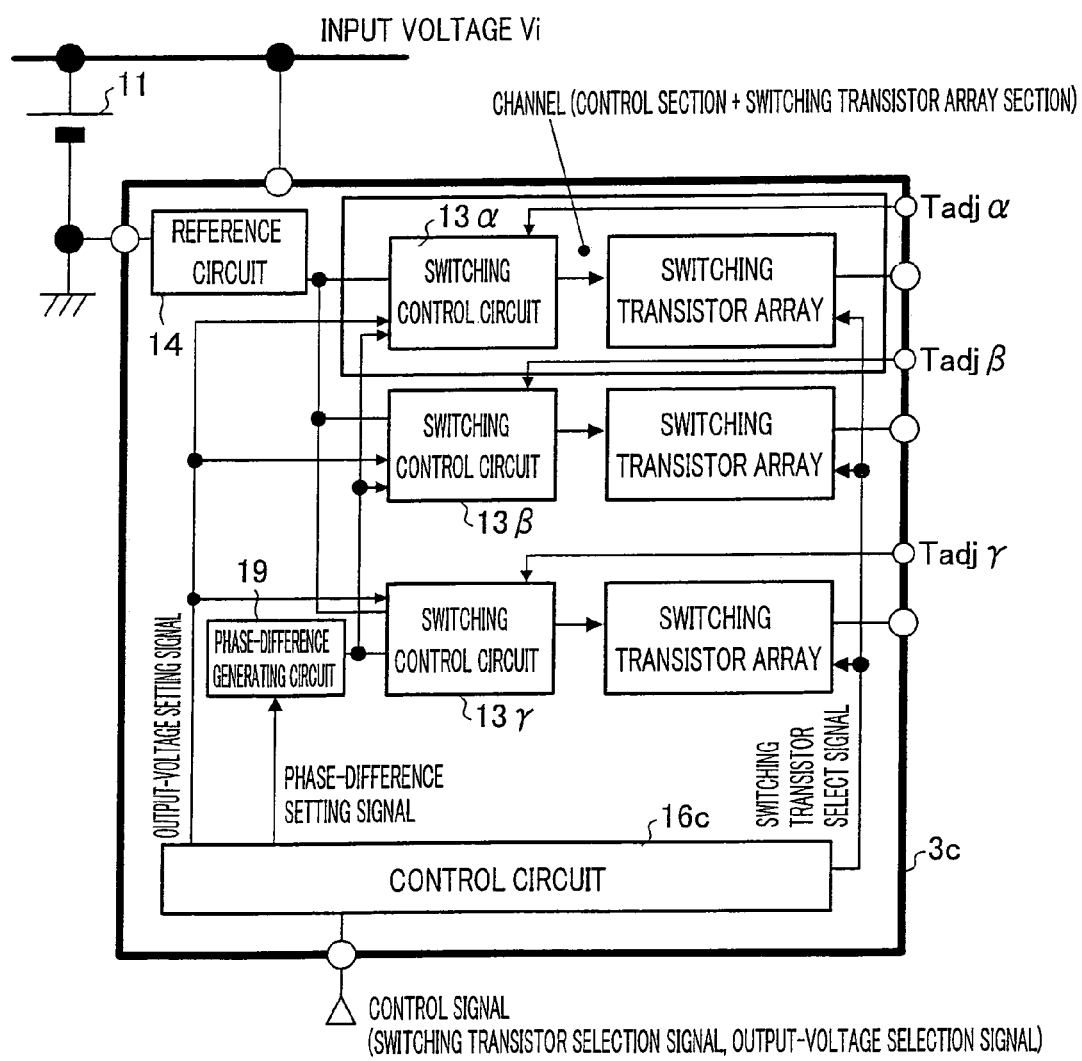
FIG. 15 illustrates is a block diagram illustrating a main structure of a power-supply platform IC according to one embodiment of the present invention.

The development assisting system 1c of the present embodiment is provided with a power-supply platform IC 3c illustrated in FIG. 15, in place of the power-supply platform IC 3 illustrated in FIG. 1. In the power-supply platform IC 3c, (i) switching transistor arrays 12 and (ii) switching control circuits 13 are provided for the respective channels in order to connect a plurality of electronic circuit ICs. The switching transistor arrays 12 and the switching control circuits 13 of the respective channels operate independently between channels.

The figure illustrates an exemplary case where the switching transistor arrays 12 and switching control circuits 13 are provided for three channels. In view of convenience of description, where it is necessary to differentiate members of the respective channels, the reference numeral will be appended with a Greek character to indicate a channel (e.g., electronic circuit IC 2α for an electronic circuit IC 2 of channel α).

The power-supply 11 (111) is shared between power-supply circuits P1α to P1γ (P101α to P101γ) in the present embodiment, and (i) a power-supply terminal to which a power-supply voltage V1 is applied from the power-supply 11 (111) and (ii) a GND terminal that is grounded are shared between the channels in the power-supply platform IC 3 (power-supply IC 103). Further, in the power-supply platform IC 3c of the present embodiment, a reference circuit 14 is shared between the channels, and the reference circuit 14 supplies a reference voltage to the respective switching control circuits 13a to 13γ. In contrast, an external element 14 and an electronic circuit IC 2 are provided for each channel, and are connected to a corresponding switching transistor array 12 and a corresponding switching control circuit 13. Furthermore, a measurement unit 6 is provided for each channel. These members are connected in the same manner as illustrated in the Figures of an applied embodiment (e.g., FIG. 1), except that the members are provided for the respective channels. Thus, illustration and description thereof are omitted.

Further, a control circuit 16c provided in the power-supply platform IC 3c controls, in accordance with an instruction by a computer 5c, the switching transistor arrays 12α to 12γ and the switching control circuits 13α to 13γ, individually, in the present embodiment.

Further, an inter-channel phase-difference generating circuit 19 is provided in the power-supply platform IC 3c of the present embodiment. In accordance with an instruction from the computer 5c, the control circuit 16c instructs the inter-channel phase-difference generating circuit 19 to generate a phase difference between channels. The inter-channel phase-difference generating circuit 19 then instructs, for example, the switching control circuits 13α to 13γ to maintain the phase difference in the OFF timings of the switching transistors of the respective channels.

For example, the inter-channels phase-difference generating circuit 19 may be realized by a common CR delay circuit, or a delay circuit using counter logic. In this case, the control circuit 16c controls (i) a time constant of the CR delay circuit or (ii) a count value of the counter logic, so as to control a delay time generated by the inter-channel phase-difference generating circuit 19. Further, the inter-channels phase-difference generating circuit 19 causes the switching control circuits 13α to 13γ to operate at the delayed timing thus generated.

The computer 5c has a substantially the same structure as of the computer 5 illustrated in FIG. 4, but operations of the respective members indicated by the reference numerals 31 to 35 are performed for each channel. Further, a parameter/constant deciding section 32c is provided in place of the parameter/constant deciding section 32. In the case where a measured noise amount in any channel exceeds the acceptable value of the specification, the parameter/constant deciding section 32c varies, via the control circuit 16c, the phase difference specified to the inter-channels phase-difference generating circuit 19. This operation is performed in place of, or in addition to, the operation of the parameter/constant deciding section of the previous embodiments.

In the case where the system includes switching power-supply circuits of multiple channels as in the present embodiment, there arises a problem of interference between the channels. Specifically, a spike current is generated in the switching power-supply circuits P1α to P1γ of the present embodiment when the switching transistor is switched ON/OFF. As described above, the power-supply terminal and the GND terminal are shared between the switching power-supply circuits P1α to P1γ (P101α to P101γ) in the present embodiment. If the spike current generated in the channels converges on the power-supply terminal and the GND terminal, a voltage-drop occurs in the terminals. In this case, an error may be generated when the power-supply circuits of the respective channels and the electronic circuit IC connected to the power-supply circuits are operated. Moreover, noise may be superimposed on the wiring of these circuits (e.g., power supply line from the power-supply circuit to the electronic circuit IC). Furthermore, there is a possibility that these circuits malfunction.

Further, the spike current causes higher harmonic waves. This affects not only those connected to the power-supply device but also other devices via a power-supply line that generates an input voltage. In the worst case, the devices may malfunction, or the devices may be destroyed.

Further, the switching control circuits (13α to 13γ, 113α to 113γ) of the respective channels turn on/off the switching transistors of the respective channels. The power-supply circuits of the respective channels emit relatively large spike ringing-noise pulses when the switching transistors are off.

The spike ringing-noise pulses are generated due to (i) a drain-source parasitic capacitance of the switching transistor, or a parasitic capacitance of a peripheral device and (ii) resonance of an external coil. The noise pulses affect each other in the multi-channel power-supply such that the noise pulses cancel out each other or are superimposed. In the case where the noise pulses cancel out each other, no problem occurs. On the other hand, in the case where the noise pulses are superimposed, various problems may occur. For example, the superimposition may cause (i) stress on the power-supply (11, 111) connected to the power-supply terminal and/or (ii) fluctuations in the output voltages Voutα to Voutγ of the respective channels.

The effect of such interaction changes depending upon a load-current pattern of the electronic circuit IC (load), or a relationship between the external element and a parasitic capacitance of the switching transistor, and the like. It is therefore difficult, as in the above case of deciding the size of the switching transistor, to accurately confirm the effect of interaction by a simulation and develop a strategy for reducing such effect.

On the contrary, in the development assisting system 1c of the present embodiment, the parameter/constant deciding section 32c of the computer 5c sends instructions for causing a noise amount-dependent change in the phase difference. In response, the inter-channel phase difference generating circuit 19 of the power-supply platform IC 3c changes the phase difference in the operation timings of the respective channels.

As described above, with the development assisting system 1c of the present embodiment, it is possible, as in the above embodiments, to assess/evaluate a suitable phase difference for connecting the electronic circuit ICs 2α to 2γ to the power-supply platform IC 3c, with the electronic circuit ICs 2α to 2γ actually connected to the power-supply platform IC 3c. Furthermore, it is possible to decide, without providing a large margin of error, a suitable phase difference for connecting the electronic circuit ICs 2α to 2γ.

Accordingly, the phase difference between channels is set to a value suitable for the electronic circuit ICs 102α to 102γ of the circuit 101c, which is a finished product. This reduces a stress applied on the power-supply 111, for example. Note that the phase difference between the channels of the circuit 101c is set by using (i) a common CR delay circuit, or (ii) a delay circuit using counter logic. However, it is not necessary in the circuit 101c to change the delay time, unlike the power-supply platform IC 3c. Therefore, (i) a time constant of the CR circuit and (ii) a count value of the delay circuit using counter logic are fixed at values according to the suitable phase difference that is decided by using the power-supply platform IC 3c.

Fifth Embodiment

In the present embodiment, an arrangement will be described in which (i) a plurality of power supplies 11 are provided in a development assisting system, and (ii) whether or not to share a power supply by a plurality of channels can be decided as a parameter of a power-supply circuit. Note that the present embodiment is applicable to any embodiments described above, as long as the circuit includes power-supply circuits (P1 . . . , P101 . . . ) of multiple channels. In the following description, a switching transistor array and a switching control circuit, or a driver transistor array and a driver control circuit, will be collectively referred to as a channel section 15.

Figure 16:
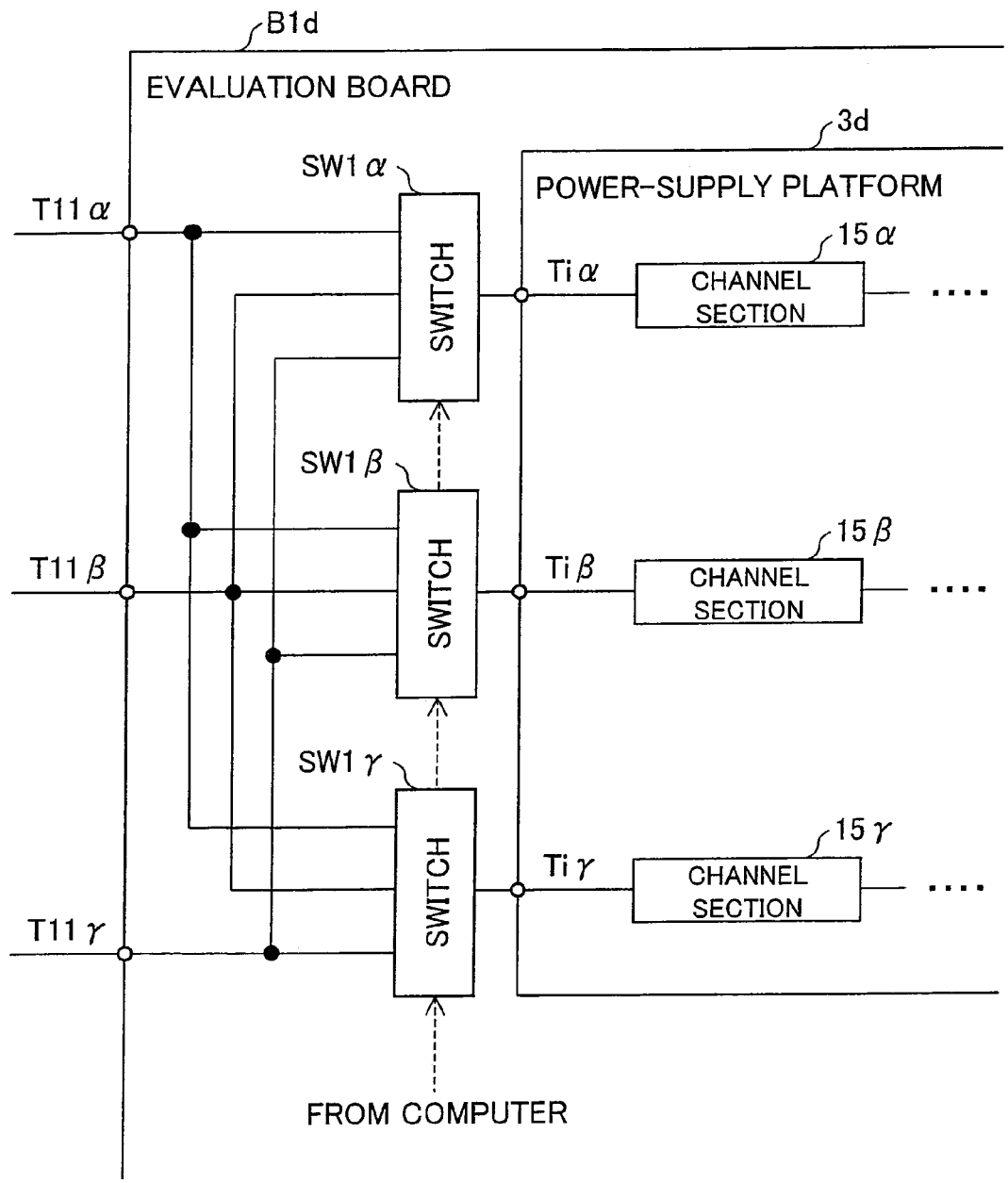
FIG. 16 illustrates is a block diagram illustrating a main structure of an evaluation board including a power-supply platform IC, according to one embodiment of the present invention.

In a development assisting system 1d of the present embodiment, a power-supply platform IC 3d, illustrated in FIG. 16, is provided in place of the power-supply platforms IC 3 to 3c. In the power-supply platform IC 3d, the channel section 15 is provided for each channel to connect a plurality of electronic circuit ICs. Channel sections 15α to 15γ of the respective channels control, independently, output voltages Voutα to Voutγ that are to be supplied to the electronic circuit ICs 2α to 2γ connected to the channel sections 15α to 15γ, respectively.

Further, in the power-supply platform IC 3d of the present embodiment, the channels are respectively provided with (i) input terminals (Tiα to Tiγ) for connecting the channels to the power supply 11 and (ii) terminals (Tgα to Tgγ) for grounding the channels. Note that, in view of convenience of description, only terminals Tiα to Tiγ are illustrated, and terminals Tgα to Tgγ are omitted in the figure.

The channel sections 15α to 15γ are connected to the external elements 4α to 4γ and electronic circuit ICs 2α to 2γ, respectively, that are the same as those of the applied embodiment. Further, the input terminals Tiα to Tiγ are connected, inside the channel sections 15α to 15γ respectively corresponding thereto, to members that are same as the members to which the power supply 11 is connected in the applied embodiment. Since these members are connected in the same manner as in the applied embodiment, illustration and description thereof are omitted. Further, a reference circuit 14 is shared between the channels in the power-supply platform IC 3d of the present embodiment.

Further, an evaluation board B1d of the present embodiment includes (i) terminals T11α to T11γ for connecting a plurality of power supplies 11 (11α to 11γ in the figure) to the evaluation board B1d and (ii) terminals T12α to T12γ for connecting the evaluation board B1d to a ground line of the power supplies 1α to 11γ. Further, the input terminals Tiα to Tiγ are provided with switches SW1α to SW1γ, respectively, for selecting and connecting the terminals T11α to T11γ. In the same manner, the terminals Tgα to Tgγ (not illustrated) are provided with switches SW2α to SW2γ (not illustrated), respectively, for selecting and connecting the terminals T12α to T12γ (not illustrated). For example, the switch SW1α provided to the input terminal Tiα can select the terminals T11α to T11γ and connect the selected terminals to the input terminal Tiα.

Further, a computer 5d of the present embodiment has substantially the same structure as the computer 5 illustrated in FIG. 4, but the operations of the respective members indicated by the reference numerals 31 to 35 are performed for the respective channels, in the same manner as in Fourth Embodiment. Further, the parameter setting section 33 of the present embodiment controls not only the power-supply platform IC 3d but also which terminal is to be selected by the switches SW2α to SW2γ.

Further, a parameter/constant deciding section 32d is provided in place of the parameter/constant deciding section 32. In the case where a measured noise-amount in any channel exceeds an acceptable value of the specification, the parameter/constant deciding section 32d switches, via the parameter setting section 33, which terminal is to be selected by the switches SW2α to SW2γ. This operation is performed in place of, or in addition to, the operation of the parameter/constant deciding section of the embodiments described above.

As a specification, a specification input section 31 of the present embodiment accepts the number of power supplies 101 that can be connected to the power-supply IC 103. When the switches SW2α to SW2γ select a terminal, the parameter/constant deciding section 32d causes the switches SW2α to SW2γ to select a terminal in such a way that the number of power supplies 11α to 11γ that are to be connected to the channel sections 15α to 15γ does not exceed the inputted specification.

Note that, in the case where the number of possible combinations of switches SW2α to SW2γ that can be set where the number of power supplies 11α to 11γ to be connected to the channel sections 15α to 15γ does not exceed the entered specification is lower than a predetermined threshold value, the parameter/constant deciding section 32d may cause the switches SW2α to SW2γ to switch in all combinations one after another, irrespective of the noise amount, and suitably set other parameters (e.g., size of transistor) in each different combination, as in the embodiments described above. The noise-amounts of the respective combinations may be compared so as to select an optimum combination.

In the case where the development assisting system or the product circuit includes switching power-supply circuits of multiple channels, there arises the problem of interference between channels. In the case where the power-supply circuits are switching power-supplies, the noise originated from switching has a large effect, as described above. The interference between channels also occurs when the power-supply circuits are linear regulators. For example, if there are load fluctuations in an electronic circuit IC connected to power-supply circuits sharing a power-supply, the input voltage V1 from the power supply also fluctuates.

In order to prevent interference between channels, it is desirable to provide separate power-supplies that apply an input voltage to the respective channels. However, if separate power-supplies are provided, the number of power-supplies 111 increases in the circuit 101d, the product circuit. Furthermore, it becomes necessary to provide terminals to the power-supply IC 103 so as to individually connect the power-supplies 111. This increases the number of terminals of the power-supply IC 103, and therefore the size of the power-supply IC 103. If the number of power-supplies 111 is increased, an additional procedure would be required for connecting the power-supplies 111 to the power-supply IC 103. Accordingly, if separate power-supplies are provided for the respective channels, production costs of the circuit 101d is increased, regardless of the extent of interference between channels.

As described above, the extent of the interference generated between channels changes depending upon, for example, a load current pattern of the electronic circuit IC serving as a load. Therefore, as in the above-described case where the size of the switching transistor is decided, it is difficult to accurately confirm the effects of interaction by a simulation and then decide, without causing any adverse effect, which channels are to share the power-supply. Especially, whether timings of AC-like load currents of a plurality of electronic circuit ICs become synchronous or asynchronous will be decided depending upon how the application (e.g., portable phone, DSC) is used. Therefore, it is even more difficult to accurately confirm the effects of interaction by a simulation and develop a strategy for reducing such effects.

On the contrary, in the development assisting system 1d of the present embodiment, the parameter/constant deciding section 32d of the computer 5d instructs the switches SW2α to SW2γ to switch and thereby decides whether or not to share the power-supply between channels.

Accordingly, with the development assisting system 1d of the present embodiment, as in the embodiments described above, it is possible, with the power-supply platform IC 3d actually connected to the electronic circuit ICs 2α to 2γ and the application operating, to assess/evaluate the power-supply terminals Tiα to Tiγ and the GND terminals Tgα to Tgγ in regard to a grouping suitable for connecting the electronic circuit ICs 2α to 2γ and operating the application.

This makes it possible to decide a suitable combination (grouping). For example, a group may be formed in such a way that the interference between channels is minimized when sharing a power-supply/GND line between channels. Therefore, it is possible to properly suppress generation of interference between channels.

Accordingly, by sharing the power-supply between channels in such a combination in the circuit 101d (product circuit), production cost of the circuit 101d can be reduced significantly while suppressing the interference between channels.

Sixth Embodiment

In the present embodiment, a development assisting system 1e will be described that allows (i) power-supply circuits of multiple channels to start/stop in a predetermined order, without individually instructing power-supply circuits to start/stop, and (ii) the order of starting/stopping the power-supply circuits by the wirings between terminals of a power-supply platform IC. The present embodiment is applicable to any of the embodiments described above. Therefore, description of the present embodiment will be made by using the channel section 15, as in the Fifth Embodiment.

Figure 17:
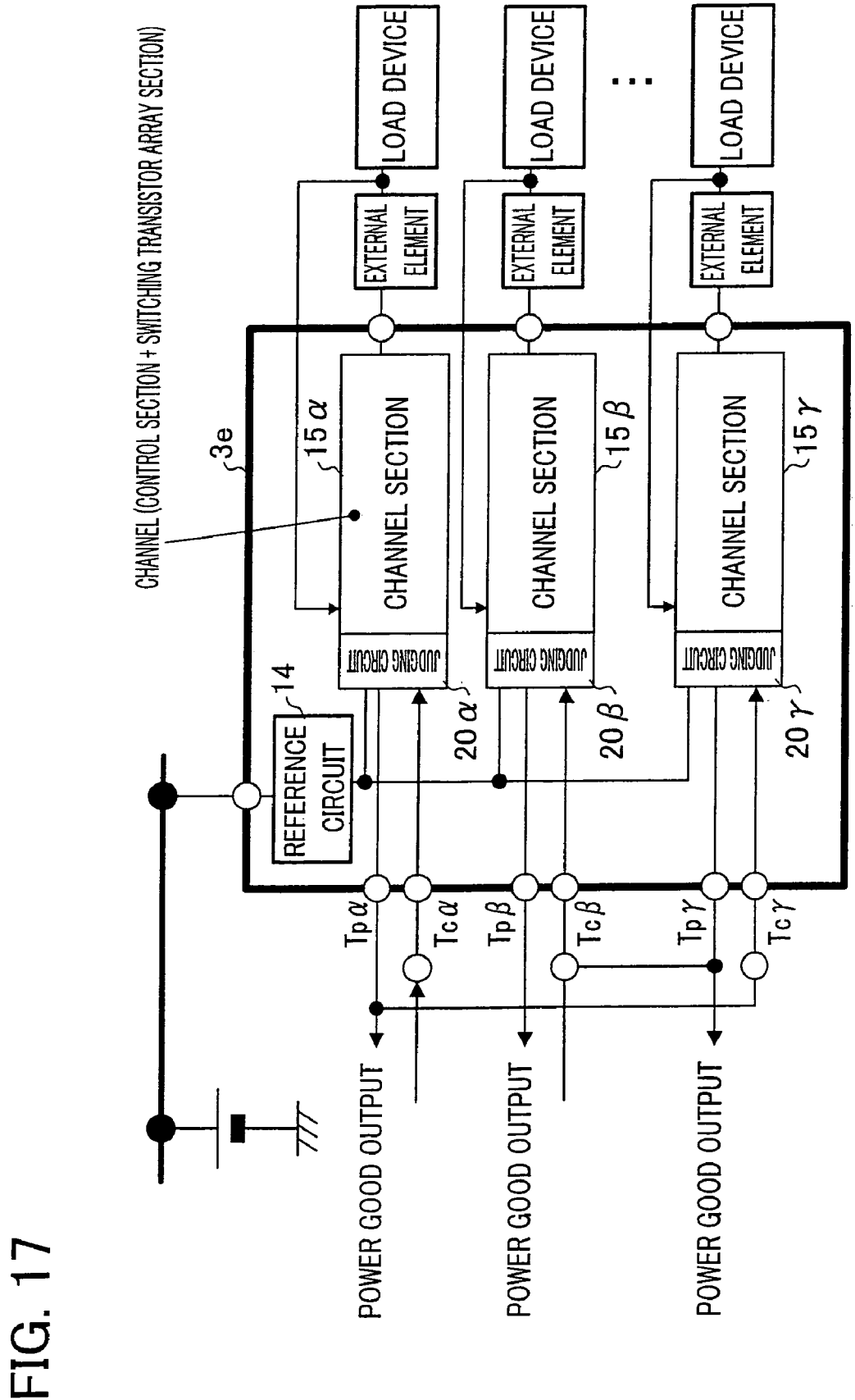
FIG. 17 illustrates is a block diagram illustrating a main structure of a power-supply platform IC according to one embodiment of the present invention.

The development assisting system 1e of the present embodiment includes a power-supply platform IC 3e, illustrated in FIG. 17, in place of the power-supply platform ICs 3 to 3d. The power-supply platform IC 3e includes (i) judging circuits 20α to 20γ that monitor an output voltage Vout of the channel section 15 so as to determine whether the output voltage Vout has reached a predetermined voltage for driving an electronic circuit IC 2 to which the channel section 15 supplies power, and (ii) output terminals Tpα to Tpγ that output a PowerGood signal indicating a determination result of the judging circuit 20. The output terminals Tpα to Tpγ Are provided for each channel.

The power-supply platform IC 3e also includes ON/OFF control input terminals Tcα to Tcγ that correspond to the respective channels. The channel sections 15 (more specifically, switching control circuit 13 or driver control circuit 13b thereof) are arranged as follows. When a PowerGood signal that is applied by another channel to a corresponding ON/OFF control input terminal Tc changes to a value that indicates that the output voltage Vout has reached the predetermined voltage, the channel section 15 starts a power-on operation. On the other hand, when the PowerGood signal changes to a value that indicates that the output voltage Vout has not reached the predetermined voltage, the channel section 15 starts a power-off operation.

Although FIG. 17 illustrates an exemplary case where the channels are provided in the same power-supply platform IC 3e, the present embodiment is not limited to this arrangement. Alternatively, a PowerGood signal of one channel may be inputted to an ON/OFF control input terminal of a channel of another power-supply platform IC 3e.

FIG. 17 illustrates an exemplary case where the terminals Tpα to Tpγ and Tcα to Tcγ are connected such that the channel α, the channel γ, and the channel β are started and stopped in this order. Specifically, the terminal Tpα of the channel α is connected to the terminal Tcγ of the channel γ, which is started after the channel α, and the terminal Tpγ of the channel γ is connected to the terminal Tcβ of the channel β, which is started after the channel γ.

With the terminals connected this way and the power-supply circuits of all channels turned off, the computer 5e instructs the channel section 15α of channel a to start. In response, the channel section 15α of channel a starts the power-on operation, with the result that the output voltage Voutα of channel a varies toward a desired value Vcα. When the output voltage Voutα of the channel a reaches the predetermined voltage, the judging circuit 20α of the channel a outputs a PowerGood signal, indicating that the output voltage Voutα has reached the predetermined voltage, from the output terminal Tpα to the ON/OFF control input terminal Tcγ of channel γ.

In response, the channel section 15γ of channel γ starts the power-on operation. When the Voutγ of channel γ reaches the predetermined voltage, the judging circuit 20 γ of channel γ outputs a PowerGood signal, indicating that the output voltage Voutγ has reached the predetermined voltage, from the output terminal Tpγ to the ON/OFF control input terminal Tcβ of channel β so as to instruct the channel section 15β of channel β to turn on power. In this way, the channels of the power-supply circuit start operating in the predetermined order due to the connection of the terminals Tpα to Tpγ and Tcα to Tcγ, although the computer 5e only instructs the channel section 15α of channel a to start first.

In the same manner, in order to stop channels, the computer 5e instructs the channel section 15α of channel a to stop, and the channel section 15α of channel a starts the power-off operation. Consequently, the output voltage Voutα of channel a varies from the desired value Vcα to ground level. When the output voltage Voutα of the channel a falls below the predetermined voltage, the judging circuit 20a of channel a outputs a PowerGood signal, indicating that the output voltage Voutα has not reached the predetermined voltage, from the output terminal Tpα to the ON/OFF control input terminal Tcγ of channel γ so as to instruct the channel section 15γ of channel γ to turn off power. Further, when the output voltage Voutγ of channel γ falls below the predetermined voltage, the judging circuit 20γ of channel γ instructs the channel section 15 of channel β to turn off power. In this way, the channels of the power-supply circuit stop operating in the predetermined order, although the computer 5e only instructs the channel section 15α of channel a to stop first.

The foregoing described an exemplary case where the channels of the power-supply circuits stop in the same order as the starting. However, in addition to (i) the terminal for outputting the PowerGood signal that indicates that the output voltage has reached the predetermined voltage, and (ii) the terminal for receiving an instruction for starting, each channel may be provided with a terminal for outputting the PowerGood signal that indicates that the output voltage has not reached the predetermined voltage and a terminal for receiving an instruction for stopping. In this case, by connecting these terminals, the channels can be stopped in a different order from the order of starting.

As described above, the power-supply platform IC 3e of the present embodiment includes (i) a judging circuit for monitoring the output voltage of each channel, (ii) a terminal for outputting a determination result, and (iii) a terminal for receiving an instruction of starting/stopping. With this arrangement, when the output voltage of the power-supply circuit of a certain channel reaches a predetermined voltage, the power-supply circuit of a channel to start/stop next can be started/stopped, without giving individual start/stop instructions to the power-supply circuits of multiple channels. Furthermore, with the arrangement, it is possible to decide the order of starting/stopping by the wirings for the terminals of the power-supply platform IC.

As a result, the power-supply circuits of multiple channels can be individually instructed to start/stop, and controlled to start/stop in a predetermined order. This reduces the time and cost for development, compared to the case where the timing of starting/stopping the power-supply circuits of multiple channels are controlled by using a CR circuit, or a delay circuit with a counter circuit.

Seventh Embodiment

In the above embodiments, description was made through the case where a parameter found is presented as a termination process of the terminating section 36, so as to allow a user, making assessment/evaluation, to develop a power-supply IC for realizing a power-supply circuit with the parameter, or purchase a power-supply IC that complies with the parameter.

On the other hand, in the present embodiment, an arrangement will be described in which the terminating section 36 transmits a searched parameter to a destination specified in advance as a vendor who provides a power-supply IC for realizing a power-supply circuit that complies with the parameter, and thereby requests the vendor to provide a power-supply IC for realizing a power-supply circuit that complies with the parameter. Note that this arrangement is applicable to any of the embodiments described above, but the following will basically describes the case where the arrangement is applied to the First Embodiment.

Figure 18:
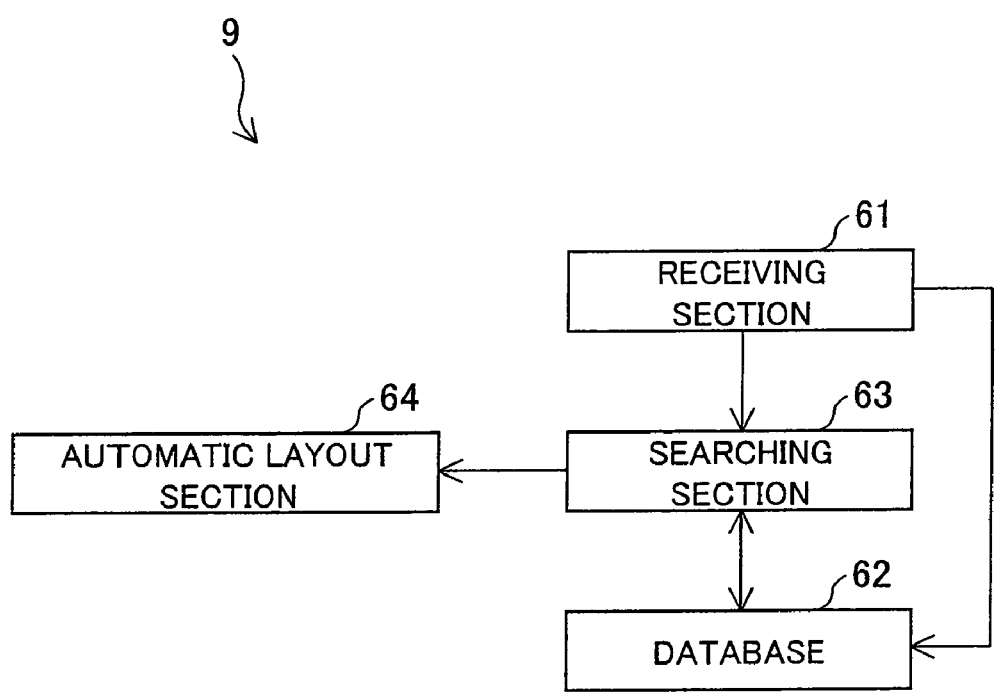
FIG. 18 illustrates is a block diagram illustrating a main structure of a computer in a vendor, according to one embodiment of the present invention.

A development assisting system if of the present embodiment includes a computer 9 as a computer on the vendor side, as illustrated in FIG. 18. The computer 9 is communicable with the computer 5. Further, information (e.g., e-mail address) for transmitting data to the computer 9 is registered, as a destination, in the terminating section 36 of the computer 5. As such, the searched parameter is transmitted to the computer 9 when the search for an optimum parameter and an optimum constant is finished and when the termination process is instructed.

Further, the computer 9 includes, as illustrated in FIG. 18, a receiving section 61 for receiving data transmitted from the computer 5, a database 62, and a searching section 63 for searching the database 62 in accordance with the data transmitted from the computer 5.

Information of a power-supply IC that has been developed already is stored in the database 62 by being associated with the parameter of the power-supply circuit that is to be realized with the power-supply IC. Further, problems generated during the development are also stored in the database 62 by being associated with the already-developed power-supply IC.

Further, the searching section 63 extracts the parameter from the data supplied to the searching section 61, and searches for information whether or not the information of power-supply IC associated with the parameter is stored as the information of already-developed power-supply IC (whether or not the parameter is new).

If the information of the power-supply IC is found by the search, the searching section 63 presents the information of the power-supply IC so that a user on the vendor side will know, together with the information of the power-supply IC, that the power-supply IC which he/she has requested has already been developed.

This allows the vendor to start the process for delivering the power-supply IC, without newly developing a power-supply IC for example, and therefore allows the vendor to quickly deliver the power-supply IC as requested by the user.

On the other hand, if the search does not find the information of the power-supply IC associated with the parameter extracted from the received data, the searching section 63 presents the parameter to an engineer on the vendor side so as to instruct the engineer to develop a new power-supply IC for realizing a power-supply circuit with the parameter.

Note that the computer 9 of the present embodiment also includes an automatic layout section 64. When instructing the engineer to develop the power-supply IC, the automatic layout section 64 automatically creates a layout of the power-supply IC in accordance with the parameter extracted from the received data, and instructs the engineer to fabricate a prototype power-supply IC based on the layout.

More specifically, when a parameter of the power-supply IC is specified for example, the automatic layout section 64 refers to a previously provided set of IPs and selects therefrom, in accordance with the parameter, an IP to be used for manufacturing the power-supply IC.

The IP can be modified according to a predetermined parameter such as a transistor size. The automatic layout section 64 modifies the IP in accordance with the parameter of the power-supply IC and automatically creates a layout for the IP by a predetermined procedure.

Further, when giving instructions to develop a new power-supply IC, the searching section 63 of the computer 9 searches through the database 62 so as to check whether or not there is registered (i) information of a power-supply IC that has a parameter similar to the parameter extracted from the received data and (ii) information of problems associated with the information of the power-supply IC. Furthermore, if such information is found, the searching section 63 presents the information to the engineer.

If the parameters are similar, the power-supply ICs are likely to face the same problem during development. Furthermore, if a problem were found, for example, by a feedback from the user after the power-supply IC is delivered, it is highly likely that the same problem would be caused in power-supply ICs that are developed with a similar parameter.

Accordingly, the searching section 63 presents, to the engineer, (i) the information of a power-supply IC that has a parameter similar to the parameter extracted from the received data and (ii) the information of problems associated with the information of the power-supply IC. This can reduce the time required for the development, and the risk of manufacturing a power-supply IC with a problem, compared to the case where the information is presented at all.

Further, in the computer 5 of the present embodiment, the specification input section 31 causes the storage section 37 to store an inputted specification. Furthermore, every time the parameter/constant deciding section 32 sets the parameter and constant, the storage section 37 stores (i) the parameter and constant, and (ii) the history of measurement results which the measurement-result input section 34 illustrated in FIG. 4 has received for these parameter and constant. Further, when transmitting the parameter to the computer 9, the terminating section 36 transmits the parameter together with the specification and history information stored in the storage section 37.

Further, when receiving a parameter, the receiving section 61 of the computer 9 can cause the database 62 to store the specification and history information by associating it, for example, with the parameter, or the information, indicative of the user, transmitted from the computer 5.

This allows the engineer of the vendor to check history information and specification information by searching the database 62, so as to confirm if there is a problem in the efficiency of arithmetic performed by the parameter/constant deciding section 32. In this way, the development assisting system for a power-supply circuit can be properly upgraded as a whole.

Figure 19:
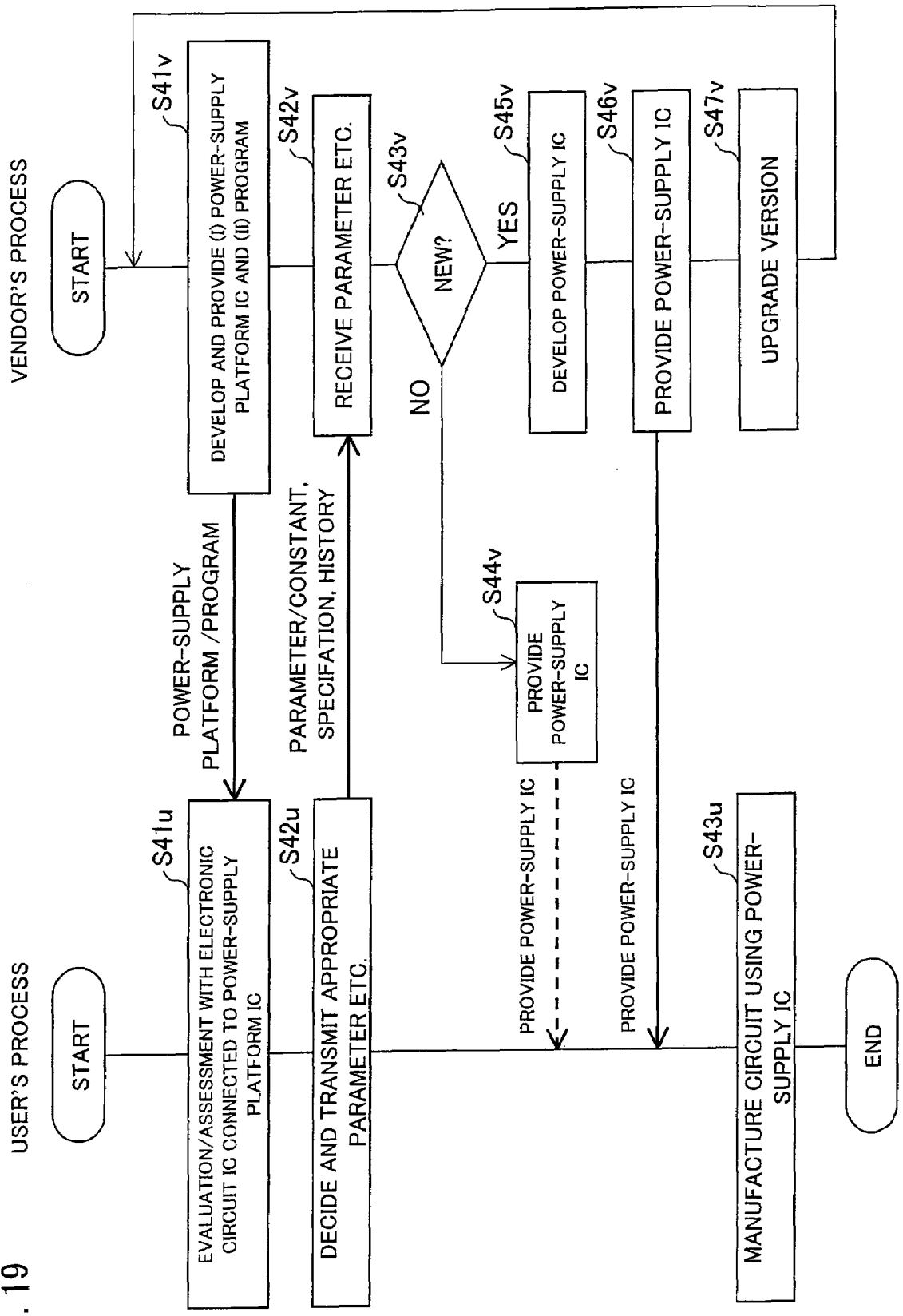
FIG. 19 is a flow chart showing processes performed by a user and a vendor in a development assisting system according to one embodiment of the present invention.

In the above arrangement, the vendor in S41v illustrated in FIG. 19 develops (i) a power-supply platform IC 3 and (ii) a program (design-assisting software) for causing a user's computer to operate as the computer 5. Furthermore, the vendor provides them to the user, so as to allow the user to evaluate/assess the electronic circuit IC 2 using the power-supply platform IC 3.

In S41u, the user causes the computer to execute the program to realize the computer 5. Then, the user causes the development assisting system if including the computer 5 and the power-supply platform IC 3 to decide a suitable parameter for the power-supply circuit P1, which causes power to be supplied to the electronic circuit IC 2, as described above.

Once a suitable parameter is decided in S41u, the computer 5 in S42u transmits, to the computer 9 of the vendor, (i) the parameter and (ii) the specification information and the history information.

In S42v, the computer 9 of the vendor receives (i) the parameter and (ii) the specification information and the history information. In S43v, the computer 9 determines, on the basis of the information (e.g., parameter) supplied by the computer 5, whether the power-supply IC 103 to be used to realize the power-supply circuit P101 for supplying power to the electronic circuit IC 102 has already been developed. If the power-supply IC 103 has already been developed (No in S43v), then the computer 9 instructs the vendor to provide the power-supply IC 103 for the user. Note that FIG. 19 illustrates an exemplary case where the power-supply IC 103 has not been developed. However, for convenience of explanation, the process of providing the power-supply IC 103 from the vendor to the user is indicated by broken line in the figure.

If the power-supply IC 103 for realizing the power-supply circuit P101 has not been developed, (YES in S43v), the computer 9 in S45v instructs the engineer of the vendor to develop the power-supply IC 103. After finishing the development, the vendor in S46v provides the power-supply IC 103 to the user.

When the power-supply IC 103 is provided to the user by the vendor in S43v or S46v, the user in S43u manufactures the power-supply circuit P101 by using the power-supply IC 103, and uses the power-supply circuit P101 with the electronic circuit IC 102 (electronic circuit IC 2 to be actually used/manufactured) to manufacture the circuit 101, which is a finished product.

Accordingly, it is possible to manufacture the circuit 101 by using the power-supply circuit P101 with a parameter that has been evaluated/assessed with the electronic circuit IC 2 actually connected to the power-supply platform IC 3. This reduces the risk in developing the circuit 101 and the cost of manufacturing the circuit 101.

Further, the vendor assesses the appropriateness of the power-supply platform IC 3 and the program, by using (a) the parameter and (b) the specification information and the history information, which are supplied in S42v by the computer 5 of the user. The vendor then upgrades the power-supply platform IC 3 and the program to more accurately meets the user requirements. (S47v).

For example, in the case where the parameter and the specification and history information transmitted from the computer 5 of the user indicate that a power-supply IC 103 to be provided has a greater number of channels than that prepared for the power-supply platform IC 3 (one channel in the case of the First Embodiment), the power-supply platform IC 3 is upgraded such that the number of channels is increased, as in the Fourth Embodiment, for example. Further, for example, in the case where the history information indicates that the number of times the search is repeated to find an optimum solution is excessive, the program is upgraded by (i) changing an algorithm that the parameter/constant deciding section 32 uses to redetermine the parameter and the constant and (ii) adjusting the parameter used in the algorithm for redetermining the parameter and the constant of the power-supply circuit P1.

Figure 20:
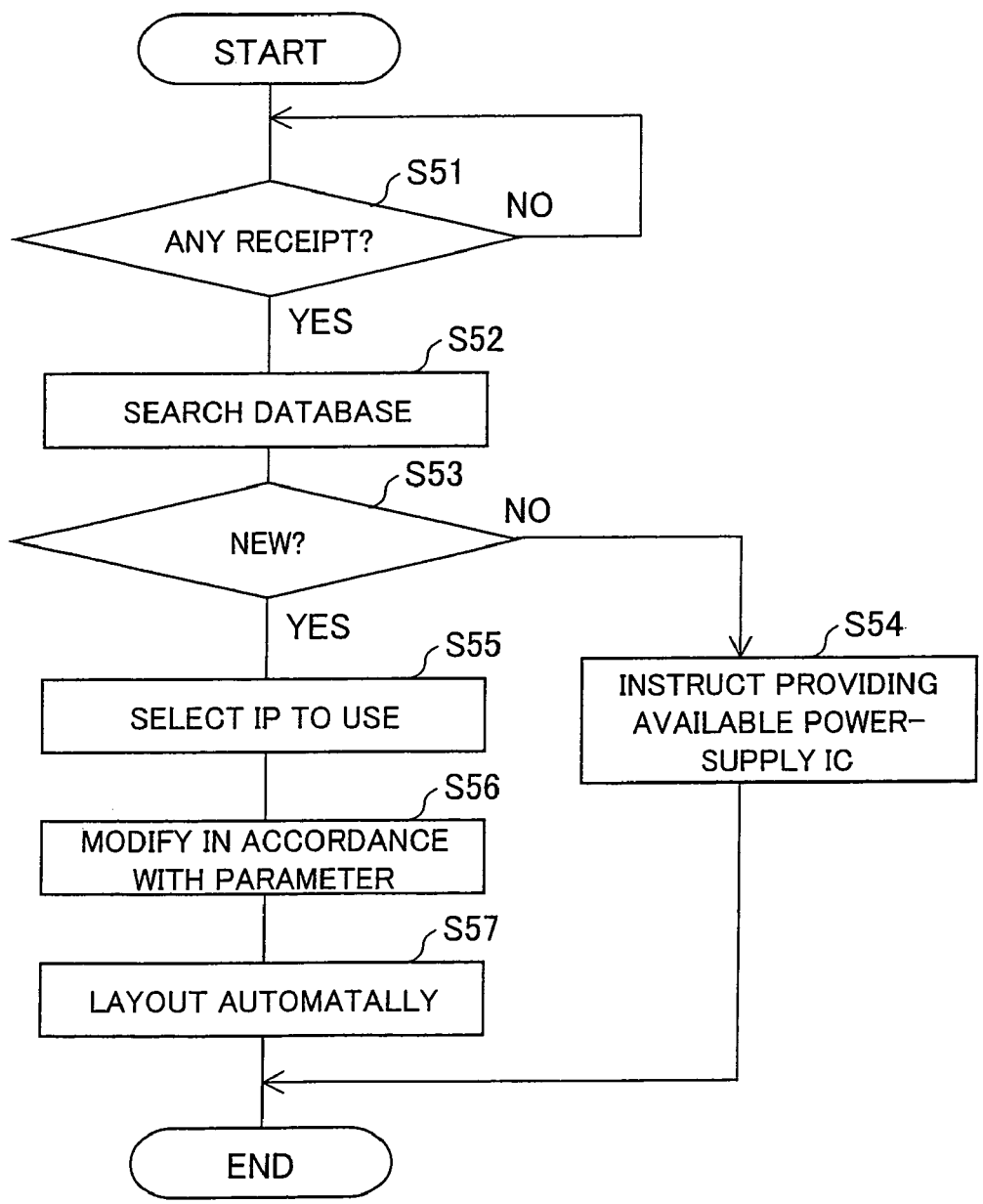
FIG. 20 is a flow chart showing operations of the computer in the vendor.

The following more specifically describes operations of the computer 9 in steps of S43v and S46v. In S51 shown in FIG. 20, the receiving section 61 of the computer 9 waits for data from the computer 5. If the receiving section 61 receives data (YES in S51), the searching section 63 of the computer 9 searches the database 62 in S52 so as to determine whether the parameter contained in the data is a new parameter.

If it is determined that the parameter is not new (NO in S53), the searching section 63 in S54 (i) notifies the user on the vendor side that the power-supply IC requested by a user has already been developed and (ii) presents information of the power-supply IC to the user on the vendor side and instructs the user on the vendor side to provide the power-supply IC.

On the other hand, if it is determined that the parameter is new (YES in S53), the automatic layout section 64 of the computer 9 in S55 selects, in accordance with the parameter, an IP to be used. Thereafter, in S56, the automatic layout section 64 modifies the IP according to the parameter (e.g., size of transistor). Then, in S57, the automatic layout section 64 automatically creates a layout for the power-supply IC by using the IP thus modified.

After the automatic layout section 64 has performed the automatic layout process on the power-supply IC, a prototype power-supply IC is manufactured by the engineer. If it is confirmed that the prototype power-supply IC operates properly, the power-supply IC is provided to a user.

As described above, the development assisting system if of the present embodiment includes a power-supply platform IC 3, an evaluation substrate (evaluation board), a design-assistance software, and a database (computer 5).

A user starts a development by inputting, to a design-assistance software, a provisional specification value of a load device. A constant of the external element, specified by the design-assistance software, is provided to the evaluation board, and a provisional selection-condition, calculated by the design-assistance software, is inputted to the power-supply platform. The evaluation of the load device is performed under this condition. On the basis of results of the evaluation, the user makes an assessment of operation conditions, whether the load device is operating as expected without problems, whether a ringing-noise exists in an input power-supply (confirms whether there are higher harmonic waves that cause stress on the power-supply), and whether a problem has been caused due to a plurality of devices operating together in combination. The user also makes an assessment for electrical characteristics, whether the conversion efficiency of an output power with respect to an input power is optimum. The user then determines whether the operations and the electrical characteristics are optimum. If they are not optimum, the user inputs the result to the design-assistance software. The information to be inputted includes (i) information of conversion efficiency of respective channels, (ii) ripple information of output voltage, (iii) information of mutual interference (which combination of channels has caused noise when operating simultaneously), (iv) information of variable value of input terminal voltage, and (v) information of operational stability of the load device. On the basis of the information, it is determined which part has a problem. The design-assistance software rearranges (i) the selection-conditions and (ii) a preferred order of parameters used in the method for calculating the external element constant, and performs the calculation again. The result of the calculation is developed again in the power-supply platform and the evaluation substrate.

The foregoing procedure is repeated to optimize the power-supply device. If it is determined that the power-supply device is optimized, then data of a set value of the power-supply platform determined as being optimized is automatically forwarded from the database connected to the design-assistance software to the designer (vendor) of the power-supply device. The set value thus forwarded is searched for in the development database of the vendor so as to find whether the set value exists in existing power-supply devices. If the search finds that the set value exists in existing devices, search is made in the database of inventories of samples. If there is an inventory for the sample, the sample is immediately provided to the user. If there is no inventory, a request is made for prototype manufacturing. This makes it possible to promptly serve the user even when a person in charge is attending other jobs or is off work and therefore cannot serve the user. On the other hand, if the optimized set value is not found in the development database, information of a device that is most similar in structure is picked up. Then, problems that have occurred during the development of the device are listed up, and an IP and a number of channels are selected on the basis of the set value of the device. Thereafter, the size of the driver is selected. The result of the selection is reflected to the process of automatic layout, and a chip layout is established immediately. The engineer of the power-supply device conducts a final check on the development list and the layout, and manufactures a prototype. At this time, the set value is newly registered in the development database. As soon as the prototype is manufactured and a sample is made, the sample is provided to the user.

With this development flow, it is possible to obtain a design target in digital information (optimized set value) without requiring a user to extract a load model, which requires skill and time. Furthermore, it is not necessary to perform a simulation again with regard to the information of design target, and therefore development can be made both quickly and at low risk. Moreover, with this operation, it is possible to confirm and manage, in the development stage, a secondary disaster such as the problem of higher harmonic waves, which is difficult to predict by a simulation.

Further, when the optimized set value is obtained from the user, the modification process that is performed until the set value is optimized is also obtained. On the basis of the information, the calculation method for the design-assistance software is optimized.

This system continuously provides the user with information, and not only the software but also the power-supply platform are upgraded regularly so as to satisfy the needs of the user.

This makes it possible to extract latest needs of the user, which is difficult to obtain, and therefore increase the market value of the power-supply device.

Further, in the case where the development assisting system if of the present embodiment is applied to the First Embodiment, (i) the design-assistance software (computer 5) and (ii) the power-supply semiconductor integrated circuit development system make it possible to optimize the size of the switching transistor by automatically performing the procedure, from the extraction to the completion of the layout, without performing the procedure necessary for the development of a power-supply device and without requiring time-consuming and skillful procedures (e.g., extraction of a load model of a load device, and simulation). Here, the design-assistance software (computer 5) (a) calculates, on the basis of use conditions of the user, an initial set value of a selection signal for a size of a switching transistor, (b) inputs, after presenting, the set value to the power-supply semiconductor integrated circuit, and (c) repeats modifying the set value until the user confirms an optimized operation with the use of the set value. The power-supply semiconductor integrated circuit development system (a) saves the set value when the optimization is completed, (b) forwards the set value to the vendor of the power-supply device development side, and (c) automatically performs the layout process in accordance with the set value.

Further, in the case where the development assisting system 1f of the present embodiment is applied to the Second Embodiment, (i) the design-assistance software and (ii) the power-supply semiconductor integrated circuit development system make it possible to optimize the size of the switching transistor and the switching-drive delay-time of the respective switching transistors by automatically performing the procedure, from the extraction to the completion of the layout, without performing the procedure necessary for the development of a power-supply device and without requiring time-consuming and skillful procedures (e.g., extraction of a load model of a load device, and simulation). Here, the design-assistance software (a) calculates, on the basis of use conditions of the user, a size of a switching transistor and an initial set value of a selection signal for a switching-drive delay-time of a switching transistor, (b) inputs, after presenting, the set value to the power-supply semiconductor integrated circuit, and (c) repeats modifying the set value until the user confirms an optimized operation with the use of the set value. The power-supply semiconductor integrated circuit development system (a) saves the set value when the optimization is completed, (b) forwards the set value to the vendor of the power-supply device development side, and (c) automatically performs the layout process in accordance with the set value. This (i) reduces the risk of causing problems relating to noise, loss, current capacity or the like in a finished product and (ii) minimizes the number of switching transistors, which are largely responsible for the chip size, and therefore it becomes possible to manufacture the power-supply device at low cost. Furthermore, since the design time is short, the power-supply device can be manufactured in a short delivery period.

Further, in the case where the development assisting system 1f of the present embodiment is applied to the Third Embodiment, (i) the design-assistance software and (ii) the power-supply semiconductor integrated circuit development system make it possible to optimize the size of the switching transistor by automatically performing the procedure, from the extraction to the completion of the layout, without performing the procedure necessary for the development of a power-supply device and without requiring time-consuming and skillful procedures (e.g., extraction of a load model of a load device, and simulation). Here, the design-assistance software (a) calculates, on the basis of use conditions of the user, the size of the switching transistor and an initial set value of a selection signal for soft-start conditions, (b) inputs, after presenting, the set value to the power-supply semiconductor integrated circuit, and (c) repeats modifying the set value until the user confirms an optimized operation with the use of the set value. The power-supply semiconductor integrated circuit development system (a) saves the set value when the optimization is completed, (b) forwards the set value to the vendor of the power-supply device development side, and (c) automatically performs the layout process in accordance with the set value. This (i) reduces the risk of causing problems relating to electric-current performance, feedthrough current at start up and the like in a finished product and (ii) minimizes the number of switching transistors, which are largely responsible for the chip size, and therefore it becomes possible to manufacture the power-supply device at low cost. Furthermore, since the design time is short, and the power-supply device can be manufactured in a short delivery-period.

Further, in the case where the development assisting system 1f of the present embodiment is applied to the Fourth to Sixth Embodiments, in view of the problem that the product value is degraded because of uncertainty in a specification of a load of the power-supply device, an optimized circuit arrangement is extracted in digital form by evaluating the load device with the use of (i) a switching transistor that includes a plurality of power-supply circuits, which may cause problems relating to chip-size, loss, or noise and (ii) a power-supply platform that can vary the driver size by using a selection signal supplied externally. This makes it possible to develop a power-supply device that is suitable for the load device at low risk in a short period of time, without performing a simulation that consumes time and has poor accuracy. Further, a power-supply device development system is provided that includes (i) an evaluation substrate that can connect a periphery device of the power-supply platform and group power-supply/GND lines, (ii) a design-development-assistance software that includes a calculation function for optimizing the set value, (iii) a database that saves the results of the calculation, (iv) a vendor design-database that accepts optimized information, (v) a database that manages inventories of the power-supply samples, and (vi) an automatic layout system. This realizes development of a power-supply device at low risk and in a short period of time and improves the product value of the power-supply device by obtaining latest and actual needs of application-engineers, and therefore distinguishes the product from the products of other companies.

Further, in the development assisting system 1f of the present embodiment, in response to a setting signal forwarded by the user, automatic search is made on database which stores (i) settings data of previously developed models and (ii) the number of samples, linked to the settings data. If it is determined that the model has already bee developed in the past, the stored number of samples is listed. On the other hand, if it is determined that the model is new, (i) a model with similar settings and (ii) problems that were generated during the development process are listed and presented to the engineer who develops the power-supply. This makes it possible to establish a system that allows prompt reply to users and early development.

Further, in the development assisting system $1f$ of the present embodiment, an operation log is forwarded concurrently when forwarding the data of optimized set value. The operation log indicates the history of repeated procedure of modifying the set values, which is conducted until the user confirms the optimized operation by the design-assistance software. This makes it possible to debug the system by (i) determining contradictions in accumulated data of input conditions, output load conditions, conversion efficiency, and external element constants, (ii) determining accuracy of the data, and (iii) determining, on the basis of the results of modification, whether there is a problem in operation efficiency.

Further, the development assisting system 1f of the present embodiment is provided, as needed, to the user so as to allow the user to use the system for the purpose of examination for developing various products. This makes it possible to periodically adopt the needs that arise when the user uses the system and update the system accordingly. In this way, latest user-needs are extracted that is considered to be difficult to obtain, and therefore the value of the power-supply device is improved.

In the above embodiments, an exemplary case was described that the members realizing the computers 5 and 9 are "functional blocks that are realized when operating means such as a CPU executes a program code stored in a storage medium such as a ROM or a RAM," but the computers 5 and 9 may be realized by hardware that performs the same processes. Alternatively, the computer 5 and 9 may be realized by a combination of (i) hardware that performs a part of the processes and (ii) the operating means for executing a program code that causes controlling the hardware or performing other processes. Further, the members described above as hardware may be realized by a combination of (i) hardware that performs a part of the processes and (ii) the operating means for executing a program code that causes controlling the hardware or performing other processes. The operating means may be realized by single means, or alternatively, a plurality of operating means that are connected via a bus or various communication paths in the apparatus jointly execute the program code. Further, the storage section 37 and the database 62, among the members described above, may be realized by the storage device itself, such as a memory.

With regard to the program code that the operating means can directly execute, or the program in the form of data that can create the program code by, for example, extraction described below, the program (program code or the data) is stored in the storage medium, and the storage medium is distributed. Another way of distributing the program is that the program is transmitted by communicating means for transmitting via a wire communication path or a wireless communication path. The program thus distributed is executed by the operating means.

In the case where the program is transmitted via the communication path, the transmission media constituting the communication path mutually transmit a signal train that indicates the program so that the program is transmitted via the communication path. Further, when transmitting the signal train, the transmission apparatus may modulate a carrier by using the signal train that indicates the program so as to superimpose the signal train on the carrier. In this case, the receiving apparatus demodulates the carrier so as to reconstruct the signal train. Further, when transmitting the signal train, the transmission apparatus may transmit the signal train in the form of digital data train by way of packet-division. In this case, the receiving apparatus combines packets thus supplied so as to reconstruct the signal train. Further, when the transmission apparatus transmits the signal train, the signal train may be multiplexed with another signal train and then transmitted by way of time-division, frequency-division, code-division, or the like. In this case, the receiving apparatus extracts reconstructs the signal train individually. In any case, the same effects are achieved as long as it is possible to transmit the program via a communication path.

It is preferable that the storage medium used in distributing the program be removable. The storage medium used after the program is distributed may be removable or non-removable. Furthermore, the storage medium may be rewritable (writable) or non-rewritable (non-writable), be volatile or non-volatile, and adapt any recording-type and shape, as long as the program is stored. Examples of the storage medium include: tape such as a magnetic tape and a cassette tape; disk such as a magnetic disk (e.g., floppy (registered trademark) disk, hard disk), a CD-ROM, a magneto-optical disk (MO), a mini disk (MD), and a digital video disk (DVD). The storage medium may be realized by a card such as an IC card and an optical card. The storage medium may also be realized by a semiconductor memory such as a mask ROM, an EPROM, an EEPROM, and a flash ROM. The storage medium may also be a memory formed in operating means, such as a CPU.

Note that the program code may be a code for instructing the entire steps of the processes to the operating means. If there already exists a basic program (e.g., operating system, library) that can execute a part of or all of the above processes when called in predetermined steps, all of, or a part of, the steps of the processes may be replaced by a code or pointer for instructing the operating means to call for the basic program.

Further, the program may be stored in the storage medium in the following formats. For example, the program may be stored in a real memory to which the operating means can access for executing the program. Further, the program may be stored in a local storage medium (e.g., local memory, hard disk), prior to the real memory, to which local storage medium the operating means can access at any time. Further, the program may be stored in a network, a mobile storage medium or the like, which program is not installed in the local storage medium therefrom yet. Further, the program is not limited to a compiled object code, and may be stored in the form of a source code or an intermediate code that is created in during interpreting or compiling. In any of the cases, the same effects are obtained regardless how the program is stored in the storage medium, as long as the program can be converted, by way of (a) extraction of compressed information, (b) reconstruction of encoded information, (c) interpretation, (d) compiling, (e) linking, (f) processing of storing in the real memory, or (g) a combination thereof, into a format that can be executed by the operating means can execute.

Note that, although the switching control circuit (driver control circuit) and the reference circuit are integrated in the power-supply platform IC in the embodiments described above, the arrangement is not limited thereto. For example, the switching control circuit and the reference circuit may be formed as separate circuits.

However, in many cases, not only the switching transistor (driver transistor) but also the switching control circuit (driver control circuit) and the reference circuit are integrated in the power-supply IC included in a circuit that is the finished product. Therefore, precision of assessment/evaluation is improved if these circuits are integrated in the power-supply platform IC.

Further, in the above embodiments, the case was described that the power-supply circuit for deciding a parameter and the power-supply circuit included in the finished product have the same device as a mutual external element, but the arrangement is not limited thereto. Even in the case where a device is externally connected because, for example, the constant may be changed at high possibility in the power-supply circuit for deciding a parameter, if it is possible to integrate the device in the power-supply IC that constitutes the power-supply circuit included in the finished product, the device may be integrated.

Further, in addition to the foregoing arrangement, a power-supply semiconductor integrated circuit according to the present invention may be adapted to include: a plurality of switching transistors; and a phase-difference control circuit operable as a control circuit to control a phase difference between an ON/OFF timing of transistors constituting at least one of the transistor arrays, and an ON/OFF timing of transistors constituting remaining transistor arrays, wherein the phase-difference control circuit varies the phase difference as a parameter of the power-supply circuit, according to an external command.

In a power-supply circuit, for example, such as a switching power-supply circuit of a synchronous rectification type or a power-supply circuit of a charge-pump type, in which a plurality of switching transistors are turned ON/OFF at different timings, it is desirable to appropriately set a phase difference in the ON/OFF timings of the switching transistors.

However, the phase difference is also dependent on the characteristics of the load device or external element. The phase difference can be determined by extracting a load model for the load device, and a driver delay-time model based on the parasitic effect of the external element, and by performing a simulation using the extracted model. However, as in the case of the transistor size, it is difficult to find an optimum value of the phase difference by this method.

In the foregoing arrangement, however, a phase difference is specified to the selecting circuit provided as a control circuit. This enables assessment/evaluation of the phase difference with the load device actually connected, so that a suitable value of phase difference can be found, by actually varying it, for supplying power to the load device.

In this way, a suitable phase difference can be extracted without requiring time-consuming and skillful procedures, such as the extraction of a load model for the load device, or a driver delay-time model based on the parasitic effect of the external element, and performing a simulation using the extracted model.

Further, in addition to the foregoing arrangement, a power-supply semiconductor integrated circuit according to the present invention may be adapted to include: a switching control circuit operable as a control circuit to monitor an output voltage of the parameter-deciding power-supply circuit, and control ON/OFF operation of the switching transistors so as to bring the output voltage to a predetermined target value; and a reference voltage generating circuit for generating a reference voltage which the switching control circuit refers to when monitoring the output voltage, wherein the switching control circuit varies the target value according to an external command.

According to the foregoing structure, the switching control circuit and the reference voltage generating circuit are provided in the power-supply semiconductor integrated circuit. Thus, compared with the structure in which the switching control circuits and the reference voltage generating circuit are provided separately from the power-supply semiconductor integrated circuit, assessment/evaluation can be performed under the condition that is more faithful to the actual power-supply circuit, by using a power-supply circuit in which the switching transistors, the switching control circuit for controlling switching of the switching transistors, and the reference voltage generating circuit for generating a reference voltage are integrated in a single semiconductor integrated circuit.

According to the foregoing structure, the control circuit may be adapted so that, at start-up, the number of transistors is increased stepwise until the number of transistors to be operated as the driver transistors reaches the number that complies with the specified transistor size, and that the timing at which the number of transistors is increased stepwise is varied as a parameter of the power-supply circuit, according to an external command.

According to the foregoing structure, the control circuit at start-up varies the timing at which the number of transistors is increased stepwise, according to an external command. This enables assessment/evaluation by actually varying the timing of stepwise increase of the transistors, with the load device actually connected to the parameter-deciding power-supply circuit. This gives an indication as to at which timing during start-up the impedance restriction on the driver transistor should be released in order to reduce the feedthrough current to the device and reduce stress on the power supply connected to the input terminal of the power-supply circuit.

Further, in addition to the foregoing arrangement, a power-supply semiconductor integrated circuit according to the present invention may be adapted to: a judging circuit for monitoring an output voltage of the parameter-deciding power-supply circuit so as to determine whether the output voltage exceeds a predetermined voltage; a judgment result output terminal for outputting a result of determination performed by the judging circuit; an input terminal through which start-up instructions or termination instructions are inputted; and a start-up/termination control circuit for commencing a start-up operation or termination operation of the parameter-deciding power-supply circuit according to the start-up instructions or termination instructions inputted through the input terminal.

According to the foregoing structure, in the case where more than one parameter-deciding power-supply circuit is provided, the determination result output terminal of the power-supply semiconductor integrated circuit structured to realize a certain parameter-deciding power-supply circuit is connected to the start/stop control circuit of the power-supply semiconductor integrated circuit structured to realize a parameter-deciding power-supply circuit that is to be started or stopped next. In this way, the order of starting or stopping the parameter-deciding power-supply circuit can be determined. Further, the start/stop instructions need to be given to only the parameter-deciding power-supply circuit that is designated to start/stop first, in order to start the other parameter-deciding power-supply circuits.

Further, the power-supply semiconductor, integrated circuit provided with the switching control circuit may be adapted to further include: an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command.

According to the foregoing arrangement, as with the power-supply semiconductor integrated circuit system provided with the inter-channel phase difference control circuit, a phase difference between channels is specified to the selecting circuit provided as a control circuit. This enables assessment/evaluation of the inter-channel phase difference, with the load device actually connected to the power-supply semiconductor integrated circuit of each channel, so that a suitable value of inter-channel phase difference can be found, by actually varying it, for supplying power to the load device. This helps assist designing a power-supply circuit that can suppress the effect of higher harmonic waves due to the switching noise that is generated when driving more than one device, and that can relieve the stress on the power-supply connected to the input terminal of each power-supply semiconductor integrated circuit.

In the foregoing structure, the parameter deciding section may be adapted to repeat receiving the evaluation result and setting a new parameter, so as to search for a better parameter. Further, the parameter deciding section may include a sending section for sending a searched parameter to a predetermined vendor, which provides a semiconductor integrated circuit for realizing a power-supply circuit with a parameter, so as to request the vendor to provide a semiconductor integrated circuit that is to be used to realize a power-supply circuit with the searched parameter.

This greatly reduces the labor required to make a request to the vendor. Further, the vendor is able to provide a semiconductor integrated circuit for realizing a power-supply circuit, based on suitable parameters that have been assessed/evaluated with the semiconductor integrated circuit actually connected to the device. This reduces the labor and risk associated with the development of the system including the semiconductor integrated circuit and the device.

In the foregoing structure, the parameter deciding section may be adapted to record history of the repeated procedure of receiving the evaluation result and setting a new parameter, and send history information indicative of the history, together with the searched parameter.

According to the foregoing structure, the development assisting system for a power-supply presents history information to the vendor. Based on the history information, the vendor checks for any problem in the efficiency of arithmetic performed by the parameter deciding section. In this way, the entire development assisting system can be upgraded more properly.

The development assisting system may further include: a storing section for storing information of the semiconductor integrated circuit after development, by associating the information with the parameter of the power-supply circuit realized by the semiconductor integrated circuit; a receiving section for receiving the parameter sent from the sending section; and a presenting section for presenting information of the semiconductor integrated circuit that has been associated with the parameter received by the receiving section, if such a semiconductor integrated circuit were found by the search of the storing section.

According to the foregoing structure, the presenting section presents information of a semiconductor integrated circuit, if the semiconductor integrated circuit has been developed to realize a power-supply circuit with the parameter received by the receiving section, and if the information concerning the semiconductor integrated circuit has been stored by being associated with the parameter. In this way, the vendor is not required to develop a new semiconductor integrated circuit. Instead, the vendor can quickly provide a semiconductor integrated circuit for realizing a power-supply circuit with the parameter received by the receiving section.

In the foregoing structure, the storing section may be adapted to store problems that were generated during development of semiconductor integrated circuits, by associating the problems with the semiconductor integrated circuits that have been developed, and the presenting section may be adapted so that, if the storing section does not contain a semiconductor integrated circuit associated with the received parameter, a search is made through the storing section for a semiconductor integrated circuit that is associated with a parameter close to the received parameter, and presents the searched semiconductor integrated circuit with problems, if any, that were generated during development.

According to the foregoing structure, if the storing section does not contain a semiconductor integrated circuit associated with the received parameter, the presenting section searches through the storing section for a semiconductor integrated circuit that is associated with a parameter close to the received parameter, and presents the searched semiconductor integrated circuit with problems, if any, that were generated during development.

Thus, in realizing a semiconductor integrated circuit for realizing a power-supply circuit with the parameter received by the receiving section, the vendor can refer to the presented problems, i.e., the problems that are likely to be caused in the actual development of a semiconductor integrated circuit. In this way, the semiconductor integrated circuit can be developed in a shorter time period, as compared with the case where no such problems are presented.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A power-supply semiconductor integrated circuit for realizing a parameter-deciding power-supply circuit, which, in order to decide a parameter of a power-supply circuit that supplies power to a load device, is connected to the load device in place of the power-supply circuit, wherein the power-supply circuit and the parameter-deciding power-supply circuit are switching power-supply circuits, and the power-supply semiconductor integrated circuit further comprises:

one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command.

2. The power-supply semiconductor integrated circuit as set forth in claim 1, further comprising:

a phase-difference control circuit operable as a control circuit to control a phase difference between an ON/OFF timing of transistors constituting at least one of the transistor arrays, and an ON/OFF timing of transistors constituting remaining transistor arrays, wherein the phase-difference control circuit varies the phase difference as a parameter of the power-supply circuit, according to an external command.

3. The power-supply integrated semiconductor circuit as set forth in claim 1, further comprising:

a switching control circuit operable as a control circuit to monitor an output voltage of the parameter-deciding power-supply circuit, and control an ON/OFF operation of the switching transistors so as to bring the output voltage to a predetermined target value; and a reference voltage generating circuit for generating a reference voltage which the switching control circuit refers to when monitoring the output voltage, wherein the switching control circuit varies the target value according to an external command.

4. The power-supply integrated semiconductor circuit as set forth in claim 2, further comprising:

a switching control circuit operable as a control circuit to monitor an output voltage of the parameter-deciding power-supply circuit, and control an ON/OFF operation of the switching transistors so as to bring the output voltage to a predetermined target value; and a reference voltage generating circuit for generating a reference voltage which the switching control circuit refers to when monitoring the output voltage, wherein the switching control circuit varies the target value according to an external command.

5. A power-supply semiconductor integrated circuit for realizing a parameter-deciding power-supply circuit, which, in order to decide a parameter of a power-supply circuit that supplies power to a load device, is connected to the load device in place of the power-supply circuit, wherein the power-supply circuit and the parameter-deciding power-supply are linear regulators, and the power-supply semiconductor integrated circuit further comprises:

a transistor array that includes a plurality of transistors operable as driver transistors that drive power to the load device in the parameter-deciding power-supply circuit;

a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command.

6. The power-supply semiconductor integrated circuit as set forth in claim 5, wherein the control circuit at start up increases the number of transistors stepwise until the number of transistors to be operated as the driver transistors reaches a value that complies with a specified transistor size, and wherein the control circuit increases the number of transistors stepwise by varying a timing of increase as a parameter of the power-supply circuit, according to an external command.

7. The power-supply integrated semiconductor circuit as set forth in claim 5, further comprising:

a judging circuit for monitoring an output voltage of the parameter-deciding power-supply circuit so as to determine whether the output voltage exceeds a predetermined voltage;

a judgment result output terminal for outputting a result of determination performed by the judging circuit;

an input terminal through which start-up instructions or termination instructions are inputted; and a start-up/termination control circuit for commencing a start-up operation or termination operation of the parameter-deciding power-supply circuit according to the start-up instructions or termination instructions inputted through the input terminal.

8. The power-supply integrated semiconductor circuit as set forth in claim 1, further comprising:

a judging circuit for monitoring an output voltage of the parameter-deciding power-supply circuit so as to determine whether the output voltage exceeds a predetermined voltage;

a judgment result output terminal for outputting a result of determination performed by the judging circuit;

an input terminal through which start-up instructions or termination instructions are inputted; and a start-up/termination control circuit for commencing a start-up operation or termination operation of the parameter-deciding power-supply circuit according to the start-up instructions or termination instructions inputted through the input terminal.

9. A power-supply semiconductor integrated circuit system for realizing a parameter-deciding power-supply circuit of multiple channels, the parameter-deciding power-supply circuit, in order to decide a parameter of a power-supply circuit that supplies power to a load device, being connected to the load device in place of the power-supply circuit, said power-supply semiconductor integrated circuit system comprising:

a plurality of power-supply semiconductor integrated circuits that are integrated on a single device, wherein the power-supply semiconductor integrated circuits realize the parameter-deciding power-supply circuit as a switching power-supply circuit by including:

one or more transistor arrays, each including a plurality of transistors operable as switching transistors of the parameter-deciding power-supply circuit;

a switching control circuit operable as a control circuit to monitor an output voltage of the parameter-deciding power-supply circuit, and control an ON/OFF operation of the switching transistors so as to bring the output voltage to a predetermined target value, wherein the switching control circuit varies the target value according to an external command;

a reference voltage generating circuit for generating a reference voltage which the switching control circuit refers to when monitoring the output voltage; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, said power-supply semiconductor integrated circuit system further comprising:

an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command.

10. A power-supply semiconductor integrated circuit system for realizing a parameter-deciding power-supply circuit of multiple channels, the parameter-deciding power-supply circuit, in order to decide a parameter of a power-supply circuit that supplies power to a load device, being connected to the load device in place of the power-supply circuit, said power-supply semiconductor integrated circuit system comprising:

a plurality of power-supply semiconductor integrated circuits that are integrated on a single device, wherein the power-supply semiconductor integrated circuits realize the parameter-deciding power-supply circuit as a switching power-supply circuit by including:

one or more transistor arrays, each including a plurality of transistors operable as switching transistors of the parameter-deciding power-supply circuit;

a switching control circuit operable as a control circuit to monitor an output voltage of the parameter-deciding power-supply circuit, and control an ON/OFF operation of the switching transistors so as to bring the output voltage to a predetermined target value, wherein the switching control circuit varies the target value according to an external command;

a reference voltage generating circuit for generating a reference voltage which the switching control circuit refers to when monitoring the output voltage;

a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command; and a phase-difference control circuit operable as a control circuit to control a phase difference between an ON/OFF timing of transistors constituting at least one of the transistor arrays, and an ON/OFF timing of transistors constituting remaining transistor arrays, wherein the phase-difference control circuit varies the phase difference as a parameter of the power-supply circuit, according to an external command, said power-supply semiconductor integrated circuit system further comprising:

an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command.

11. A power-supply semiconductor integrated circuit system for realizing a parameter-deciding power-supply circuit of multiple channels, the parameter-deciding power-supply circuit, in order to decide a parameter of a power-supply circuit that supplies power to a load device, being connected to the load device in place of the power-supply circuit, said power-supply semiconductor integrated circuit system comprising:

a plurality of power-supply semiconductor integrated circuits, wherein the power-supply semiconductor integrated circuits realize the parameter-deciding power-supply circuit as a switching power-supply circuit by including:

one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, said power-supply semiconductor integrated circuit system further comprising:

a plurality of power-supply input terminals connected to power supplies that supply power to the parameter-deciding power-supply circuit;

a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command.

12. The power-supply semiconductor integrated circuit system as set forth in claim 11, wherein the power-supply semiconductor integrated circuits are integrated on a single device and each include:

a switching control circuit operable as a control circuit to monitor an output voltage of the parameter-deciding power-supply circuit, and control an ON/OFF operation of the switching transistors so as to bring the output voltage to a predetermined target value, wherein the switching control circuit varies the target value according to an external command; and a reference voltage generating circuit for generating a reference voltage which the switching control circuit refers to when monitoring the output voltage, the power-supply semiconductor integrated circuit system further comprising:

an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command.

13. A power-supply semiconductor integrated circuit system for realizing a parameter-deciding power-supply circuit of multiple channels, the parameter-deciding power-supply circuit, in order to decide a parameter of a power-supply circuit that supplies power to a load device, being connected to the load device in place of the power-supply circuit, said power-supply semiconductor integrated circuit system comprising:

a plurality of power-supply semiconductor integrated circuits, wherein the power-supply semiconductor integrated circuits realize the parameter-deciding power-supply circuit as a linear regulator by including:

a transistor array that includes a plurality of transistors operable as driver transistors that drive power to the load device in the parameter-deciding power-supply circuit;

a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command, said power-supply semiconductor integrated circuit system further comprising:

a plurality of power-supply input terminals connected to power supplies that supply power to the parameter-deciding power-supply circuit;

a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command.

14. A development assisting system for a power-supply circuit, comprising:

specifying means for specifying a parameter to a control circuit of either one of (I) a power-supply semiconductor integrated circuit for realizing a parameter-deciding power-supply circuit, which, in order to decide a parameter of a power-supply circuit that supplies power to a load device, is connected to the load device in place of the power-supply circuit, the parameter-deciding power-supply circuit being realized as a switching control circuit by including: one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, and (II) a power-supply semiconductor integrated circuit for realizing a parameter-deciding power-supply circuit, which, in order to decide a parameter of a power-supply circuit that supplies power to a load device, is connected to the load device in place of the power-supply circuit, the parameter-deciding power-supply circuit being realized as a linear regulator by including: a transistor array that includes a plurality of transistors operable as driver transistors that drive power to the load device in the parameter-deciding power-supply circuit; a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command; and parameter deciding means for (I) receiving a result of evaluation that was performed while power is being delivered to the load device by the parameter-deciding power-supply circuit realized by the power-supply semiconductor integrated circuit of the specified parameter, and (II) setting a new parameter in the control circuit according to the inputted result of evaluation.

15. The development assisting system as set forth in claim 14, wherein the parameter deciding means repeats receiving the evaluation result and setting a new parameter, so as to search for a better parameter, and wherein the parameter deciding means includes sending means for sending a searched parameter to a predetermined vendor, which provides a semiconductor integrated circuit for realizing a power-supply circuit with a parameter, so as to request the vendor to provide a semiconductor integrated circuit that is to be used to realize a power-supply circuit with the searched parameter.

16. The development assisting system as set forth in claim 15, wherein the parameter deciding means records history of the repeated procedure of receiving the evaluation result and setting a new parameter, and wherein the sending means sends history information indicative of the history, together with the searched parameter.

17. The development assisting system as set forth in claim 15, further comprising:

storing means for storing information of the semiconductor integrated circuit after development, by associating the information with the parameter of the power-supply circuit realized by the semiconductor integrated circuit;

receiving means for receiving the parameter sent from the sending means; and presenting means for presenting information of the semiconductor integrated circuit that has been associated with the parameter received by the receiving means, if such a semiconductor integrated circuit were found by the search of the storing means.

18. The development assisting system as set forth in claim 17, wherein the storing means stores problems that were generated during development of semiconductor integrated circuits, by associating the problems with the semiconductor integrated circuits that have been developed, and wherein the presenting means, if the storing means does not contain a semiconductor integrated circuit associated with the received parameter, searches through the storing means for a semiconductor integrated circuit that is associated with a parameter close to the received parameter, and presents the searched semiconductor integrated circuit with problems, if any, that were generated during development.

19. A development assisting system for a power-supply circuit, said development assisting system comprising:

specifying means for specifying a parameter of a power-supply circuit to a control circuit of either one of (I) a power-supply semiconductor integrated circuit system in which a parameter-deciding power-supply circuit of multiple channels is connected to a load device in place of the power-supply circuit that supplies power to the load device, so as to decide a parameter of the power-supply circuit, and which includes: a plurality of power-supply semiconductor integrated circuits that are integrated on a single device, wherein the power-supply semiconductor integrated circuits realize the parameter-deciding power-supply circuit as a switching power-supply circuit by including: one or more transistor arrays, each including a plurality of transistors operable as switching transistors of the parameter-deciding power-supply circuit; a switching control circuit operable as a control circuit to monitor an output voltage of the parameter-deciding power-supply circuit, and control an ON/OFF operation of the switching transistors so as to bring the output voltage to a predetermined target value, wherein the switching control circuit varies the target value according to an external command; a reference voltage generating circuit for generating a reference voltage which the switching control circuit refers to when monitoring the output voltage; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, said power-supply semiconductor integrated circuit system further comprising: an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command, (II) a power-supply semiconductor integrated circuit system in which a parameter-deciding power-supply circuit of multiple channels is connected to a load device in place of the power-supply circuit that supplies power to the load device, so as to decide a parameter of the power-supply circuit, and which includes: a plurality of power-supply semiconductor integrated circuits, wherein the power-supply semiconductor integrated circuits realize the parameter-deciding power-supply circuit as a switching power-supply circuit by including: one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, said power-supply semiconductor integrated circuit system further comprising: a plurality of power-supply input terminals connected to power supplies that supply power to the parameter-deciding power-supply circuit; a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command, and (III) a power-supply semiconductor integrated circuit system in which a parameter-deciding power-supply circuit of multiple channels is connected to a load device in place of the power-supply circuit that supplies power to the load device, so as to decide a parameter of the power-supply circuit, and which includes: a plurality of power-supply semiconductor integrated circuits, wherein the power-supply semiconductor integrated circuits realize the parameter-deciding power-supply circuit as a linear regulator by including: a transistor array that includes a plurality of transistors operable as driver transistors that drive power to the load device in the parameter-deciding power-supply circuit; a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command, said power-supply semiconductor integrated circuit system further comprising: a plurality of power-supply input terminals connected to power supplies that supply power to the parameter-deciding power-supply circuit; a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command; and parameter deciding means for (I) receiving a result of evaluation that was performed while power is being delivered to the load device by the parameter-deciding power-supply circuit realized by the power-supply semiconductor integrated circuit of the specified parameter, and (II) setting a new parameter in the control circuit according to the inputted result of evaluation.

20. The development assisting system as set forth in claim 19,
wherein the parameter deciding means repeats receiving the evaluation result and setting a new parameter, so as to search for a better parameter, and
wherein the parameter deciding means includes sending means for sending a searched parameter to a predetermined vendor, which provides a semiconductor integrated circuit for realizing a power-supply circuit with a parameter, so as to request the vendor to provide a semiconductor integrated circuit that is to be used to realize a power-supply circuit with the searched parameter.

21. A computer-readable storage medium storing a program for causing a computer as operate as respective members of a development assisting system for a power-supply circuit, said development assisting system comprising:
specifying means for specifying a parameter to a control circuit of either one of (I) a power-supply semiconductor integrated circuit for realizing a parameter-deciding power-supply circuit, which, in order to decide a parameter of a power-supply circuit that supplies power to a load device, is connected to the load device in place of the power-supply circuit, the parameter-deciding power-supply circuit being realized as a switching control circuit by including: one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, and (II) a power-supply semiconductor integrated circuit for realizing a parameter-deciding power-supply circuit, which, in order to decide a parameter of a power-supply circuit that supplies power to a load device, is connected to the load device in place of the power-supply circuit, the parameter-deciding power-supply circuit being realized as a linear regulator by including: one or more transistor arrays, each including a plurality of transistors operable as driver transistors that drive power to the load device in the parameter-deciding power-supply circuit; a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command; and parameter deciding means for (I) receiving a result of evaluation that was performed while power is being delivered to the load device by the parameter-deciding power-supply circuit realized by the power-supply semiconductor integrated circuit of the specified parameter, and (II) setting a new parameter in the control circuit according to the inputted result of evaluation.

22. A computer-readable storage medium storing a program for causing a computer to operate as respective members of a development assisting system for a power-supply circuit, said development assisting system comprising:

specifying means for specifying a parameter of a power-supply circuit to a control circuit of either one of (I) a power-supply semiconductor integrated circuit system in which a parameter-deciding power-supply circuit of multiple channels is connected to a load device in place of the power-supply circuit that supplies power to the load device, so as to decide a parameter of the power-supply circuit, and which includes: a plurality of power-supply semiconductor integrated circuits that are integrated on a single device, wherein the power-supply semiconductor integrated circuits realize the parameter-deciding power-supply circuit as a switching power-supply circuit by including: one or more transistor arrays, each including a plurality of transistors operable as switching transistors of the parameter-deciding power-supply circuit; a switching control circuit operable as a control circuit to monitor an output voltage of the parameter-deciding power-supply circuit, and control an ON/OFF operation of the switching transistors so as to bring the output voltage to a predetermined target value, wherein the switching control circuit varies the target value according to an external command; a reference voltage generating circuit for generating a reference voltage which the switching control circuit refers to when monitoring the output voltage; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, said power-supply semiconductor integrated circuit system further comprising: an inter-channel phase difference control circuit operable as a control circuit to control a phase difference of ON/OFF timings of the switching transistors between the power-supply semiconductor integrated circuits, wherein the inter-channel phase difference control circuit varies the phase difference of ON/OFF timings of the switching transistors between the power-supply semiconductor integrated circuits, as a parameter of the power-supply circuit and according to an external command, (II) a power-supply semiconductor integrated circuit system in which a parameter-deciding power-supply circuit of multiple channels is connected to a load device in place of the power-supply circuit that supplies power to the load device, so as to decide a parameter of the power-supply circuit, and which includes: a plurality of power-supply semiconductor integrated circuits, wherein the power-supply semiconductor integrated circuits realize the parameter-deciding power-supply circuit as a switching power-supply circuit by including: one or more transistor arrays, each including a plurality of transistors operable as switching transistors of the parameter-deciding power-supply circuit; and a selecting circuit operable as a control circuit to select a transistor to be operated as a switching transistor from among the plurality of transistors, so as to control a size of the transistor that operates as a switching transistor, wherein the selecting circuit varies the size of the transistor as a parameter of the power-supply circuit, according to an external command, said power-supply semiconductor integrated circuit system further comprising: a plurality of power-supply input terminals connected to power supplies that supply power to the parameter-deciding power-supply circuit; a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command, and (III) a power-supply semiconductor integrated circuit system in which a parameter-deciding power-supply circuit of multiple channels is connected to a load device in place of the power-supply circuit that supplies power to the load device, so as to decide a parameter of the power-supply circuit, and which includes: a plurality of power-supply semiconductor integrated circuits, wherein the power-supply semiconductor integrated circuits realize the parameter-deciding power-supply circuit as a linear regulator by including: a transistor array that includes a plurality of transistors operable as driver transistors that drive power to the load device in the parameter-deciding power-supply circuit; a phase compensating circuit for compensating a phase of an output of the parameter-deciding power-supply circuit, using a predetermined phase compensating constant; and a selecting circuit operable as a control circuit to (i) select a transistor to be operated as a driver transistor from among the plurality of transistors, so as to control a size of the transistor that operates as a driver transistor, and (ii) varies the phase compensating constant of the phase compensating circuit according to the size of the transistor, wherein the selecting circuit varies the size of the transistor as a parameter of the power-supply circuit, according to an external command, said power-supply semiconductor integrated circuit system further comprising: a plurality of power-supply input terminals connected to power supplies that supply power to the parameter-deciding power-supply circuit; a switch, provided for each of the power-supply semiconductor integrated circuits, operable as a control circuit to select one of the power-supply input terminals and connect it to a corresponding power-supply semiconductor integrated circuit, wherein the switch connects the power-supply semiconductor integrated circuits to the power-supply input terminal in different combinations, as a parameter of the power-supply circuit and according to an external command; and parameter deciding means for (I) receiving a result of evaluation that was performed while power is being delivered to the load device by the parameter-deciding power-supply circuit realized by the power-supply semiconductor integrated circuit of the specified parameter, and (II) setting a new parameter in the control circuit according to the inputted result of evaluation.

* * * * *